(12) United States Patent
Liu et al.

(10) Patent No.: US 12,272,774 B2
(45) Date of Patent: Apr. 8, 2025

(54) LIGHT-EMITTING DEVICE AND THE METHOD OF MANUFACTURING THE SAME

(71) Applicant: EPISTAR CORPORATION, Hsinchu (TW)

(72) Inventors: Chien-Liang Liu, Hsinchu (TW); Ming-Chi Hsu, Hsinchu (TW); Shih-An Liao, Hsinchu (TW); Jen-Chieh Yu, Hsinchu (TW); Min-Hsun Hsieh, Hsinchu (TW); Jia-Tay Kuo, Hsinchu (TW); Yu-Hsi Sung, Hsinchu (TW); Po-Chang Chen, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 702 days.

(21) Appl. No.: 17/322,459

(22) Filed: May 17, 2021

(65) Prior Publication Data
US 2021/0273138 A1 Sep. 2, 2021

Related U.S. Application Data

(63) Continuation of application No. 14/541,680, filed on Nov. 14, 2014, now Pat. No. 11,011,681.

(30) Foreign Application Priority Data

| Nov. 14, 2013 | (TW) | ................................. 102141591 |
| Mar. 17, 2014 | (TW) | ................................. 103110058 |
| Sep. 26, 2014 | (TW) | ................................. 103133696 |

(51) Int. Cl.
*H01L 33/54* (2010.01)
*H01L 25/075* (2006.01)
(Continued)

(52) U.S. Cl.
CPC .......... *H01L 33/54* (2013.01); *H01L 25/0753* (2013.01); *H01L 33/0075* (2013.01);
(Continued)

(58) Field of Classification Search
CPC ... H01L 33/54; H01L 33/505; H01L 33/0075; H01L 33/32; H01L 25/0753; H01L 33/52
See application file for complete search history.

(56) References Cited

U.S. PATENT DOCUMENTS

| 7,361,590 B2 | 4/2008 | Kobayashi et al. |
| 8,350,283 B2 | 1/2013 | Nishiuchi et al. |

(Continued)

FOREIGN PATENT DOCUMENTS

| CN | 101551077 A | 10/2009 |
| CN | 101782203 A | 7/2010 |

(Continued)

*Primary Examiner* — Aaron J Gray
(74) *Attorney, Agent, or Firm* — DITTHAVONG, STEINER & MLOTKOWSKI

(57) ABSTRACT

The present application discloses a light-emitting device comprises a semiconductor light-emitting element, a transparent element covering the semiconductor light-emitting element, an insulating layer which connects to the transparent element, an intermediate layer which connects to the insulating layer; and a conductive adhesive material connecting to the intermediate layer.

8 Claims, 45 Drawing Sheets

(51) Int. Cl.
  *H01L 33/00* (2010.01)
  *H01L 33/10* (2010.01)
  *H01L 33/24* (2010.01)
  *H01L 33/32* (2010.01)
  *H01L 33/36* (2010.01)
  *H01L 33/38* (2010.01)
  *H01L 33/44* (2010.01)
  *H01L 33/46* (2010.01)
  *H01L 33/50* (2010.01)
  *H01L 33/52* (2010.01)

(52) U.S. Cl.
  CPC .............. *H01L 33/10* (2013.01); *H01L 33/24* (2013.01); *H01L 33/32* (2013.01); *H01L 33/36* (2013.01); *H01L 33/385* (2013.01); *H01L 33/44* (2013.01); *H01L 33/46* (2013.01); *H01L 33/50* (2013.01); *H01L 33/505* (2013.01); *H01L 33/52* (2013.01)

(56) References Cited

U.S. PATENT DOCUMENTS

| | | |
|---|---|---|
| 8,556,672 B2 | 10/2013 | Imazu |
| 2006/0076571 A1 | 4/2006 | Hsieh et al. |
| 2006/0273337 A1 | 12/2006 | Han et al. |
| 2007/0126016 A1 | 6/2007 | Chen et al. |
| 2008/0036362 A1 | 2/2008 | Tanimoto et al. |
| 2009/0196011 A1 | 8/2009 | Kobayashi et al. |
| 2009/0272560 A1 | 11/2009 | Tokunaga |
| 2009/0309116 A1 | 12/2009 | Kato et al. |
| 2010/0177500 A1* | 7/2010 | Ohkawa ................ G02B 5/045 362/97.1 |
| 2010/0283062 A1 | 11/2010 | Hsieh et al. |
| 2011/0050558 A1* | 3/2011 | Park ................ G02F 1/133606 362/235 |
| 2011/0291145 A1 | 12/2011 | Han et al. |
| 2011/0294389 A1* | 12/2011 | Kim ........................ F21S 43/26 445/44 |
| 2012/0107988 A1 | 5/2012 | Kim et al. |
| 2012/0261697 A1 | 10/2012 | Margalit et al. |
| 2012/0302124 A1 | 11/2012 | Imazu |
| 2013/0058102 A1 | 3/2013 | Lin |
| 2013/0240934 A1 | 9/2013 | Park et al. |
| 2013/0255389 A1 | 10/2013 | Watanabe et al. |
| 2013/0288406 A1 | 10/2013 | Chen et al. |
| 2014/0014938 A1* | 1/2014 | Harai ..................... H10K 50/856 257/40 |
| 2014/0186979 A1 | 7/2014 | Tu et al. |
| 2014/0264412 A1 | 9/2014 | Yoon et al. |

FOREIGN PATENT DOCUMENTS

| | | |
|---|---|---|
| DE | 112011100376 T5 | 11/2012 |
| JP | 2001257381 A | 9/2001 |
| JP | 2005353875 A | 12/2005 |
| JP | 2013042095 A | 2/2013 |
| JP | 2013115088 A | 6/2013 |
| JP | 2013118244 A | 6/2013 |
| TW | 200720404 A | 6/2007 |
| TW | 200936953 A | 9/2009 |
| TW | 201316357 A | 4/2013 |
| TW | 201331955 A | 8/2013 |
| TW | 201336121 A | 9/2013 |
| TW | 201344987 A | 11/2013 |
| TW | 201432201 A | 8/2014 |
| TW | 1560912 | 1/2016 |
| WO | 2009093497 A1 | 7/2009 |
| WO | 2009098831 A1 | 8/2009 |
| WO | 2009107661 A1 | 9/2009 |

* cited by examiner

LIGHT-EMITTING DEVICE AND THE METHOD OF MANUFACTURING THE SAME

CROSS-REFERENCE TO RELATED APPLICATION

This application claims priority to and the benefit of U.S. application Ser. No. 14/541,680, filed on Nov. 14, 2014, Taiwan Application Serial Number 103133696 filed on Sep. 26, 2014, Taiwan Application Serial Number 103110058 filed on Mar. 17, 2014, and Taiwan Application Serial Number 102141591 filed on Nov. 14, 2013 which are incorporated by reference in their entireties.

BACKGROUND

Technical Field

The present disclosure relates to a light-emitting device and in particular to a light-emitting device comprising a semiconductor light-emitting element and an optical element.

Description of the Related Art

After the incandescent light is developed and widely used in our daily life, a light-emitting device comprising light-emitting diode (LED) is gradually taking the place of traditional incandescent light. This is because the LED has benefits such as energy saving, environmental protection, long operation life, small volume, and so on. Companies devoted efforts to develop LEDs, especially the white light LED, for various applications.

The lighting-related technologies include not only the method of adjusting color temperature and the color coefficient of a light, but also the method of adjusting the light extraction direction and the light field. Because the volume of a light-emitting chip is small, additional optical components are required in package to adjust the light field by reflection, interference or diffraction to form the desired light field.

It is common to add an optical element, such as a reflection board, on the side of an LED opposing to the side of light emitting surface to increase the reflection. The light emitted by the LED toward the reflection board is reflected to the side of light emitting surface so the light extraction is enhanced. The alternative is to add an optical element on a side of or surrounding the light emitting surface to block (for example, by attaching an optical film on the light emitting surface) or reflect (for example, by a reflective sidewall around the light source in an illuminating apparatus) part of the light emitted by LED. Thus, the light field of the LED is changed and the light field in a specific direction, such as the lateral direction of the LED, is increased.

The LEDs with optical element mentioned above can be further combined with other elements to form a light-emitting device. The light-emitting device comprises a sub-mount having one circuit, a solder on the sub-mount to fix the LED on the sub-mount and also electrically connected to the circuit on the sub-mount, and an electrically connection structure to electrically connect the electrode of the LED and the circuit on the sub-mount. The sub-mount can be a lead frame or a large size mounting substrate for the convenience of circuit layout and to improve the heat dissipation.

SUMMARY OF THE DISCLOSURE

A light-emitting device comprises a semiconductor light-emitting element, a transparent element covering the semiconductor light-emitting element, an insulating layer which connects to the transparent element, an intermediate layer which connects to the insulating layer; and a conductive adhesive material connecting to the intermediate layer.

A light-emitting device comprises a semiconductor light-emitting element comprising an electrode, a transparent element covering the semiconductor light-emitting element, and a conductive adhesive material connecting to the electrode. The conductive adhesive material comprises multiple particles of nano-sizes and has a thickness larger than 20 μm.

A light-emitting device comprises a semiconductor light-emitting element, a transparent support element on the semiconductor light-emitting element, and an optical element on the transparent support element. The semiconductor light-emitting element comprises a light-emitting surface and emits a first light. The optical element comprises a first portion and a second portion. Wherein the first light passes through the optical element to form a second light; and the second light has a light field distribution. The light field distribution has a maximum corresponding to the first portion and a minimum corresponding to the second portion.

DETAILED DESCRIPTION OF THE EMBODIMENTS

The drawings illustrate the embodiments of the application and, together with the description, serve to illustrate the principles of the application. The same name or the same reference number given or appeared in different paragraphs or figures along the specification should has the same or equivalent meanings while it is once defined anywhere of the disclosure. The thickness or the shape of an element in the specification can be expanded or narrowed. It is noted that the elements not drawn or described in the figure can be included in the present application by the skilled person in the art.

Figure 1A:
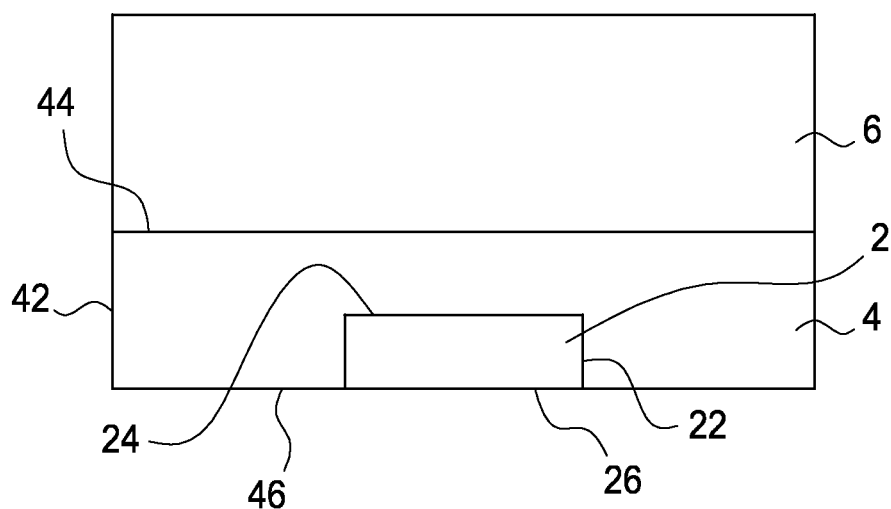
FIGS. 1a-1b show a light-emitting device in accordance with an embodiment of the present disclosure.
Figure 1B:
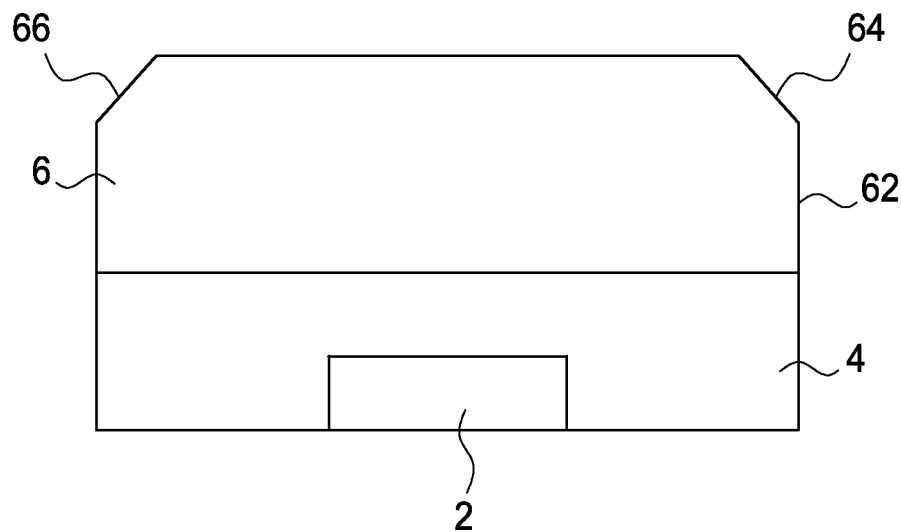

FIG. 1a shows a light-emitting device 100 in accordance with an embodiment of the present disclosure. The light-emitting device 100 comprises a transparent support element 4 on a light-emitting element 2, and an optical element 6 which covers the transparent support element 4. In this embodiment, the light-emitting element 2 is a light-emitting semiconductor element which emits incoherent light. The light-emitting element 2 comprises a side surface 22 around the light-emitting element 2, a light emitting surface 24, and a connection surface 26, wherein the side surface 22 is perpendicular to the light emitting surface 24 and to the connection surface 26. The transparent support element 4 covers the light emitting surface 24 and the side surface 22 of the light-emitting element 2 and comprises a side wall 42 around the transparent support element 4 and surrounding the light-emitting element 2. The transparent support element 4 comprises a top surface 44 between the light-emitting element 2 and the optical element 6, and a bottom surface 46. The top surface 44 of the transparent support element 4 locates above the light emitting surface 24. Because the area of the top surface 44 is larger than that of the light emitting layer 24 in horizontal orientation, the top surface 44 covers the light emitting surface 24. However, the top surface 44 and the light emitting surface 24 are not coplanar; a transparent support element 4 is formed between the top surface 44 and the light emitting surface 24. The side wall 42 is perpendicular to the top surface 44 and the bottom surface 46, wherein the bottom surface 46 and the connection surface 26 of the light-emitting element 2 are coplanar. In another embodiment, the connection surface 26 and the bottom surface 46 are not coplanar because the transparent support element 4 encloses the light emitting element 2. In this embodiment, the top surface 44 is parallel to the light emitting surface 24, and the side wall 42 is perpendicular to the light emitting surface 24 and is parallel to the side surface 22. In another embodiment, the top surface 44 and the light emitting surface 24 are not parallel so the side wall 42 is perpendicular to only one of the top surface 44 or the light emitting surface 24. But the side wall 42 is still parallel to the side surface 22. In another embodiment. Alternatively, the side wall 42 is an inclined surface not perpendicular to the top surface 44 or the light emitting surface 24 and is not parallel to the side surface 22 of the light-emitting element 2. In this embodiment, the side surface 22 is a flat surface perpendicular to the light emitting surface 24. In another embodiment, the side surface 22 is an inclined surface not perpendicular to the light emitting surface 24. In this embodiment, the side surface 22 and the light emitting surface 24 are perpendicular to each other. In another embodiment, the side surface 22 and the light emitting surface 24 can be flat surfaces perpendicular or not perpendicular to each other for different requirement. In another embodiment, the side surface 22 and the light emitting surface are both rough surfaces, or one surface is a rough surface while the other surface is a flat surface. Referring to FIG. 1b, which has a structure similar with that in FIG. 1a, wherein the optical element 6 can be a polygon shape, such as rectangular, hexagonal, triangle or square. The optical element 6 comprises a side edge 62 surrounding the optical element 6 and two inclined edges 64 and 66 which are connected with the side edge 62 and located on two opposing sides of the optical element 6 without contacting the transparent support element 4. In other words, the inclined edges 64 and 66 are formed on a side edge 62 with a height larger than zero, such that the optical element 6 has a shape of a wider upper portion and a narrower lower portion. When the shape of the optical element 6 is a rectangular, the inclined edges can be formed on four sides, and ridges are then formed between adjacent inclined edges. Or, only two edges of the optical element are inclined regardless of shorter sides or longer sides, and can be formed on adjacent sides of the optical element. With the inclined edges 64 and 66 formed on the optical element 6, the moving direction of the light emitted by the light-emitting element 2 is changed by the inclined edge of the optical element 6 and the angle of light field is also changed. So, the light field of the device in FIG. 1a and the light field of the device in FIG. 1b are different.

Figure 2A:
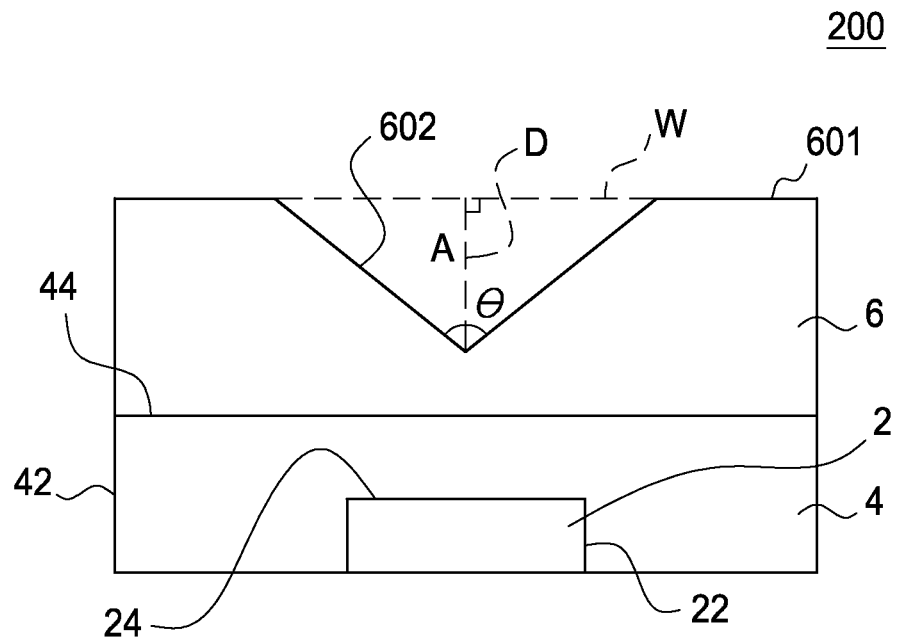
FIGS. 2a-2b show a light-emitting device in accordance with an embodiment of the present disclosure.
Figure 2B:
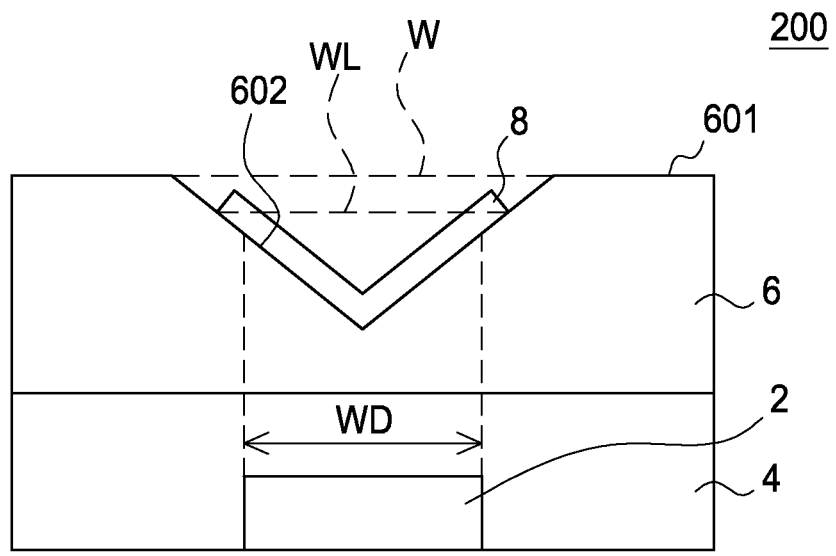

FIGS. 2a-2b show a light-emitting device 200 in accordance with an embodiment of the present disclosure. The light-emitting device 200 comprises a light-emitting element 2, a transparent support element 4 covering the light-emitting element 2 and an optical element 6 covering the transparent support element 4. The optical element 6 comprises a first section 601 and a second section 602 on the surface away from the light-emitting element 2. The first sections 601 are parallel to the light emitting surface 24 and the second section 602 is connected to the first section 601. In this embodiment, the first section 601 is flat and the second section 602 comprises a depressed portion. As shown in FIG. 2a, the second section 602 comprises a depressed portion depressed toward a direction A. The direction A is perpendicular to the surface where first section 601 of the optical element 6 is located on. Referring to FIG. 2a, the depressed portion of the second section 602 has a maximum width W and a maximum depth D on the horizontal plane which is coplanar with the first region 601, and a ratio between the width W and the depth D is about 2:1. Moreover, the second section 602 comprises a vertex at the depressed portion where most close to the light-emitting element 2 and has a vertex angle θ of about 90°. In another embodiment, the parameters of the second section 602 can be determined based on the required optical characteristic, such as light field. For example, the ratio of the maximum width W and the maximum depth D can be larger or smaller than 2:1, and the vertex angle θ in the direction A can be a right angle, an acute angle, or an obtuse angle. In this embodiment, only the second section 602 locates right above the light-emitting element 2. Referring to FIG. 2b, the extension line extending directly upward from the side surface 22 of the light-emitting element 2 intersects with the second section 602 of the optical element 6, and the light emitting surface 24 of the light-emitting element 2 is right below the second section 602. The maximum width W of the second section 602 can be larger than, equal to, or smaller than the width of the light-emitting element 2 so a ratio between the maximum width W of the second section 602 and the width of the light-emitting element is between 1:0.01~1:1.1. Referring to FIG. 2b, an optical layer 8 formed on the optical element 6 covers a part of the second section 602 and locates right above the light-emitting element 2, and the optical layer 8 does not contact the first section 601. In this embodiment, the maximum width WL of the optical layer 8 is larger than the width WD of the light emitting surface 24 and the width of the light-emitting element 2. Besides, the optical layer 8 covers all the second section 602 or extends to the first section 601. In another embodiment, the maximum width WL of the optical layer 8 is smaller or equal to the width WD of the light emitting surface 24. In this embodiment, the optical layer 8 has a reflectivity larger than 85% when the injected light has a peak wavelength ranging between 450 nm and 475 nm; or the optical layer 8 has a reflectivity larger than 80% when the injected light has a peak wavelength ranging between 400 nm and 600 nm. In another embodiment, the optical element 6 does not have a depressed section so the section covered by the optical layer 8 is defined as a second section 602 which still locates right above the light-emitting element 2. In another embodiment, the optical element 6 not only comprises a first section 601, a second section 602, and an optical layer 8, but also comprises inclined edges 64 and 66 on two sides as shown in FIG. 1b. The inclined edges 64 and 66 can be formed by a process to gain required light characteristic, such as light field.

In the embodiments above, the optical layer 8 can be a single layer structure or a multiple layers structure. The single layer structure can be a metal layer or an oxide layer to change the path of light by reflection. The metal layer comprises sliver and aluminum, and the oxide layer comprises titanium dioxide. The material of the metal layer is required not to react actively with other material during manufacturing. For example, when the process environment contains sulfur (S), the silver should be avoided to prevent the formation of the compound of silver and sulfur, such as silver sulfide. The multiple layers structure can be a Distributed Bragg Reflector (DBR) or a stack structure of metal and metal oxide. The DBR can be a multiple layers structure comprising titanium dioxide and silicon dioxide, or the stack structure can be a multiple layers structure comprising metal and metal oxide, such as aluminum and alumina for enhancing reflection. In another embodiment, the optical layer 8 further comprises a wavelength conversion material. In this embodiment, both the single layer structure and a multiple layers structure do not reflect all amount of the light and at least a part of the light passes through the optical layer 8. In another embodiment, the reflection is improved by increasing thickness or increasing the number of layers.

Referring to FIGS. 2a-2b, a first light emitted by the light-emitting element 2 turns to be a second light after passing through the transparent support element 4 and the optical element 6. The peak wavelength of the first light is the same as the second light when no wavelength conversion material is in the transparent support element 4. When the first light passes through the transparent support element 4, part of the first light is affected by the optical layer 8 or affected by the difference of reflection index between the optical element 6 and the environmental. Then, the moving path of the light is changed, and the light field of the first light is different from the light field of the second light. In another embodiment, the optical element 6 comprises the inclined edges 64 and 66 disclosed in FIG. 1b and the optical layer 8 disclosed in FIG. 2b. Therefore, a part of the first light reflected by the optical layer 8 leaves the optical element 6 from the inclined edges 64 and 66 and becomes a part of the second light. Because the difference of the parameters of the inclined edges 64 and 66, such as size, position and inclined angles against the surface of the optical element 6, the path of the first light is affected. In this embodiment, while the transparent support element 4 and/or the optical element 6 comprises a wavelength conversion material, the amount of the first light converted by the wavelength conversion material is affected by the path of the first light. For example, originally there are 50% of the first light contacting the wavelength conversion material, and the amount of light contacting the wavelength conversion material changes to 30% when the parameters of the inclined edges 64 and 66, such as size, position and inclined angle, are changed. Thus, the light characteristic of the second light, such as color temperature, luminance, XY coordinates of CIE or the distribution range of the wavelength, can be changed. In an embodiment, the light-emitting element 2 emits a first light, which is a blue light and the transparent support element 4 comprises a wavelength conversion material converting a blue light into a yellow-green light. If the inclined edges 64 and 66 are longer and the positions are lower (the side edge 62 becomes narrower or shorter), the portion of the first light which is supposed to leave the optical element 6 without contacting the wavelength conversion material now turns to be reflected at the inclined edges. Therefore, a larger portion of the first light contacts the wavelength conversion material and more yellow-green light is excited, and the wavelength distribution range of the second light shifts to another range of longer wavelength. To be more specific, the peak wavelength rage of the second light moves to a range more close to the red light; or the color coordinate of the second light on the CIE XY coordinate moves in a bottom-left direction.

In the above embodiments, the light-emitting element 2 and the transparent support element 4 have same, similar or different ratio between their lengths and/or between their widths while the light-emitting element 2 and the transparent support element 4 have similar height. In other words, the distance between the top surface 44 of the transparent support element 4 and the light emitting surface 24 of the light-emitting element 2 is close. For the light-emitting devices 100 and 200, there is a first ratio between the size of the light-emitting element 2 and the size of the transparent support element 4 in a first direction on the horizontal plane and a second ratio between the sizes in a second direction on the horizontal plane. The first direction is perpendicular to the second direction, and the first ratio can be larger, smaller, or equal to the second ratio. When the light-emitting element 2 is a rectangular, the first direction represents the direction of the longer side and the second direction represents the direction of the shorter side of a light-emitting element 2. In an embodiment, the first ratio and the second ratio are about between 1:1.04 and 1:1.71. Besides, while the two light-emitting devices in accordance with the embodiments in the present disclosure have same or similar first ratio and/or second ratio, and the shorter lengths of the devices on the horizontal plane are larger than a predetermined value, the two light-emitting devices have about the same luminance. For example, the light-emitting device A has a first ratio of 1:2.11 and a second ratio of 1:1.83; the light-emitting device B has a first ratio of 1:1.181 and a second ratio of 1:1.57, and the luminance difference between the two light-emitting devices is less than 1% of the luminance of the light-emitting device A. In this embodiment, the two light-emitting devices have similar first ratios and second ratios, wherein the relative value of the two first ratios is 1.16 (2.11/1.81=1.16) and the relative value of the two second ratios is 1.65 (1.83/1.57=1.65). Bothe the relative values of the corresponding ratios of the two light-emitting devices are less than 2 and the difference of luminance of the two light-emitting devices is less than 1%. If the two light-emitting devices have similar ratios of sizes and the relative values of the ratios are less than 2, such as 1.1, 1.2, 1.4 and 1.6, and the shorter length on a horizontal plane of the light-emitting device is smaller than a predetermined value, such as 1.4 mm, the luminance of a light-emitting device is affected by the abovementioned shorter length. To be more specific, the two light-emitting devices have similar luminance while the two light-emitting devices have the same light-emitting elements 2, same first ratio and/or second ratio, such as 1:2, and both the shorter lengths are larger than a predetermined value, such as 1.4 mm. However, when the sizes of the two light-emitting elements 2 have same ratios, if the shorter lengths on the horizontal plane are smaller than the predetermined vale, such as the shorter lengths are 1.3 mm and 1.0 mm, the luminance of the light-emitting device having a shorter lengths of 1.3 mm is larger than the luminance of the light-emitting device having a shorter lengths of 1.0 mm by at least 1%. In other words, when two light-emitting devices have the same ratio between the shorter side and longer side and the lengths are larger than a predetermined value, the two light-emitting devices have similar luminance, and the difference of the luminance is less than 1% of the luminance of a light-emitting device having higher luminance. But if one of the light-emitting devices has a length smaller than the predetermined value, the difference of luminance between the two light-emitting devices is significant.

Figure 3:
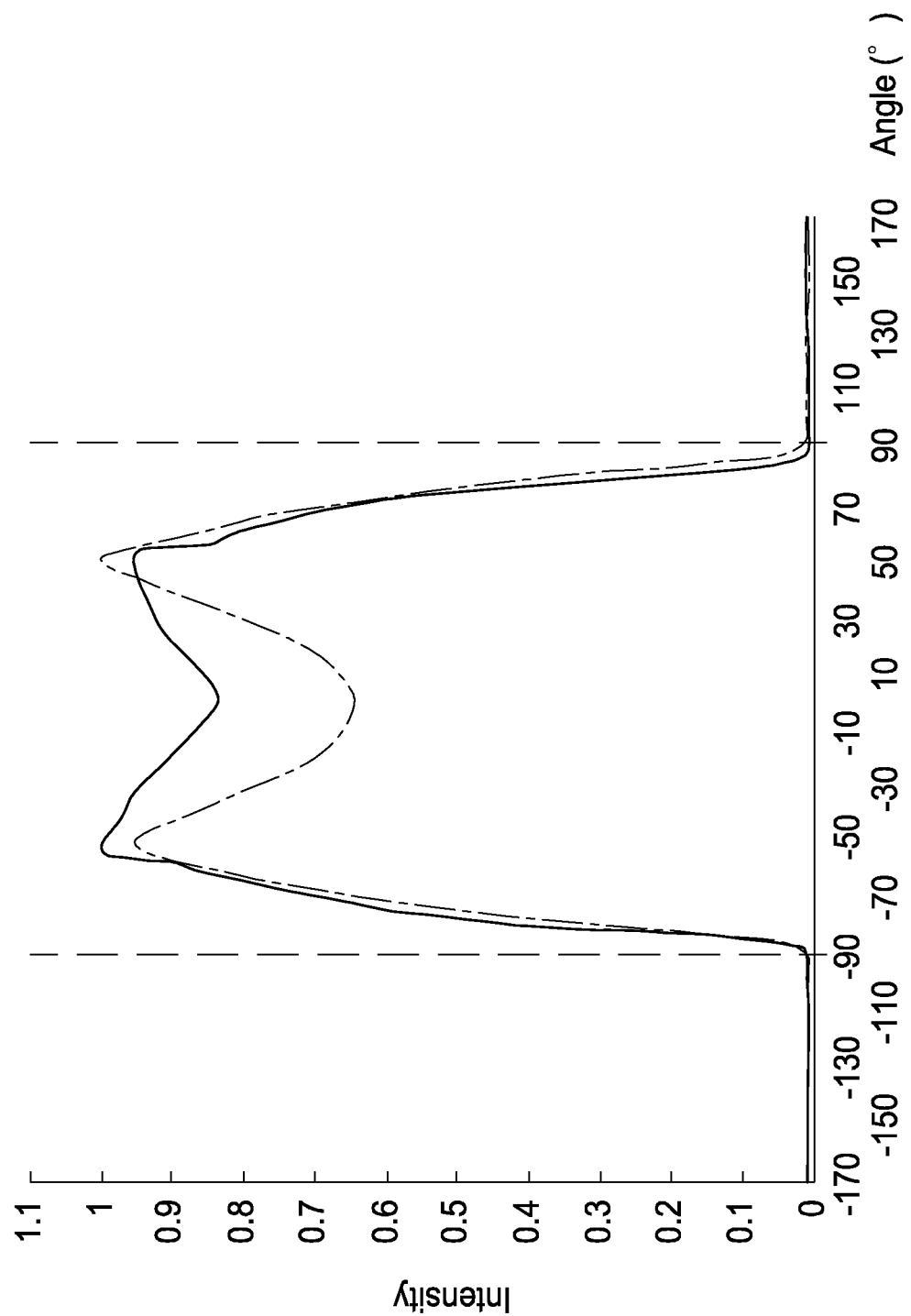
FIG. 3 shows a light field of a light-emitting device in accordance with an embodiment of the present disclosure.

FIG. 3 shows a light field of the second light emitted from a light-emitting device 300 in accordance with an embodiment of the present disclosure. The two curves represent two light field measured in two different directions, and the range of light field is between −90°~+90°. In another embodiment, the range is about 178°~190°. Each of the two light fields has two peaks and one valley, and each light field is substantially distributed symmetrically from the valley, wherein the two peaks are substantially corresponding to the first section 601 and the valley is substantially corresponding to the second section 602. In another embodiment, different depressed depth of the second section 602 affects the moving direction of the light emitted by the light-emitting element 2, and the position of the peak corresponding to the light-emitting device moves towards a direction away from the center of the light-emitting device, or even beyond the range of the side edge 62. Generally speaking, the light field of the second light emitted by the light-emitting device comprises a maximum value corresponding to the first section 601 and a minimum value corresponding to the second section 602. In this embodiment, each of the two light fields shown in FIG. 3 has a ratio between the maximum value and the minimum value, and the ratios are between 1.05~2. In this embodiment, no wavelength conversion material, such as a phosphor, is formed in the light-emitting device so the peak wavelength of the first light is the same as the peak wavelength of the second light. In another embodiment, the peak wavelength of the second light is different from the wavelength of the first light because a wavelength conversion material is added in the light-emitting device. The wavelength conversion material can be a single layer structure or a multiple layers structure comprising one material or different materials and can be formed between the light-emitting element 2 and the transparent support element 4, formed within the transparent support element 4, formed within the optical element 6, formed within the optical layer 8, formed on the first section 601, or formed on the second section 602 so the first light has a peak value different from that of the second light. Like other embodiments, the wavelength conversion material further comprises an adhesive layer and optical brightening agents such as silicon dioxide to increase luminance.

Figure 4A:
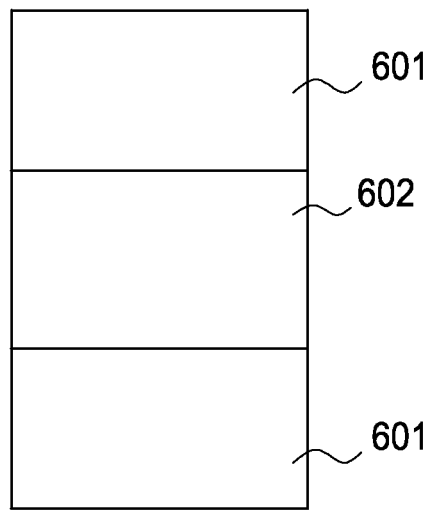
FIGS. 4a-4e show a top view of an optical element in accordance with an embodiment of the present disclosure.
Figure 4B:
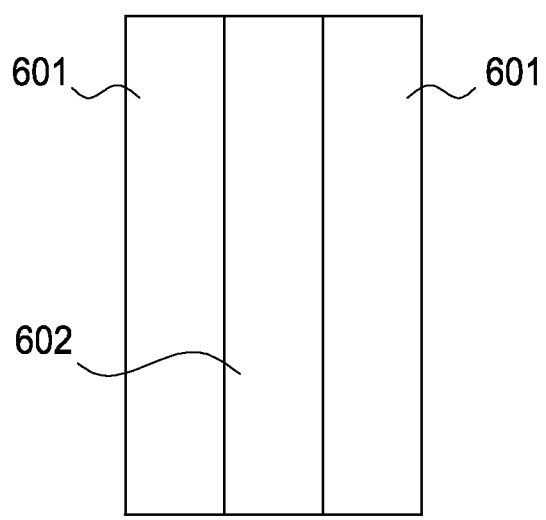
Figure 4C:
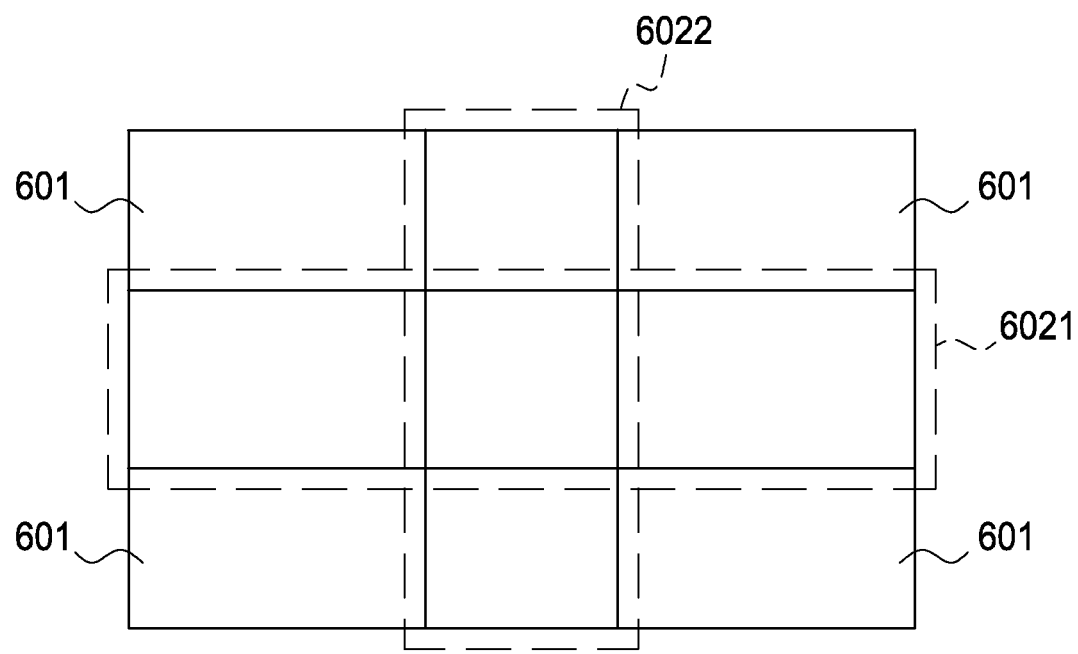
Figure 4D:
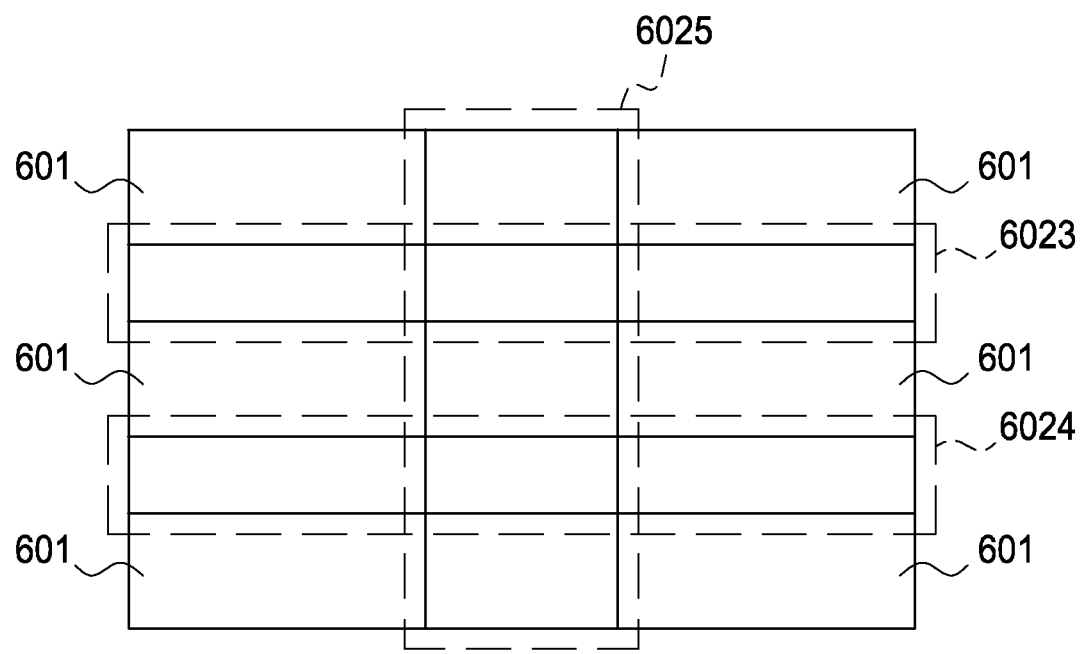
Figure 4E:
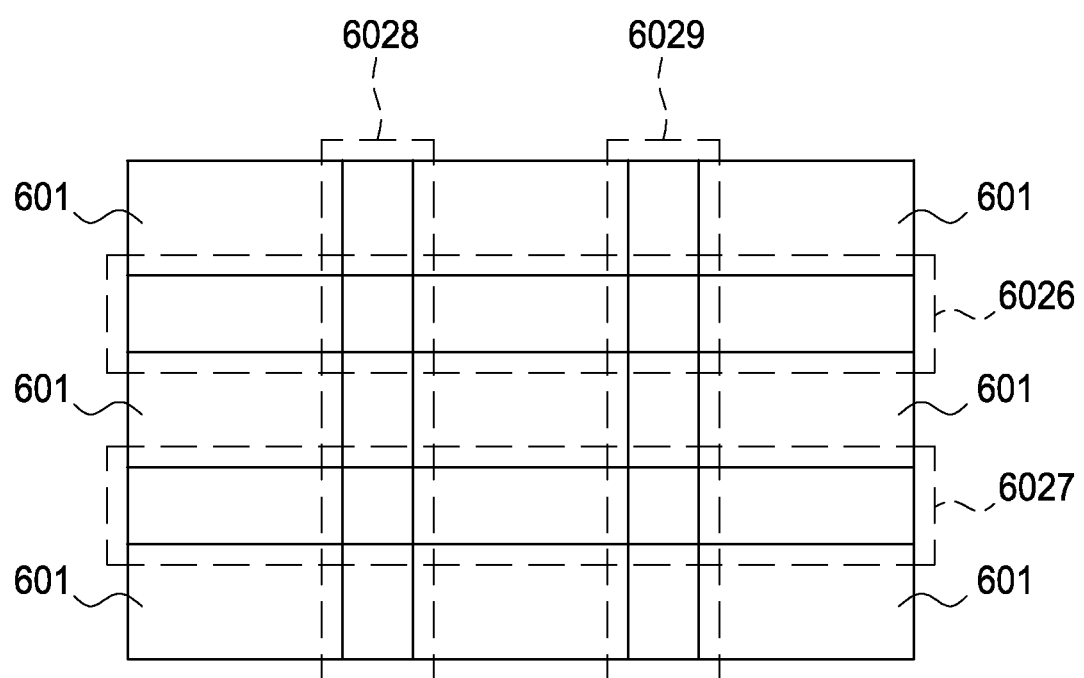

FIGS. 4a-4e show a top view of an optical element 6 in accordance with an embodiment of the present disclosure. The optical element 6 is a rectangular and has various types composed of the first section 601 and the second section 602. In this embodiment, the first section 601 is a flat surface region and the second section 602 comprises a depressed region with an optical layer optionally formed thereon. Referring to FIG. 4a, the surface of the optical element 6 comprises a second section 602 formed between the two first sections 601, wherein the two first sections 601 are located along a direction parallel to the longer side of the rectangular. Referring to FIG. 4b, the surface of the optical element 6 comprises a second section 602 between the two first sections 601, wherein the two first sections 601 are located along a direction parallel to the shorter side of the optical element 6. In the embodiments in FIGS. 4a-4b, the second sections 602 are stretched from one side of the optical element 6 to the other side. For example, the second section 602 in the FIG. 4a is formed at the shorter side and is stretched form one longer side to the other longer side. Similarly, the second section 602 in the FIG. 4b is formed at the longer side and is stretched form one shorter side to the other shorter side. In another embodiment, the second section 602 contacts only one side of the optical element 6 or does not contact any sides of the optical element 6. Referring to FIG. 4c, the surface of the optical element 6 comprises a second section 602 in a cross shape and four first sections 601 on the four corners. The second section 602 comprises a second subsection 6021 stretching along the longer side of the optical element 6 and a second subsection 6022 stretching along the shorter side. The areas of the four first sections 601 can be the same or different, and the widths of the second subsections 6021 and 6022 can be the same or different. Referring to FIG. 4d, the surface of the optical element 6 comprises six first sections 601 and a second section 602 which divides the surface of the optical element 6 into a grid. The areas of the six first sections 601 on the surface of the optical element 6 can be the same or different, and the second section 602 comprises two second subsections 6023 and 6024 stretching along the longer side and a second subsections 6025 stretching along the shorter side, and the widths of the three second subsections can be the same or different. In the embodiment shown in FIG. 4e, nine first sections 601 having substantially equal areas and a second section 602 dividing the surface of the optical element 6 into a grid are presented. The areas of the nine first sections 601 can be the same or different. The second section 602 comprises two second subsections 6026 and 6027 stretching along the longer side and two second subsections 6028 and 6029 stretching along the shorter side. Besides, the widths of the four second subsections can be the same or different. As mentioned above, in the embodiments disclosed in FIGS. 4a-4e, the first section 601 is a flat region and the second section has a depressed region having an optical layer optionally formed thereon. Further referring to the embodiment shown in FIG. 2b, the optical layer 8 can be formed to merely cover the second section 602, formed to contact the first section 601, or cover a part of the first section 601. In another embodiment, the first section 601 and the second section 602 are flat surfaces, and the optical layer 8 located only on the second section 602 but not on the first section 601.

Figure 5A:
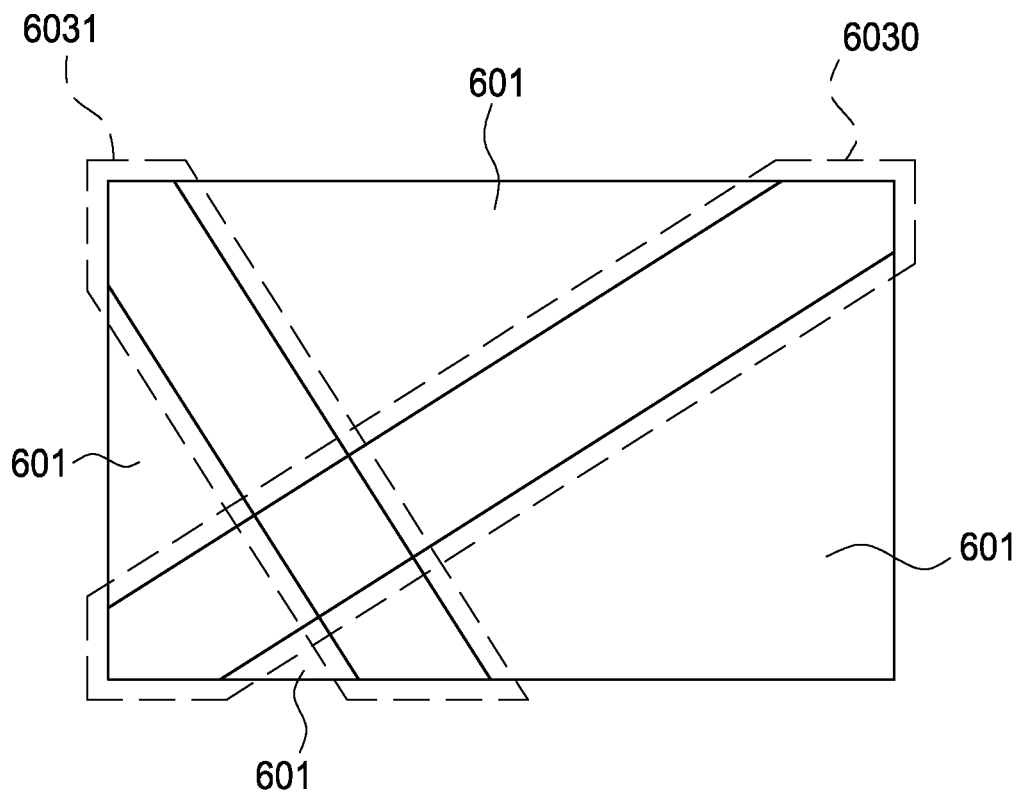
FIGS. 5a-5b show a top view of an optical element in accordance with an embodiment of the present disclosure.
Figure 5B:
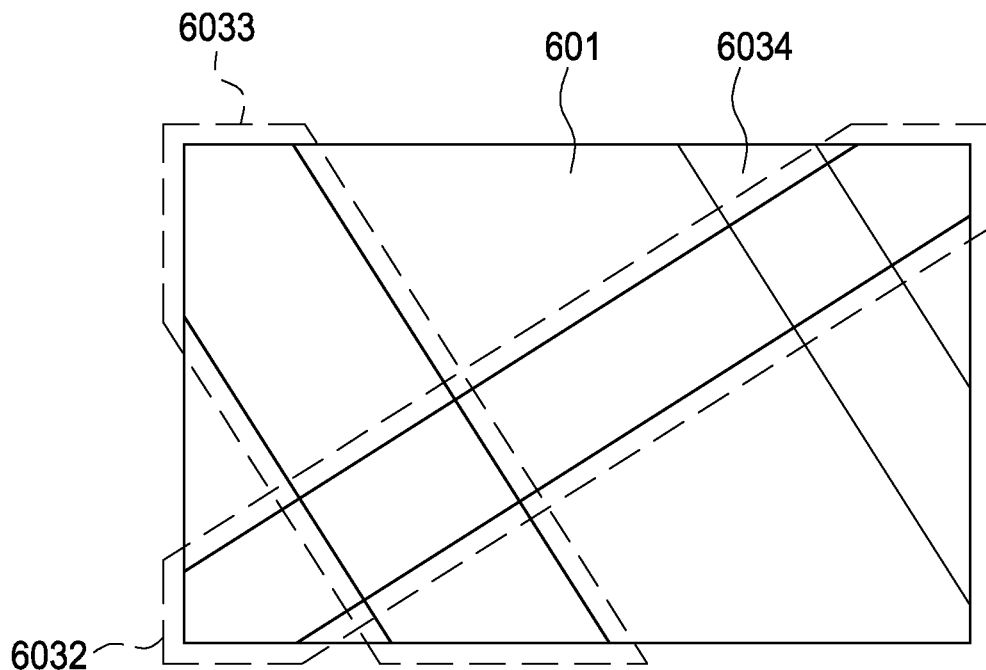

FIGS. 5a-5b show a top view of an optical element 6 having different types composed of the first section 601 and the second section 602 in accordance with embodiments of the present disclosure. Referring to FIG. 5a, the second section 602 on the surface of the optical element 6 comprises two second subsections 6030 and 6031 which are neither parallel nor perpendicular to each other and four first sections 601 having different areas which are separated by the second section 602. Referring to FIG. 5b, the second section 602 on the surface of the optical element 6 comprises two parallel second subsections 6033 and 6034, a second subsection 6032 neither parallel nor perpendicular to the second subsections 6033 and 6034, and six first sections 601 which are divided by the second section 602 with different areas. In another embodiment, the second subsection 6033 is not parallel to the second subsection 6034.

As described above, different surface types can be formed on the surface of the optical layer 6 away from the light-emitting element 2 according to different requirements by forming second subsections which are parallel or not parallel to each other to separate the surface into multiple first sections 601 with same or different areas. The second subsections can be parallel or not parallel to the longer side or shorter side of the optical element 6. In another embodiment, the second subsections can be parallel or not parallel to adjacent sides of the optical element 6. On the surface of the optical element 6, the areas of the multiple first sections 601 separated by the second sections 602 can be the same or different, and the second section 602 can comprise second subsections with same or different areas. Referring to embodiments disclosed in FIGS. 4a-4e and FIGS. 5a-5b, the optical element 6 not only has different surface types but also comprises inclined edges as shown in FIG. 1b, and the second section 602 can comprise a depressed part or an optical layer 8 formed thereon.

Figure 6:
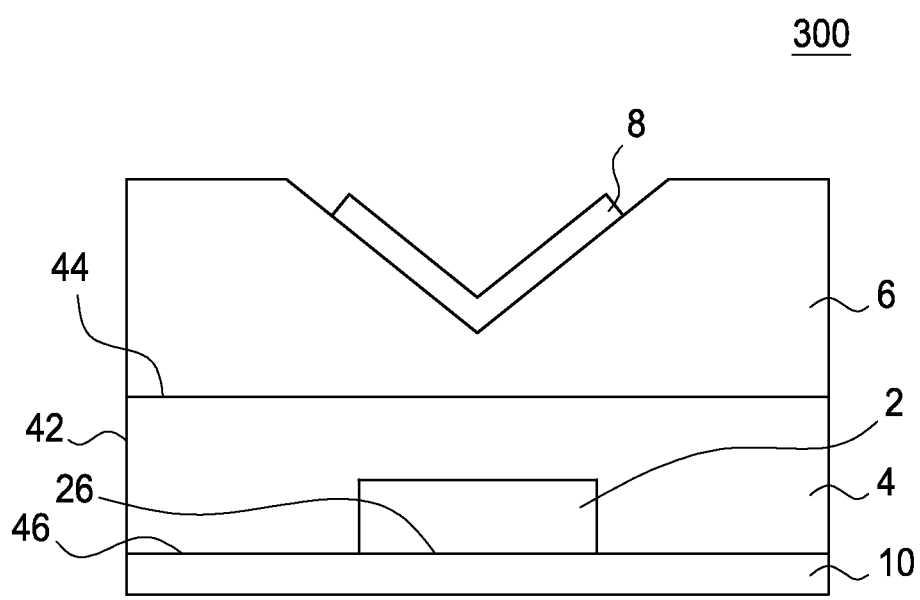
FIG. 6 shows a light-emitting device in accordance with an embodiment of the present disclosure.

FIG. 6 shows a light-emitting device 300 in accordance with an embodiment of the present disclosure. The light-emitting device 300 comprises a transparent support element 4 covering a light-emitting element 2, an optical element 6 on the transparent support element 4, an optical layer 8 covering the optical element 6, and a reflective layer 10 on a side of the light-emitting element 2 opposing to the optical element 6. The transparent support element 4 covers the light-emitting element 2 and comprises a side wall 42 surrounding the transparent support element 4 and the light-emitting element 2, a top surface 44 between the light-emitting element 2 and the optical element 6, and a bottom surface 46. The bottom surface 46 and the connection surface 26 of the light-emitting element 2 are coplanar. In this embodiment, the reflective layer 10 on the bottom surface 46 reflects a part of the first light emitted by the light-emitting element 2, and part of the reflected first light leaves the light-emitting device 300 form the side wall 42. In another embodiment, the reflective layer 10 further comprises a circuit electrically connecting to the light-emitting element 2. The transparent support element 4 of the light-emitting device 300 comprises a wavelength conversion material which can be excited by a part of the first light.

Figure 7A:
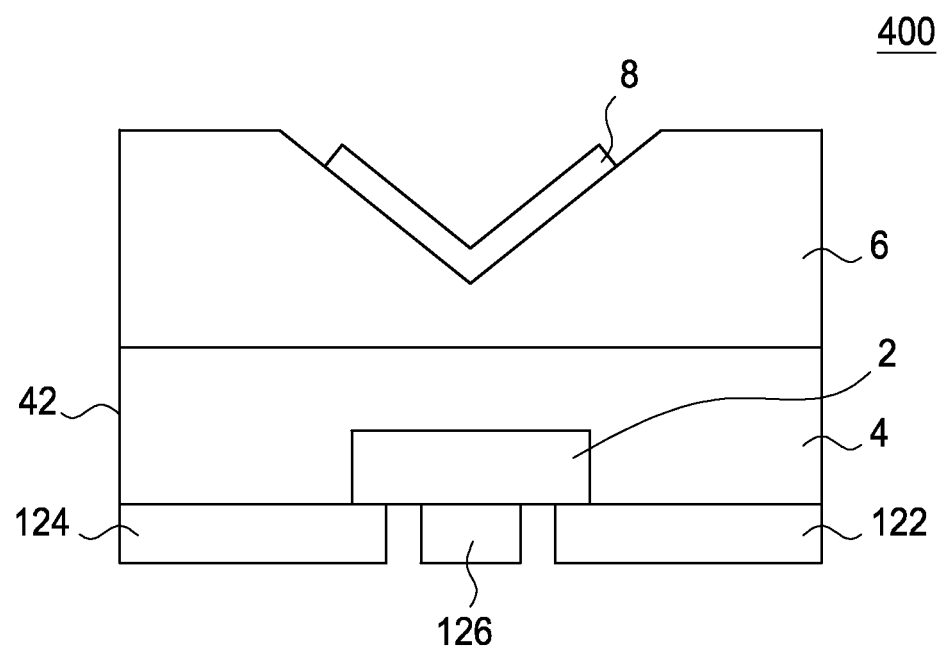
FIGS. 7a-7b show a light-emitting device in accordance with an embodiment of the present disclosure.
Figure 7B:
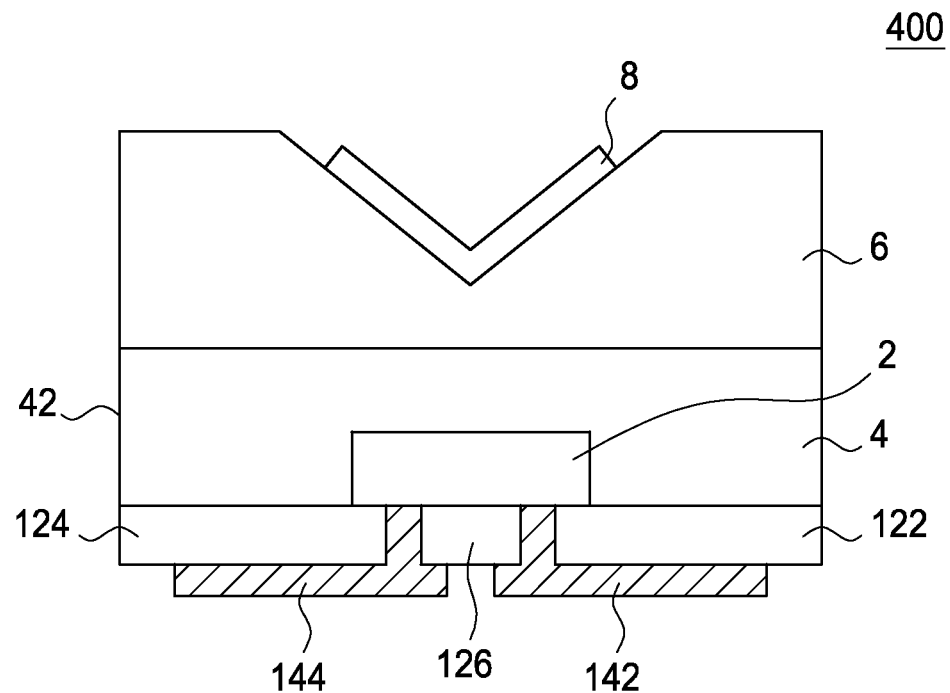

FIGS. 7a-7b show a light-emitting device 400 in accordance with an embodiment of the present disclosure. The light-emitting device 400 comprises a transparent support element 4 covering a light-emitting element 2, an optical element 6 on the transparent support element 4, and an optical layer 8 covering the optical element 6. The light-emitting device 400 further comprises a first insulating layer 122, a second insulating layer 124 and a third insulating layer 126 on a side of the light-emitting element 2 opposing to the optical element 6, wherein the three insulating layers are separated from each other. The first insulating layer 122, the second insulating layer 124, and the third insulating layer 126 are below the light-emitting element 2, and the third insulating layer 126 is located corresponding to the light-emitting element 2, such as located right under the light-emitting element 2. The first insulating layer 122 and the second insulating layer 124 are located corresponding to the side wall 42 and comprise portions not under the light-emitting element 2. The first insulating layer 122, the second insulating layer 124, and the third insulating layer 126 comprise oxide, such as titanium dioxide. Referring to FIG. 7b, a first electrode 142 and a second electrode 144 are formed on the first insulating layer 122, second insulating layer 124, and third insulating layer 126 so that the light-emitting element 2 can be electrically connected to external electric circuits. The first electrode 142 and the second electrode 144 are formed on a side of the light-emitting element 2 away from the light-emitting element 6 and have a gap in-between, and the first electrode 142 and the second electrode 144 are electrically insulated from each other by the third insulating layer 126.

Figure 8:
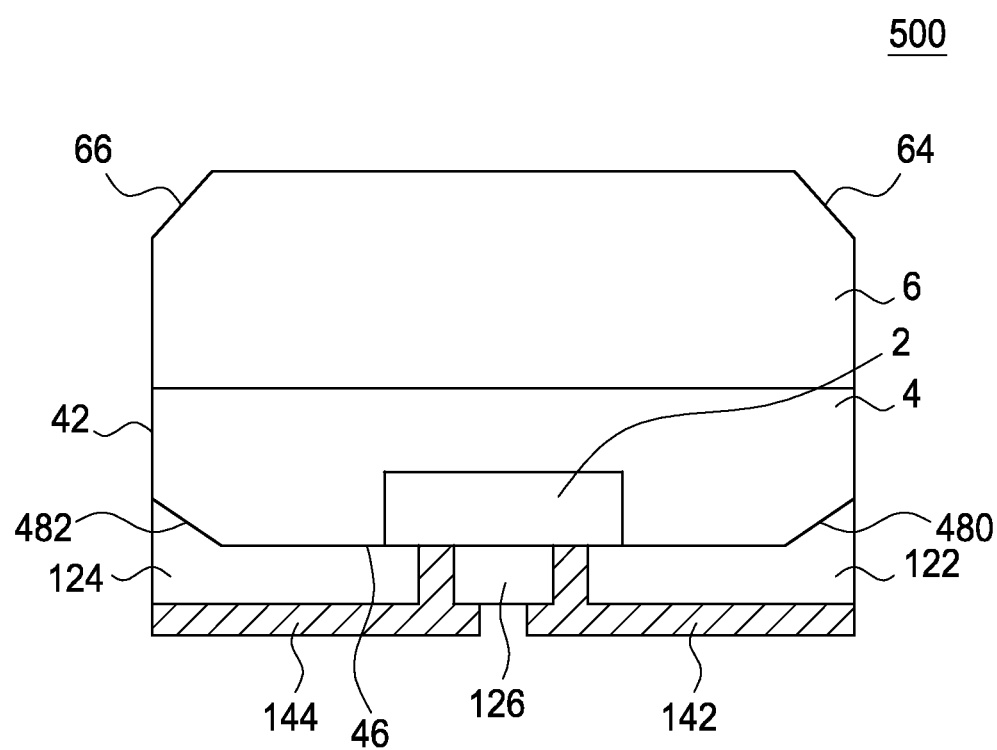
FIG. 8 shows a light-emitting device in accordance with an embodiment of the present disclosure.

FIG. 8 shows a light-emitting device 500 in accordance with an embodiment of the present disclosure. The light-emitting device 500 comprises a transparent support element 4 covering a light-emitting element 2, an optical element 6 on the transparent support element 4, and a first insulating layer 122, a second insulating layer 124, and a third insulating layer 126 on a side of the light-emitting element 2 opposing to the optical element 6. Each of the first insulating layer 122 and the second insulating layer 124 has a part covered by the light-emitting element 2. The third insulating layer 126 is under the light-emitting element 2 and all or part of the entire third insulating layer 126 can be covered by the light-emitting device 2. Furthermore, the first insulating layer 122, the second insulating layer 124, and the third insulating layer 126 are not contact with each other. In this embodiment, the transparent support element 4 further comprises inclined surfaces 480 and 482 formed between the side wall 42 and the bottom surface 46, and the vertical height of inclined surfaces 480 and 482 extended from the bottom is lower than the thickness of the light-emitting element 2. The first insulating layer 122 and the second insulating layer 124 respectively cover the inclined surfaces 480 and 482 and a part of the bottom surface 46. In another embodiment the vertical height of the inclined surfaces 480 and 482 extended from the bottom 46 to the top of the inclined surfaces 480 and 482 is larger than the thickness of the light-emitting element 2. In the light-emitting device 500, the inclined edges 64 and 66 are located on the side edge 62 and substantially corresponding to the position of the inclined surfaces 480 and 482. In other words, the shortest lateral length between the inclined surface 480 and the side surface 22 of the light-emitting element 2 is substantially equal to the shortest lateral length between the inclined edge 64 and the side surface 22 of the light-emitting element 2; and the shortest lateral length between the inclined surface 482 and the side surface 22 of the light-emitting element 2 is substantially equal to the shortest lateral length between the inclined edge 66 and the side surface 22 of the light-emitting element 2. The shortest lateral length between the inclined surface 480 and the side surface 22 and the shortest lateral length between the inclined surface 482 and the side surface 22 can be the same, different or close; the shortest lateral length between the inclined edges 64 and the side surface 22 and the shortest lateral length between the inclined edges 64 and the side surface 22 have the similar characteristic. In another embodiment, the longest lateral distance or the average lateral distance between the inclined edges, inclined surface and the side surface are equal, different or close with each other. In another embodiment, the lateral distance between the inclined surface 480 and the side surface 22 and the lateral distance between the inclined edge 64 and the side surface 22 can be different, wherein the lateral distance can be the shortest distance or the longest distance. The first insulating layer 122, the second insulating layer 124, and the third insulating layer 126 comprise oxide, such as titanium dioxide. In this embodiment, the first insulating layer 122, the second insulating layer 124 and the third insulating layer 126 can be used as reflective layers to reflect the light emitted by the light-emitting element 2. Therefore, when the transparent support element 4 covers the light-emitting element 2, the first insulating layer 122 and the second insulating layer 124 connected to the transparent support element 4 can be used as reflective layers and each of the first insulating layer 122 and the second insulating layer 124 has a horizontal position lower or substantially equal to the height of the light-emitting element 2. In this embodiment, the transparent support element 4 has a shape of a wider upper portion and a narrower lower portion and inclined surfaces 480 and 482, wherein the upper portion connects with the optical element 6 and the lower portion connects with the insulating layer. In this embodiment, the inclined surfaces 480 and 482 are covered by the first insulating layer 122 and the second insulating layer 124.

The first insulating layer 122, the second insulating layer 124, and the third insulating layer 126 are covered by the first electrode 142 and the second electrode 144 so that the light-emitting element 2 can be electrically connected to an external circuit. The first insulating layer 122 locates between the first electrode 142 and the transparent support element 4, and the second insulating layer 124 locates between the second electrode 144 and the transparent support element 4. The first electrode 142 and the second electrode 144 extend to the side surface 42 of the transparent support element 4, and the first insulating layer 122 and the second insulating layer 124 also extend to the side surface 42 from the light-emitting element 2. The n-type semiconductor layer and the p-type semiconductor layer of the light-emitting element 2 respectively connects to an external circuit by the first electrode 142 and the second electrode 144. The first electrode 142 and the second electrode 144 locate at a side of the light-emitting element 2 away from the optical element 6. A gap is located between the first electrode 142 and the second electrode 144 and is on a side of the third insulating layer 126 opposing to the light-emitting element 2 to avoid electrically short between electrodes. The third insulating layer 126 further insulates the first electrode 142 and the second electrode 144. The first electrode 142 and the second electrode 144 extend from the portion covered by the light-emitting element 2 to the portion covered by the transparent support element 4, and the extended portion of the electrodes are not covered by the light-emitting element 2.

Figure 9A:
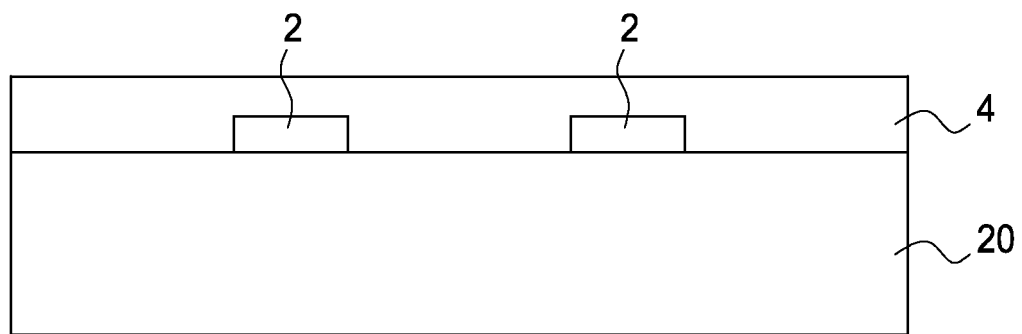
FIGS. 9a-9h show a process diagram of a light-emitting device in accordance with an embodiment of the present disclosure.

FIGS. 9a-9h show a process flow of manufacturing the light-emitting device in accordance with an embodiment of the present disclosure. Referring to FIG. 9a, multiple light-emitting elements 2 are formed on a carrier 20, and each of the light-emitting elements 2 is covered by a transparent support element 4 which separates the multiple light-emitting elements 2. The carrier 20 is a carrier to support the light-emitting elements 2 for the following process. The carrier 20 can be formed of a hard material, such as ceramic substrate or sapphire substrate; or an elastic material, such as glass fiber or bismaleimide-trazine resin (BT). In another embodiment, the transparent support element 4 is formed by covering a layer of a first transparent material and a wavelength conversion material covering the first transparent material, wherein the wavelength conversion material is optionally enclosed in a second transparent material. Then, the wavelength conversion material is covered by a third transparent material. Thus, a first transparent material, a wavelength conversion material and a third transparent material or a first transparent material, a mixture of a second transparent material and the wavelength conversion material, and a third transparent material are sequentially formed within the transparent support element 4 along a direction away from the carrier 20. Moreover, the first transparent material, the second transparent material and the third transparent material comprise identical material, such as epoxy. The first transparent material, the second transparent material, and the third transparent material can also comprise two or more different materials, such as epoxy and silicone, or the transparent materials comprise same chemical elements of different chemical composition or of different ratio.

Figure 9B:
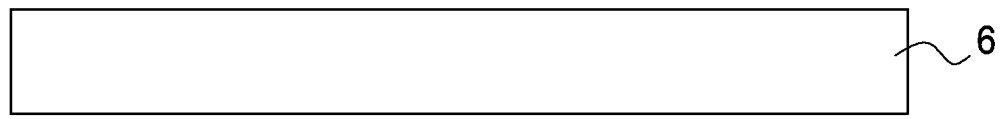
Figure 9B:
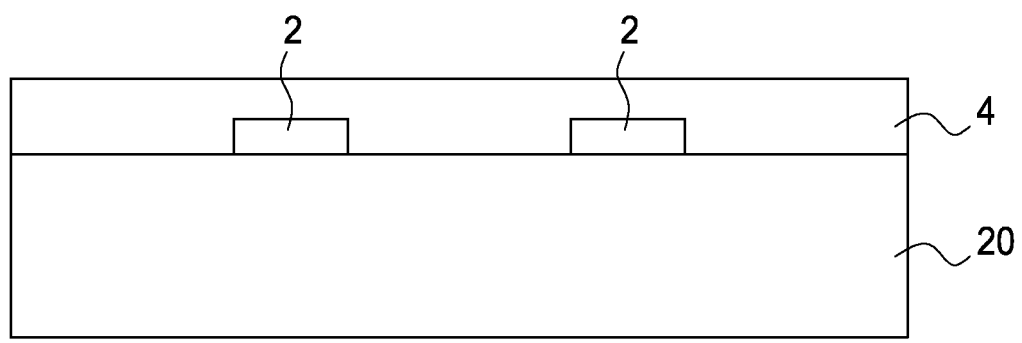
Figure 9C:
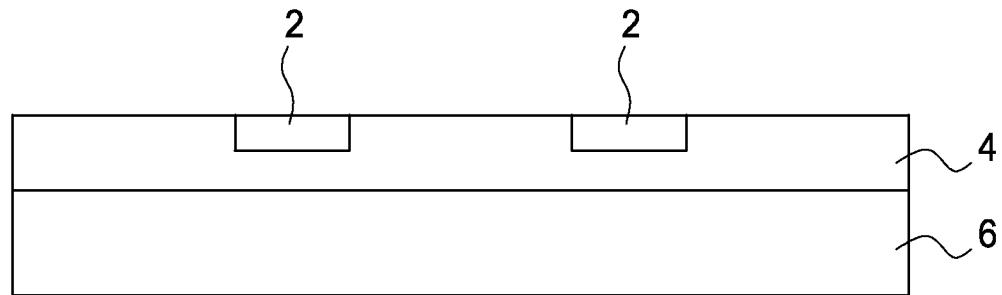
Figure 9D:
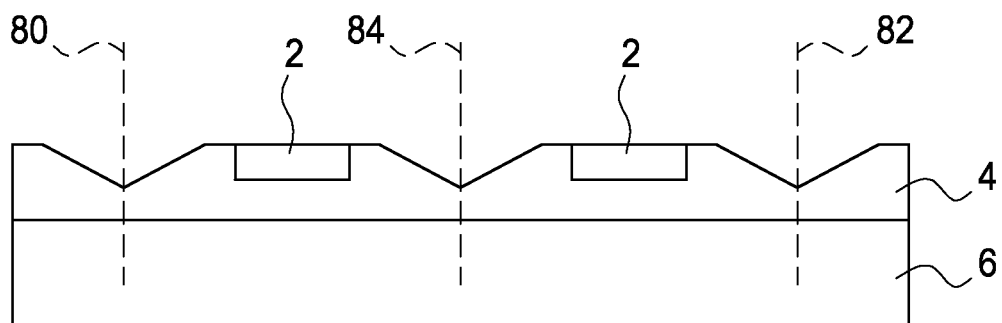
Figure 9E:
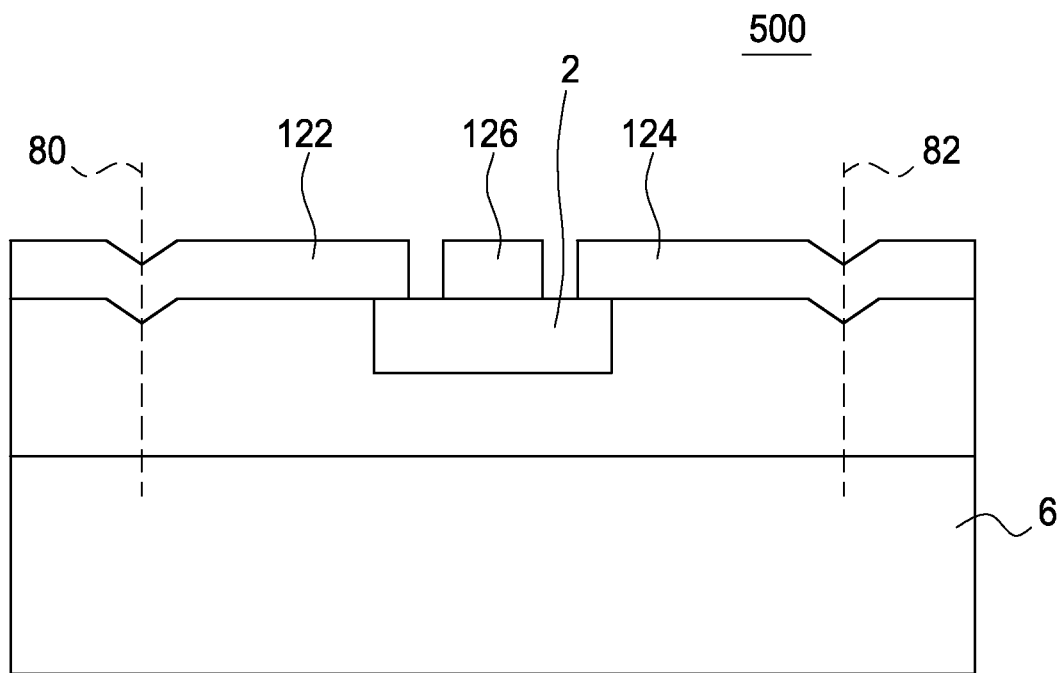
Figure 9F:
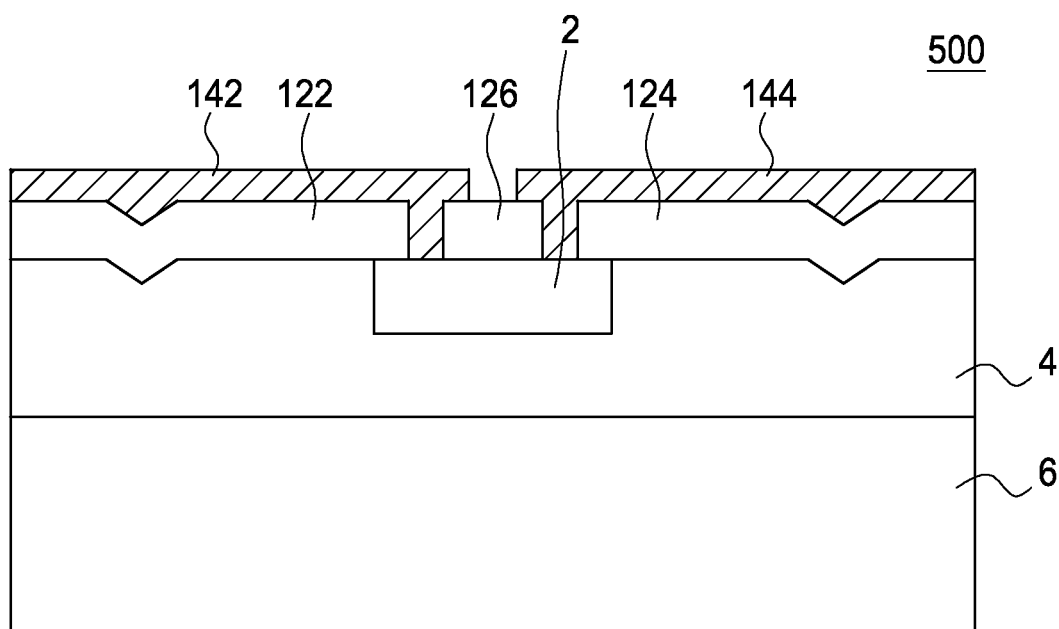
Figure 9G:
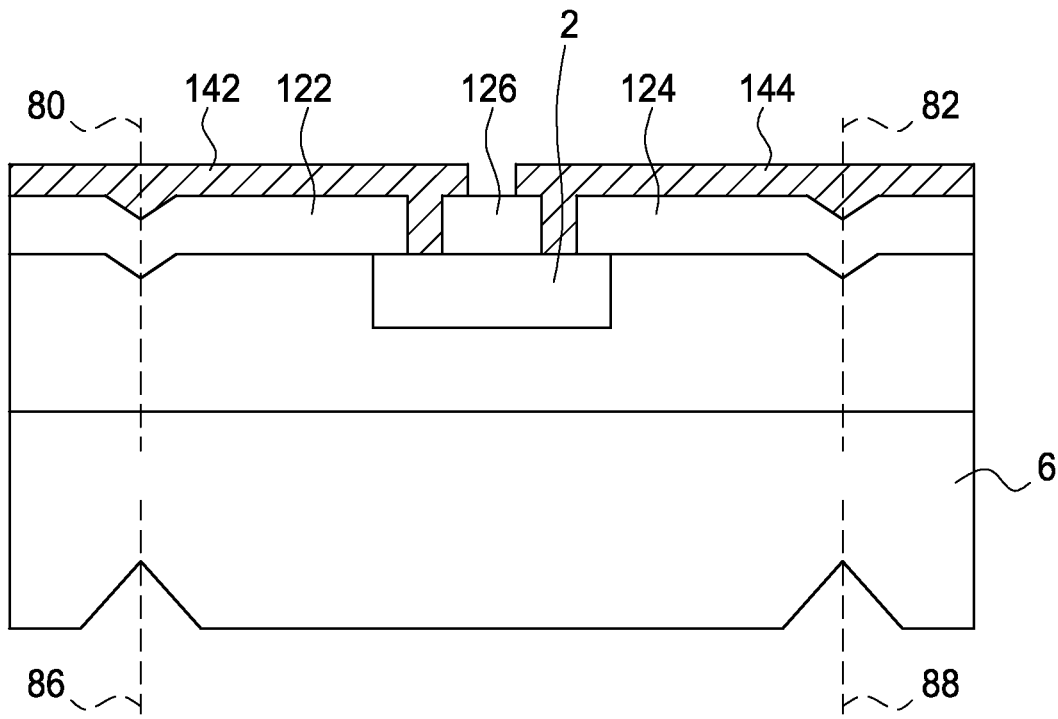
Figure 9H:
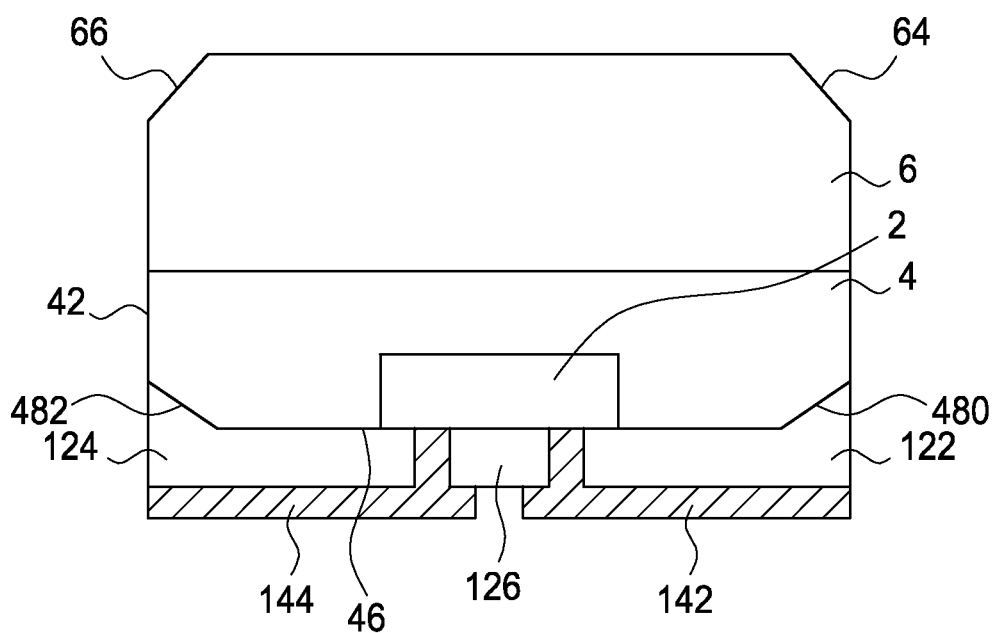

In another embodiment, an adhesive layer is formed between the carrier 20 and the light-emitting element 2 to enhance the adhesion strength in between. Besides, the carrier 20 can be not fully sealed with the light-emitting element 2 because part of the transparent support element 4 flows into the space between the light-emitting element 2 and the carrier 20 while forming the transparent support element 4. Therefore, the light-emitting element 2 is not directly contact with the carrier 20, and part of the transparent support element 4 locates between the carrier 20 and the light-emitting element 2. Referring to FIGS. 9b-9c, the carrier 20 is removed after the optical element 6 is formed on the light-emitting element 2. An adhesive layer (not shown in the figure) can be optionally formed between the light-emitting element 2 and the optical element 6 so the optical element 6 is not easily to be separated from the light-emitting element 2 in the subsequent process. The transparent support element 4 comprises same or different material compared with the transparent support element 4. Referring to FIG. 9d, scribe lines 80, 82 and 84 are formed on the transparent support element 4 in order to separate the light-emitting elements next to any one of the scribe lines 80, 82 and 84. For example, the scribe line 84 is used to separate the two light-emitting elements 2 in the FIG. 9*d*. The scribe line does not contact the optical element 6 because the transparent support element 4 is located between the scribe line and the light-emitting element 6. Referring to FIG. 9*e*, a first insulating layer 122, a second insulating layer 124, and a third insulating layer 126 are formed on a side of the light-emitting element 2 opposing to the optical element 6. Insulating material is filled in the scribe lines 80 and 82 to form a first insulating layer 122 and a second insulating layer 124, and the insulating material covering the light-emitting element 2 forms a third insulating layer 126. In the FIGS. 9*d* and 9*e*, the scribe lines 80, 82, and 84 are formed by a solid knife, such as a metal knife or a plastic knife or by a process comprising laser or etching to form scribe lines having same, different or similar depth and width. Because the methods of forming the scribe lines can be different, the surface of the transparent support element 4 can be flat or rough. In this embodiment, the widths and thicknesses between the insulating layers can be same or different, and the surfaces of the insulating layers can be flat or rough. Referring to FIGS. 9*f*-9*g*, the first electrode 142 and the second electrode 144 are formed between the first insulating layer 122, the second insulating layer 124, and the third insulating layer 126 to provide paths for the light-emitting element 2 electrically connected to an external circuit. The first electrode 142 comprises a portion connected to the first insulating layer 122 and the second electrode 144 comprises a portion connected to the second insulating layer 124, wherein the two portions are not overlapped with the light-emitting element 2. The first insulating layer 122 is formed between the first electrode 142 and the transparent support element 4, the second insulating layer 124 is formed between the second electrode 144 and the transparent support element 4, and the third insulating layer 126 is connected to the bottom surface 46 and the connection surface 26 of the light-emitting element 2, wherein the thicknesses and the widths of the first electrode 142 and the second electrode 144 can be same or different. The scribe lines 86 and 88 are then formed on a side of the optical element 6 away from the light-emitting element 2. The methods to form the scribe lines 86 and 88 are not limited to the methods described above. The scribe lines 86 and 88 are formed at the positions substantially corresponded to the scribe lines 80 and 82. The scribe lines 86 and 88 do not contact the transparent support element 4. In other words, not only the scribe lines 80 and 82 do not cut through the transparent support element 4, but also the scribe lines 86 and 88 do not cut through the optical element 6. Then, a separating process such as splitting or cutting is applied along the scribe lines 80, 82, 86 and 88 to form the light-emitting device 500 in FIG. 9*h*. During the process, the inclined edges 64 and 66 are also formed wherein the surfaces of the inclined edges 64 and 66 can be rough or flat. Compared with the light-emitting device 300 in FIG. 6 or the light-emitting device 100 in FIGS. 1*a*-1*b*, the light emitted from the light-emitting element 2 in the light-emitting device 500 comprises a portion leaving the optical element 6 directly through the top surface 44 of the transparent support element 4 and another portion reflected by the first insulating layer 122 and the second insulating layer 124 connected to the inclined surfaces 480 and 482 and leaves the optical element 6 through the top surface 44 of the transparent support element 4. Therefore, the light field formed by light-emitting element 2 is different from the light field of the light emitted by the light-emitting device 500. In this embodiment, the insulating layers 122 and 124 electrically insulate the electrodes 142 and 144 and reflect light emitted from the light-emitting element 2. As a consequence, less light of the light-emitting element 2 in the light-emitting device 500 leaves the light-emitting device 500 through the sidewall 42 of the transparent support element 4 compared with the light-emitting device 100 or the light-emitting device 300. In other words, much light emitted from the light-emitting device 500 along a direction toward the top surface 44 so the light-emitting device 500 provides better directivity. Besides, the light-emitting device 500 emits a light having a light field distribution having a maximum value substantially corresponding to the inclined surfaces 480 and 482 and a minimum value substantially corresponding to the bottom surface 46.

Figure 10A:
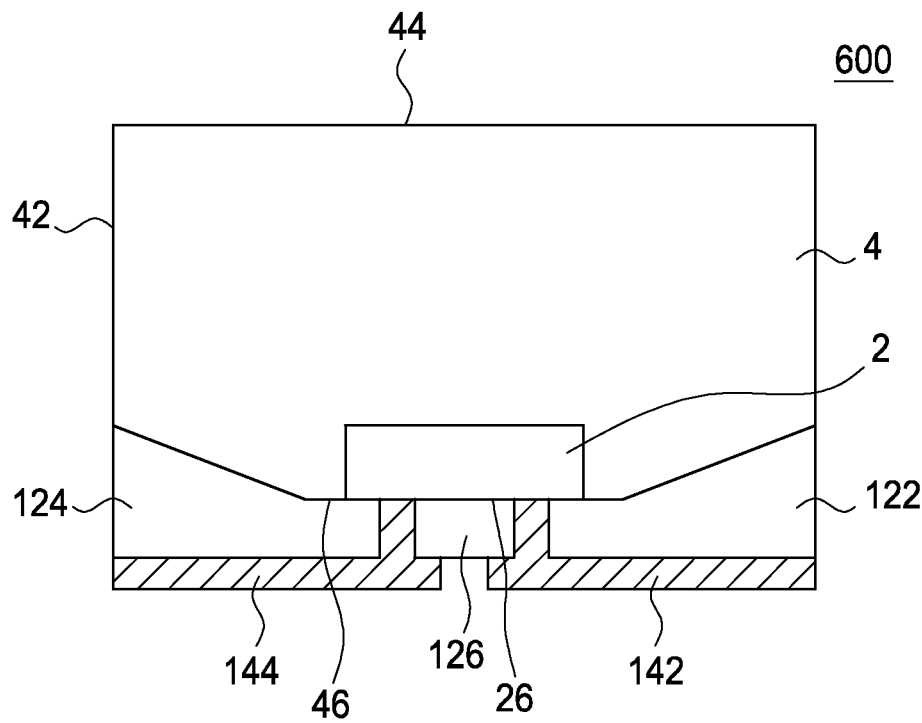
FIGS. 10a-10b show a light-emitting device in accordance with an embodiment of the present disclosure.
Figure 10B:
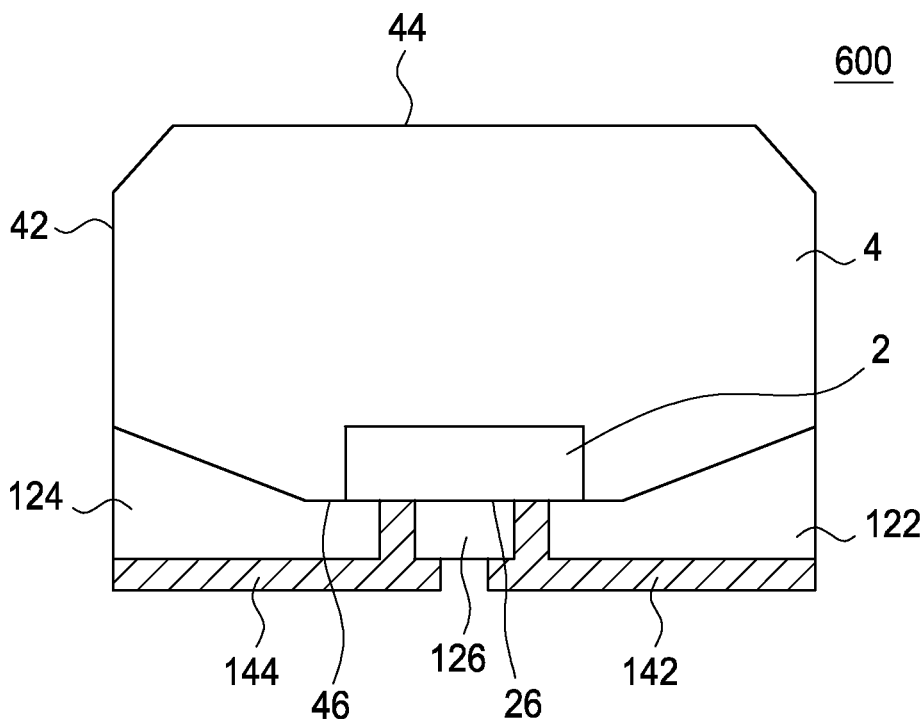

FIG. 10*a* shows a light-emitting device 600 in accordance with an embodiment of the present disclosure. The light-emitting device 600 comprises a transparent support element 4 formed on the light-emitting element 2. The transparent support element 4 covers the light-emitting element 2 and has a sidewall 42 surrounding the transparent support element 4 and the light-emitting element 2, a top surface 44 covering the light-emitting element 2 without contacting the light-emitting element 2, and a bottom surface 46. The bottom surface 46 comprises a portion coplanar with the connection surface 26 and an inclined surface stretched toward the top surface 44 of the transparent support element 4. The sidewall 42 is perpendicular to the top surface 44 and perpendicular to the portion of the bottom surface 46 coplanar with the connection surface 26 of the light-emitting element 2. In this embodiment, the bottom surface 46 connects to the sidewall 42 through the inclined surface. In another embodiment, the bottom surface 46 stretches horizontally in both directions to the extended part of the sidewall 42 and directly connects the sidewall 42. In another embodiment, the connection surface 26 of the light-emitting element 2 is not coplanar with the with the bottom surface 46. In other words, a part of the transparent support element 4 locates between the connection surface 26 and the bottom surface 46. The first insulating layer 122, the second insulating layer 124, and the third insulating layer 126 locate on a same side corresponding to the bottom surface 46 of the transparent support element 4 or corresponding to the connection surface 26 of the light-emitting element 2. A first electrode 142 and a second electrode 144 are formed between the insulating layers. The first insulating layer 122 and the second insulating layer 124 cover the inclined surfaces and provides a reflect function to change the path of the light so the light field is also changed. In this embodiment, the transparent support element 4 comprises a first section and a second section as mentioned above, and comprises the configurations as the optical element 6 depicted in FIGS. 4*a*-4*e* or 5*a*-5*b* so the first section of the transparent support element 4 is flat and the second section of the transparent support element 4 comprises a recess and an optical layer 8 optionally formed thereon. Alternatively, the transparent support element 4 comprises a second section covered by an optical layer 8 and a first section uncovered by the optical layer 8. Referring to FIG. 10*b*, the transparent support element 4 not only comprises different configurations on the top surface 44 but also the top surface 44 comprises an inclined surface near the sidewall 42 to connect the sidewall 42.

Figure 11:
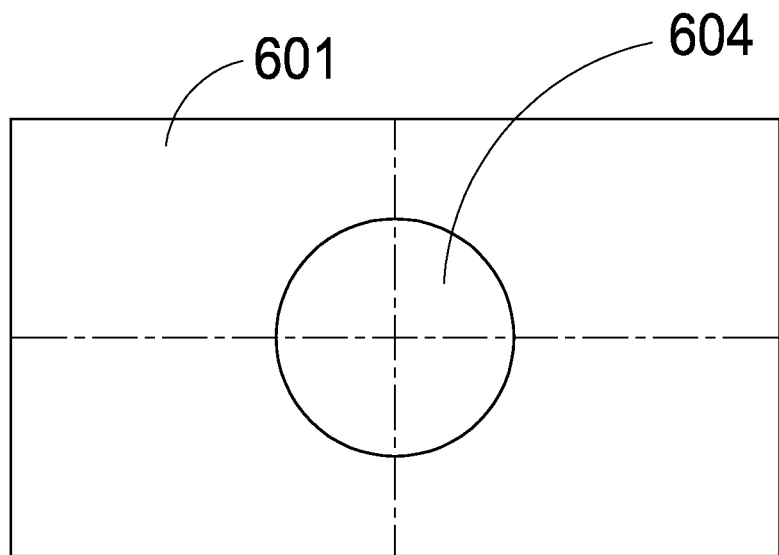
FIG. 11 shows an optical element in accordance with an embodiment of the present disclosure.

FIG. 11 shows a top view of an optical element 6 in accordance with an embodiment of the present disclosure. In this embodiment, the optical element 6 is a rectangular and the surface of the optical element 6 is flat and divided into a first region 601 and a second region 406 which is covered by an optical layer. Referring to FIG. 11, the second region 604 is substantially located at the center of the optical layer 6 and has a circular shape. Thus, the center of the second region 604 is substantially located at the geometric center of the surface of the optical element 6. Besides circular shape, the second region 604 can be oval, rectangular, polygonal, cross or a polygon with a contour comprising a smooth curve. The second region 604 can also be a shape similar to that of the second subsections shown in FIGS. 4a~4e or FIGS. 5a~5b. The geometric center of the second region 604 is substantially overlapped with the geometric center of the surface of the optical element 6, and the second region 604 optionally has a contour symmetrical with the geometric center. The optical layer covering the second region 604 changes the path of the light emitted from the light-emitting element 2 because of the reflective characteristic of the material which is different from the silicon oxide contained in optical element 6. The material of the optical layer can be metal, such as silver or aluminum, or oxide, such as titanium oxide. The selection of the metal is on the basis of the process to prevent the metal from reacting with other materials in the environment. For example, the silver is avoided if the process environment contains sulfur to prevent the generation of compounds comprising sulfur and silver, such as silver sulfide. The optical layer can be a multi-layer structure, such as a Distributed Bragg reflector, and the material can be a stack of oxide, such as a stack of titanium dioxide and a silicon dioxide layer. The optical layer can also be a stack of metal and metal oxide, such as a stack of aluminum and aluminum oxide to reflect light. In another embodiment, the optical layer comprises a wavelength conversion material. In this embodiment, no matter the optical layer is a single layer structure or a multi-layer structure, the optical layer does not reflect the emitted light totally and at least a part of the emitted light directly passes the optical layer. In another embodiment, the thickness is increased or the number of the layers is increased to prevent the light directly from passing through the optical layer and enhance the reflection of the optical layer. Optionally, scattering particles are added in the optical layer so the light leaves the optical layer after being scattered. Because of the optical layer, a light field similar to the light field shown in FIG. 3 is formed wherein the light field has a maximum value corresponding to the first region 601 and a minimum value corresponding to the second region 604. In this embodiment, the second region 604 is a flat surface, but the second region 604 can comprise a rough surface with regular or irregular protrusions to enhance the effect of scattering or reflecting in another embodiment. Since the second region 604 is covered by the optical layer, the light emitted from the light-emitting element 2 is not focused on one specific direction so the halo effect can be avoided or reduced. In another embodiment, the transparent support element 4 comprises a wavelength conversion material and the light excited by the wavelength conversion material is also reflected or scattered by the optical layer on the second region 604 so the light is not focused on certain region to prevent the halo effect. Similarly, the optical layer 6 comprises inclined edges 64 and 66 to provide an optical effect along with the optical layer on the second region 604.

Figure 12:
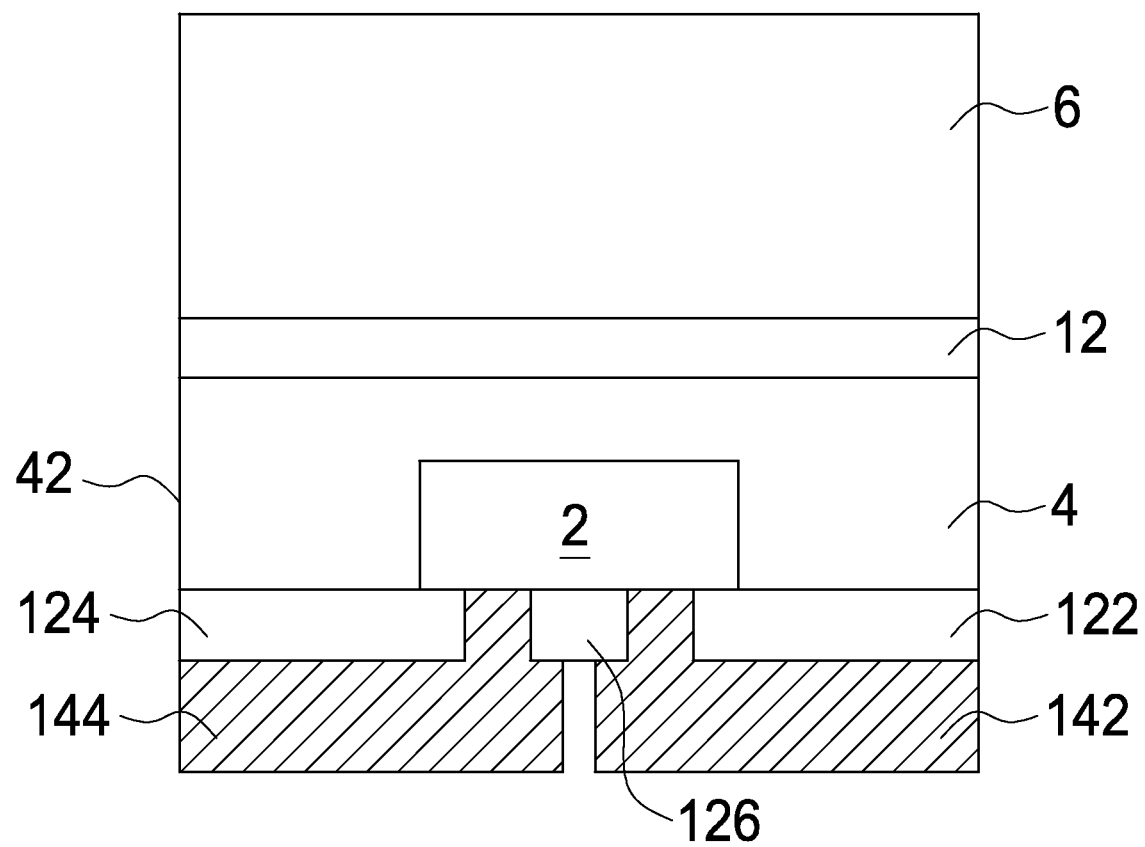
FIG. 12 shows a light-emitting device in accordance with an embodiment of the present disclosure.
Figure 13A:
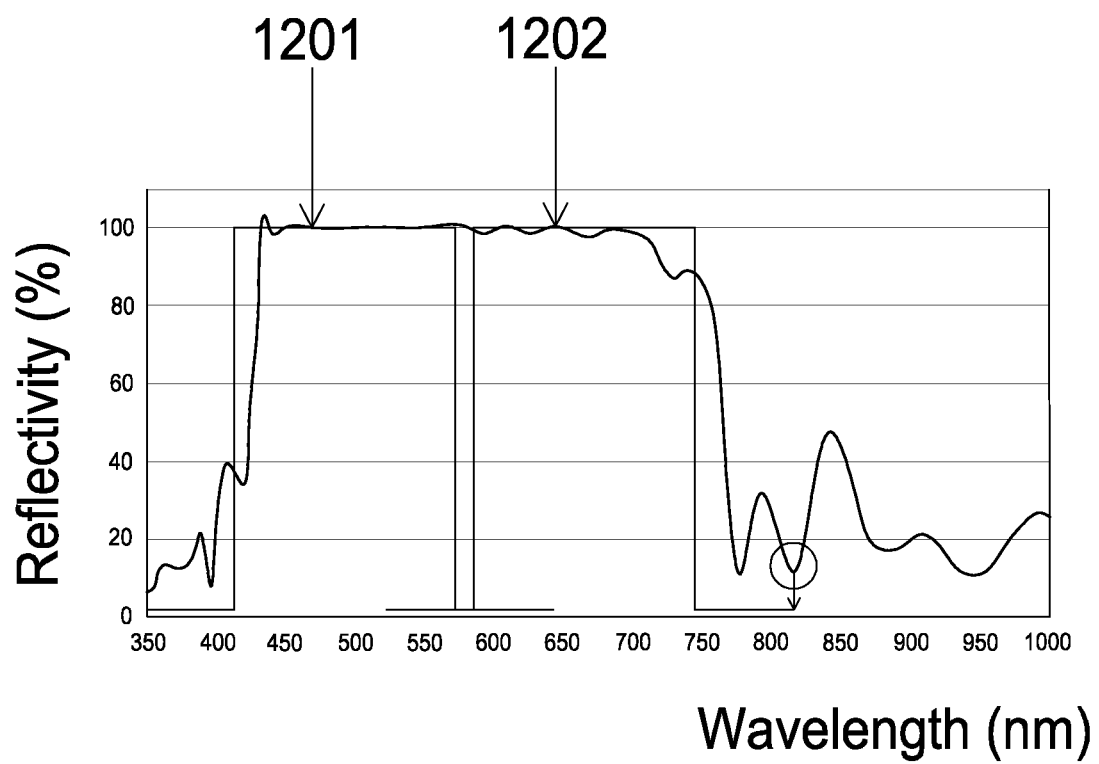
FIGS. 13a-13b show a lighting characteristic of an optical layer in accordance with an embodiment of the present disclosure.
Figure 13B:
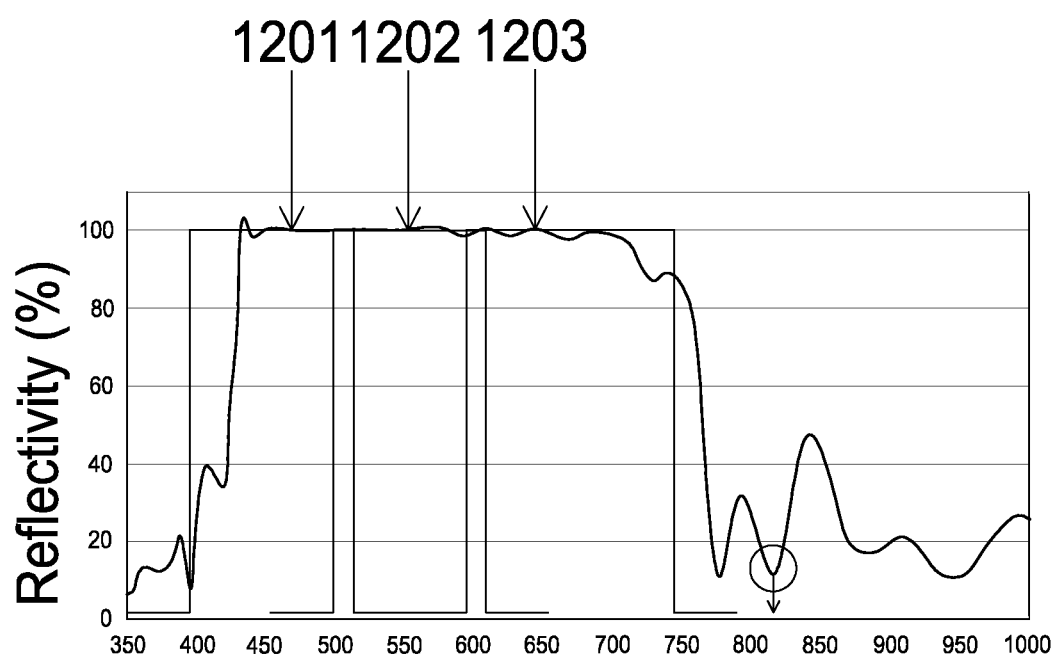

FIG. 12 shows a light-emitting device 700 in accordance with an embodiment of the present disclosure. The light-emitting device 700 comprises a transparent support element 4 on a light-emitting element 2. The transparent support element 4 covers the light-emitting element 2, and an optical element 6 is located on the transparent support element 4. An optical layer 12 is located between the optical element 6 and the transparent support element 4, and a first insulating layer 122, a second insulating layer 124, and a third insulating layer 126 are formed on the light-emitting element 2 opposing to the optical layer 12. The first electrode 142 and a second electrode 144 are formed between the insulating layers to electrically connect to the light-emitting element 2. The optical layer 12 can be a single layer or a multi-layer structure, and the material of the optical layer 12 comprises but is not restricted to the material covering the second section 604 in the embodiment shown in FIG. 11. The optical layer 12 can be a multi-layer structure, such as a DBR structure, which can be a stack of metal and metal, a stack of metal and oxide, or a stack of oxide and oxide, such as a stack of titanium dioxide layers. Moreover, the optical layer 12 has an optical characteristic as shown in FIGS. 13a~13b. The optical layer 12 has a reflectivity about 100% when the incident light has a peak wavelength between 420~750 nm so the light emitted from the light-emitting element 2, which comprises red light, yellow light, blue light and green light, can be reflected. The optical layer 12 barely reflect lights having a wavelength between 350~420 nm or larger than 750 nm. As shown in FIG. 13a, the optical layer 12 further comprises a first optical layer 1201 and a second optical layer 1202, wherein the first optical layer 1201 has a reflectivity about 100% when the incident light has a wavelength between 420~600 nm, while the second optical layer 1202 has a reflectivity about 100% to the incident light having a wavelength between 550~750 nm. By means of the combination of the first optical layer 1201 and the second optical layer 1202, the combination provides an optical characteristic as shown in FIG. 13a. Referring to FIG. 13b, the optical layer 12 is consisted of a first optical layer 1201, a second optical layer 1202, and a third optical layer 1203, and each of the three optical layers respectively has different optical characteristics. The optical layers are stacked to provide a characteristic of a reflectivity about 100% to the incident light having a wavelength between 420~750 nm. FIGS. 13a-13b show an optical characteristic of the light emitting layer in accordance with an embodiment of the present disclosure. The thicknesses of the first optical layer 1201, of the second optical layer 1202 and of the third optical layer 1203 are different, but the thicknesses of the three presented optical layers in another embodiment can the same. Moreover, in another embodiment, the optical layer 12 can be consisted of three or more layers of same or different thicknesses. The layers within the optical layer 12 respectively comprise different optical characteristics and are configured to provide similar reflectivity with respect to the light having a wavelength within the same wavelength range. For example, as shown in FIG. 13a, the first optical layer 1201 and the second optical layer 1202 both has a reflectivity about 100% with respect to an incident light with a wavelength between 550~600 nm. In another embodiment, the optical layer 12 further has a reflectivity about 100% with respect to an incident light with a wavelength between 380~980 nm. With an increase of the incident angle entering the optical layer 12, such as larger than 90 degrees or larger than 110 degrees, the wavelength of the light can be reflected by the optical layer 12 is lower. Take an incident light comprising a red light and a blue light as an example, while the incident angle of the incident light is increased, the portion of the red light, which has a peak wavelength larger than that of the blue light, is not reflected. In other words, while the wavelength range of the light can be 100% reflected by the optical layer 12 is enlarged, such as to 980 nm, the situation that the optical layer 12 fails to reflect red light at larger incident angle can be improved.

In the embodiment shown in FIG. 12, the optical layer 12 covers the light-emitting device 700 in horizontal view. In other words, the optical layer 12 covers the light-emitting element 2, the first insulating layer 122, the second insulating layer 124, and the third insulating layer 126 so the light emitted from the light-emitting element 2 definitely passes the optical layer 12 before passing through the optical element 6, and the portion of the light reflected by the optical layer 12 leaves the light-emitting device 700 through the side wall 42 after being reflected by the insulating layers. Therefore, the light field formed by the light-emitting device 700 has similar light intensity at all angles in the horizontal direction. In another embodiment, when the light-emitting device 700 has same widths and lengths, the light field formed by the light-emitting device 700 is pretty symmetric. The transparent support element 4 further comprises a wavelength conversion material, and a part of the wavelength conversion material is excited to emit a light by the light emitted from the light-emitting element 2. A portion of the light emitted from the wavelength conversion material is reflected to the insulating layer by the optical layer 12, and the portion of the light is then reflected by the insulating layer and leaves the light-emitting device 700 through the side wall 42. While the transparent support element 4 comprises a wavelength conversion material, and the optical layer 12 covers the entire the light-emitting device 700, the wavelength conversion material cannot be observed from the top of the light-emitting device 700. Since the light intensity of the light-emitting device 700 is substantially the same over all angles, the COA (color over angle) of the light-emitting device 700 is substantially the same.

Figure 14A:
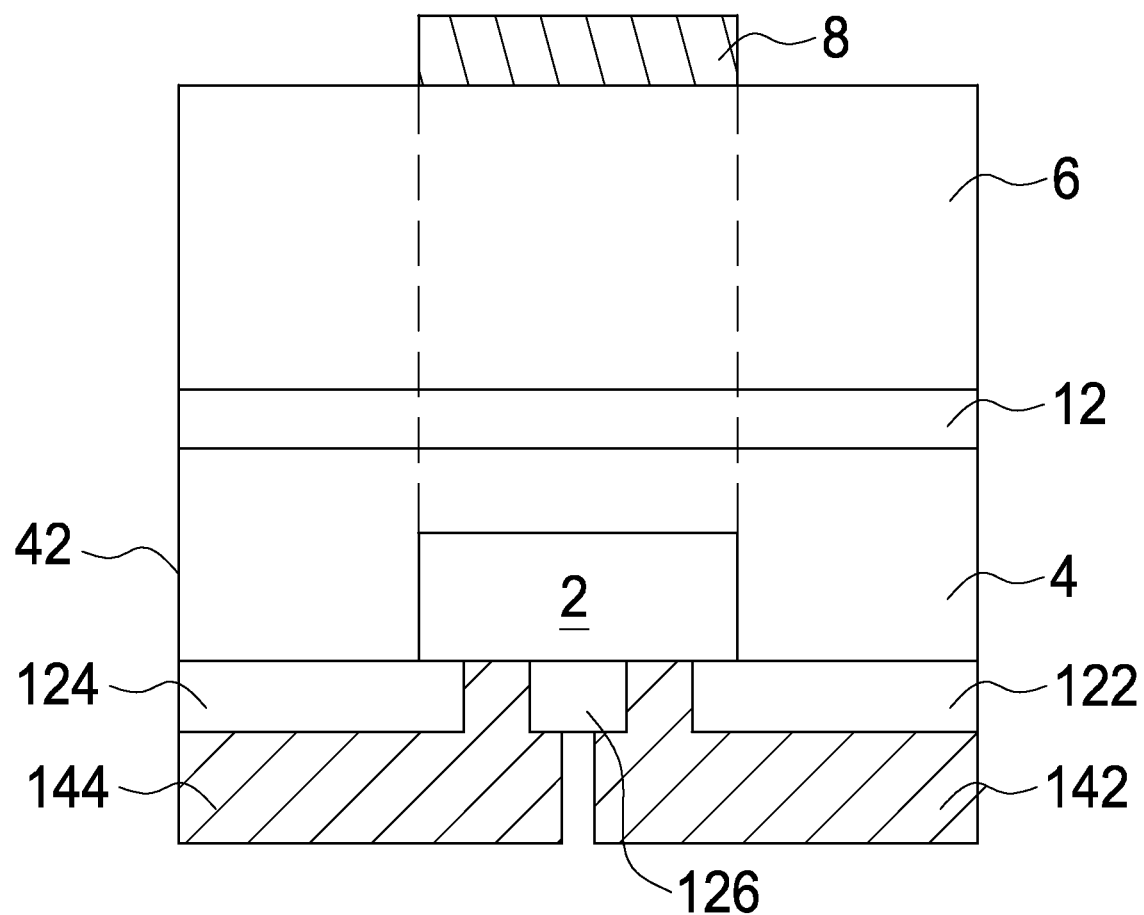
FIGS. 14a-14c show a light-emitting device in accordance with an embodiment of the present disclosure.
Figure 14B:
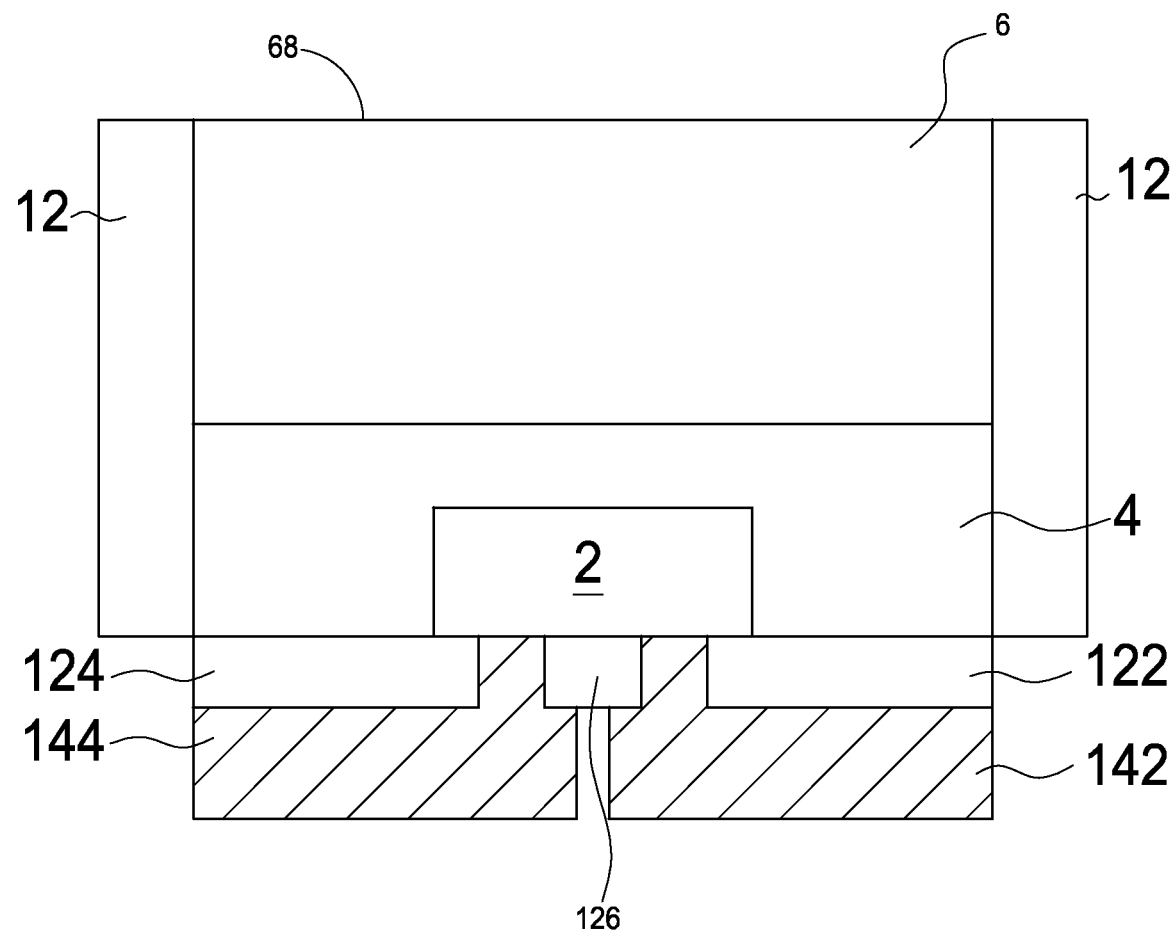

Referring to the embodiment shown in FIG. 14a, the light-emitting device 700 further comprises an optical layer 8 formed thereon, and the surface of the optical element 6 comprises different types to form various types as shown in the top view depicted in the FIGS. 4a~4e and the FIGS. 5a~5b, or the optical layer 8 covers the second region 604 of the surface of the optical element 6 as shown in the embodiment shown in FIG. 11. In this embodiment, the material of the optical layer 8 is the same as the optical layer 12, and the arrangement of the optical layer 8 provides a light field distribution different from that provided by the optical layer 12. In another embodiment, the material of the optical layer 8 can be different from that of the optical layer 12 and the thicknesses of the optical layer 8 and the optical layer 12 can be same or different. In the embodiment shown in FIG. 14b, no optical layer 12 is formed between the optical element 6 and the transparent support element 4, and the optical layer 12 surrounds the side surfaces of the light-emitting device 700 so a part of the light emitted from the light-emitting element 2 leaves the light-emitting device 700 directly through the optical element 6. In this embodiment, the light which directly leaves the light-emitting device 700 from the side surface of the light-emitting device 700 shown in FIGS. 7a~8, and the light which is reflected by the first insulating layer 122, the second insulating layer 124, and the third insulating layer 126 to leave the light-emitting device 700 from the side surface of the light-emitting device 700 are affected by the optical layer 12 surrounding the light-emitting device 700. The light is reflected and leaves the light-emitting device 700 through the top surface 68 of the optical element 6 so the amount of light emitting in lateral directions is reduced. Therefore, most (i.e. more than 80%) of the light emitted from the light-emitting device 700 leaves the light-emitting device 700 through the top surface 68, and the light-emitting device 700 is configured as a surface emitter. In another embodiment, more than 90% of the light leaves the light-emitting device 700 through the top surface 68. In other embodiments, the light-emitting device 700 comprises inclined edges 64 and 66, the top surface 68 of various types, and inclined surfaces 480 and 482. Moreover, an optical layer 12 is optionally formed between the optical element 6 and the transparent support element 4, or is formed on the sidewall of the light-emitting device. Referring to the embodiment in FIG. 14b, the optical element 6 has a first region and a second region, wherein the width of the first region is larger than that of the second region.

Figure 15:
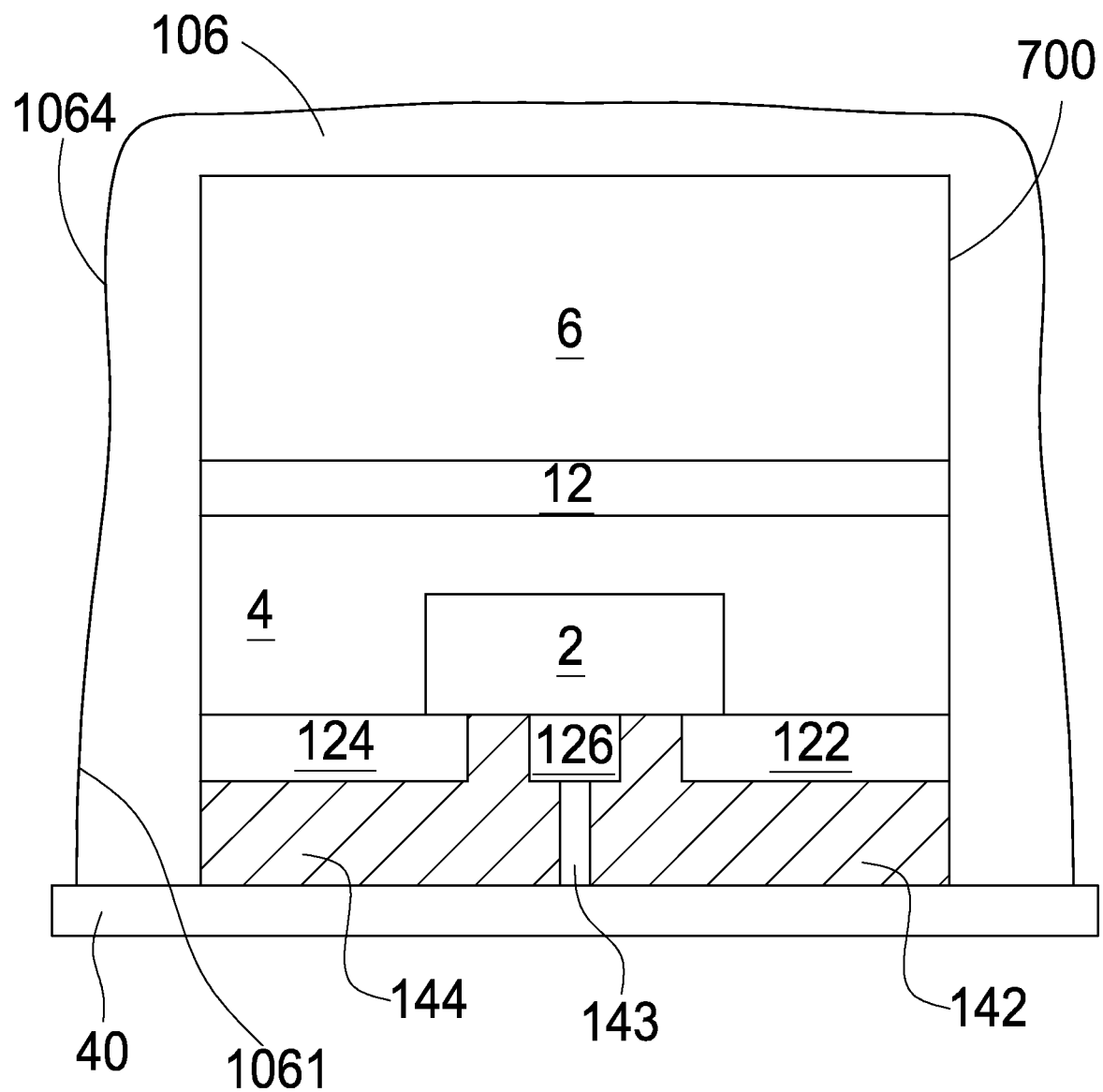
FIG. 15 shows a light-emitting device in accordance with an embodiment of the present disclosure.

FIG. 15 shows a light-emitting device 800 in accordance with an embodiment of the present disclosure. The light-emitting device 800 comprises a light-emitting device 700 shown in FIG. 12, an optical element 106 and a carrier 40. The first electrode 142 and the second electrode 144 of the light-emitting device 700 are electrically connected to the circuit (not shown in the figure) on the carrier 40 or to the conductive parts (not shown in the figure). The optical element 106 covers the light-emitting device 700, but only a part of the surface of the light-emitting element 2 is covered by the optical element 106. In another embodiment, the surface of the carrier 40 is covered by the light-emitting device 700 and the optical element 106. In other words, not only the surface of the carrier 40 directly contacts the light-emitting device 700 but also other parts of the carrier 40 contact the optical element 106 directly. In this embodiment, at least a part of the light emitted from the light-emitting element 2 leaves the light-emitting device 800 through the optical element 106. The optical element 106 can be a single layer structure or a multi-layer structure and has a characteristic to reflect the light emitted from the light-emitting element 2 and let the light emitted from the light-emitting element 2 pass in the same time. The optical element 106 can be made of a hard material, such as a glass, or of a soft material, such as a plastic material which deforms at a room temperature (i.e., 25° C.) or high temperature (i.e., larger than 50° C.). In another embodiment, when the transparent support element 4 comprises a wavelength conversion material, at least a part of the light excited by the wavelength conversion material can pass through the optical element 106 without being absorbed or reflected. In this embodiment, the light-emitting device 700 does not contact directly the optical element 106 so fluid can be optionally filled in to the gap between the light-emitting device 700 and the optical element 106 to improve heat conduction. For example, the fluid can be a gas has a thermal conductivity between 40~180 (mW/m-K) under environmental temperature of 15° C. and a pressure of 1 bar, such as helium, neon, hydrogen, chlorofluorocarbons, hydrochlorofluorocarbons, difluoromethane, pentafluoroethane or the mixture thereof. Or, a fluid of similar heat conductivity is filled to improve the effect of heat conduction. In this embodiment, there is no other fluid between the light-emitting device 700 and the optical element 106 so there is no fluid in the gap 143 between the first electrode 142 and the second electrode 144. The gap 143 and the space between the light-emitting device 700 and the optical element 106 can be in vacuum or comprises only the gas which exists while forming the light-emitting device 800. During the process of filling a fluid, the fluid fills at least a part of the space between the light-emitting device 700 and the optical element 106 and a part of the gap 143. In an embodiment, when there is a fluid filled in the gap 143, it is equivalent to the underfill in the bottom of the light-emitting device 800. Therefore, not only the heat dissipation but also the stability of the structure of the light-emitting device 800 are enhanced. The fluid filled into the gap 143 and the space between the light-emitting device 700 is transparent to the light emitted from the light-emitting device 700. In other words, at least a part of the light emitted from the light-emitting device 700 can directly pass through the fluid without being absorbed or reflected. The wavelength conversion material can exist in not only the transparent support element 4 of the light-emitting device 700 but also the fluid between the light-emitting device 700 and the optical element 106. The wavelength conversion material can also be formed on the optical element 106, such as on the inner surface 1061 of the optical element 106, which is close to the light-emitting device 700, or on the outer surface 1064 of the optical element 106, which is away from the light-emitting device 700, to absorb the light emitted from the light-emitting device 700 along one or multiple directions. While the wavelength conversion material is formed on the optical element 106, the heat from the wavelength conversion material is more likely to be dissipated to avoid heat accumulation in the light-emitting device 800 that might cause the decrease of the light emitting efficiency of the light-emitting element 2. In this embodiment, the optical element 106 has a flat surface; in another embodiment, the inner surface 1061 and/or the outer surface 1064 can comprise protrusions, rough parts or holes arranged regularly or irregularly with same or different shapes formed on the surfaces of the optical element 106 to change the distribution of light filed of the light-emitting device 800.

Figure 14C:
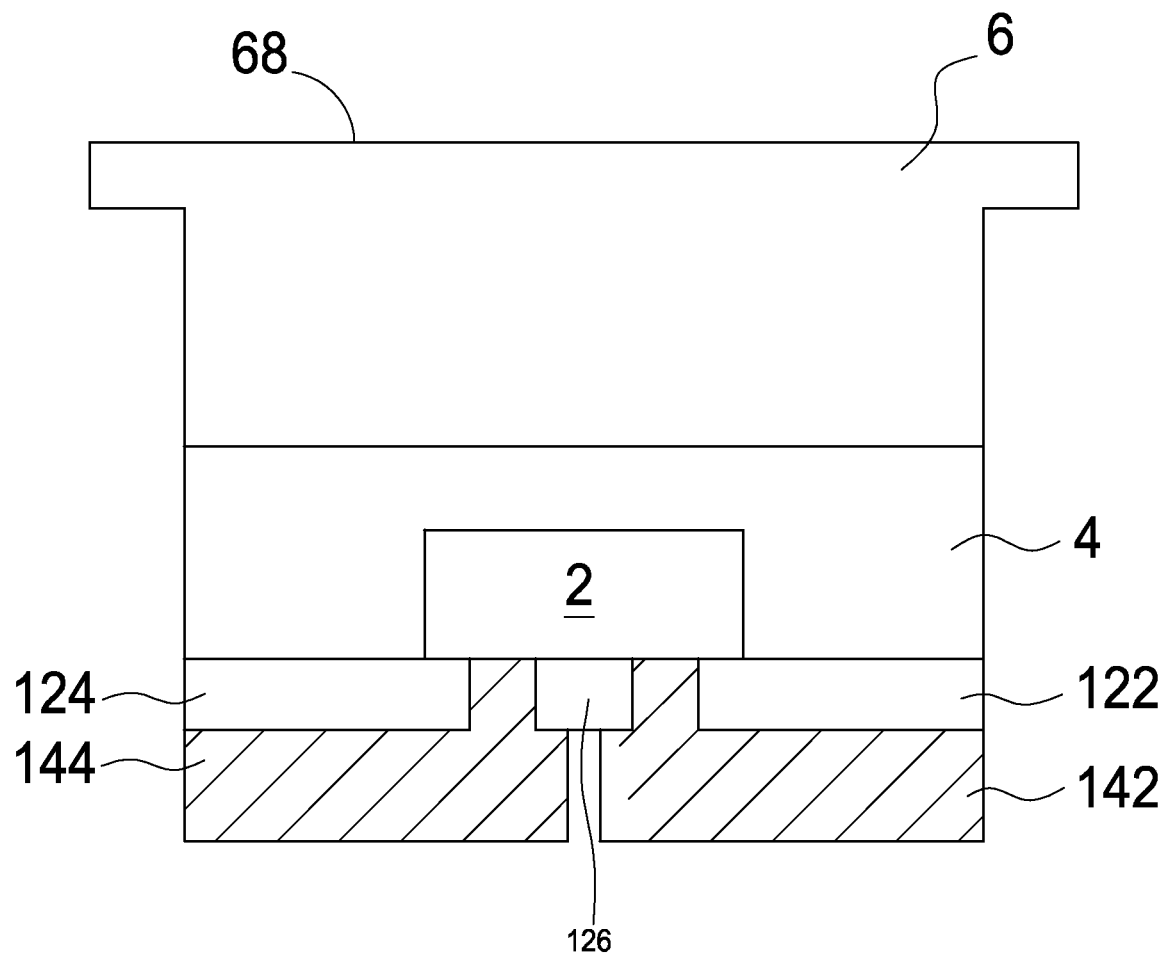
Figure 16A:
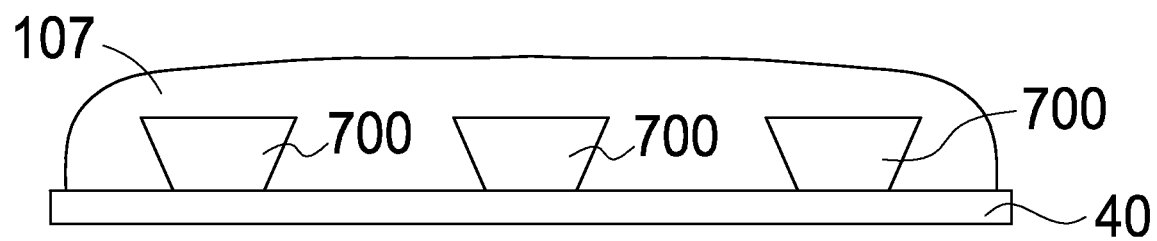
FIGS. 16a-16b show a light-emitting apparatus in accordance with an embodiment of the present disclosure.
Figure 16B:
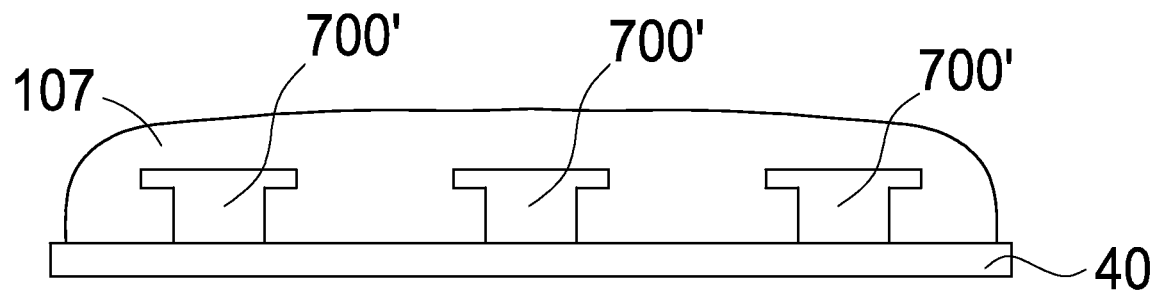

Besides the structure of an optical element 106 covering a light-emitting device 700 as shown in FIG. 15, a lateral view of another embodiment of this application shown in FIG. 16a further discloses an optical element 107 covering the multiple light-emitting devices 700 to form a light-emitting apparatus 900. The circuits (not shown in the figure) on the carrier 40 or the conductive parts (not shown in the figure) are electrically connected to the multiple light-emitting devices 700. Referring to the embodiment shown in FIG. 16a, the light-emitting device 700 has a trapezoid shape having a wider top and a narrower bottom, and the structure of the light-emitting device 700 is similar to the structure shown in FIGS. 14a and 14b. Referring to FIG. 16b, the light-emitting device 700 has a structure of a wider top and a narrower bottom, like a T shape, and the detailed structure is shown in FIG. 14C. The light-emitting device 700 is connected to the carrier 40 with the narrower end, and the shape having a wider top and a narrower bottom is configured to enlarge the light field emitted by the light-emitting element 2. For example, an optical element 6 having a width larger than that of the transparent support element 4 is adopted so that the light is delivered to a larger range. Referring to the structure shown in FIG. 14C, the shape having a wider top and a narrower bottom can be formed by cutting during the manufacturing process. Besides, a fluid (such as gas) is optionally filled into the gap between the optical element 107 and the carrier 40 to improve the heat dissipation, or a wavelength conversion material is added into the fluid. As mentioned above, while the fluid is filled in the light-emitting device 800, some of the fluid flows in to the gap 143 in the light-emitting device 800. In this embodiment, the fluid is filled while forming the light-emitting apparatus 900, and some of the fluid flows in the space between the light-emitting device 700 and the carrier 40 to form an underfill part so the heat dissipation and the connecting strength between the light-emitting device 700 and the carrier 40 are increased. In another embodiment, a transparent material surrounds and convers the light-emitting device 700 and fills the gaps between the carrier 40 and multiple light-emitting devices 700 to form an optical element 107. The thickness of the transparent material is slightly higher than the height of the light-emitting device 700, so the light emitted from the light-emitting device 700 in all directions leaves the light-emitting apparatus 900 after passing through the transparent material. Referring to the structure in FIG. 15, the light-emitting device 700 has a shape having a wider top and a narrower bottom, and the wavelength conversion material in the transparent support element 4 is covered by the optical layer 12 so the wavelength conversion material in not observed from top view. In other words, no matter the light-emitting apparatus 900 emits a light or not, the wavelength conversion material cannot be seen from top view so the appearance of the light-emitting apparatus 900 is improved. The shape having a wider top and a narrower bottom of the light-emitting device 700 can be formed by cutting while forming a single light-emitting device 700 or formed by molding or epitaxial stacking process. For the above reasons, when the wavelength conversion material is not desired to be seen for aesthetic or other reasons, there is no need to add other optical film, to change the shape of the optical element, and to fill fluid into the light-emitting device to hide the wavelength conversion material, and the amount of the light from the light-emitting device 700 absorbed by other optical film or absorbed by the light-emitting device 700 is decreased. From the appearance of the light-emitting apparatus 900 point of view, the shape of the optical element 107 can be an oval, a cylindrical or having a wider top and a narrower bottom, or other shapes according to the requirement of the light field. Besides, when the carrier 40 is transparent, the light from the light-emitting device 700 leaves the light-emitting apparatus 900 from upper and lower sides, front and rear sides, and the left and right sides to make the light-emitting apparatus 900 to be a light-emitting device having six light emitting surfaces.

Figure 17A:
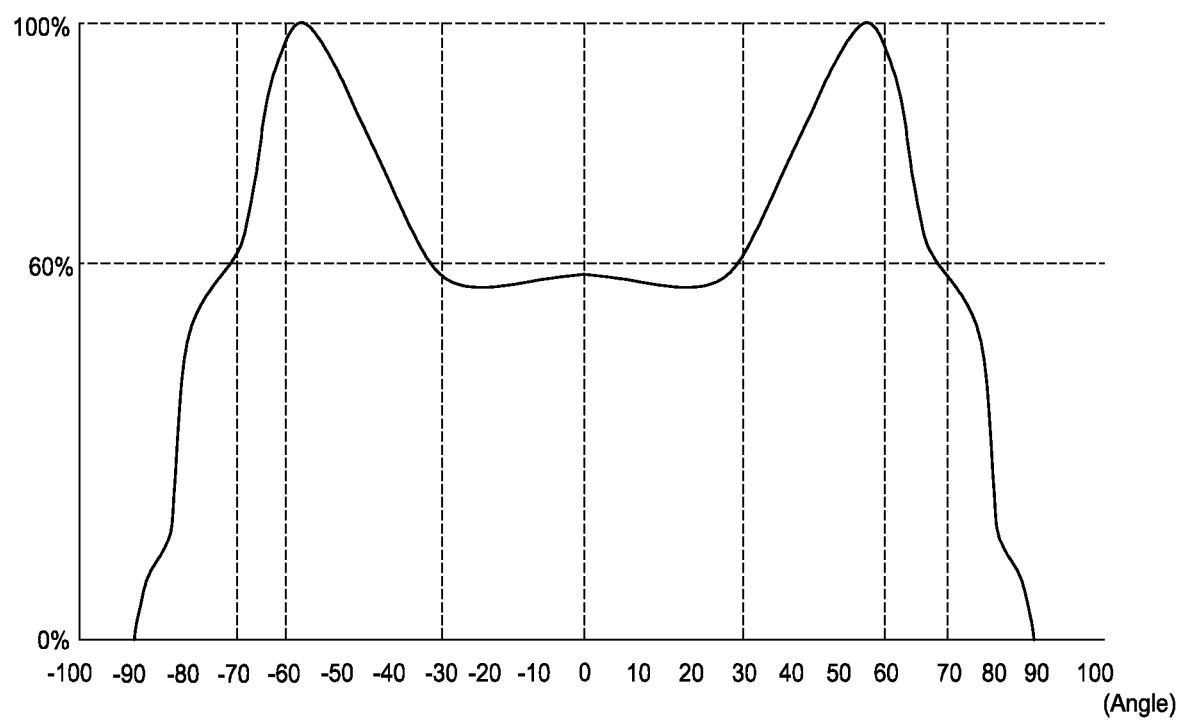
FIGS. 17a-17b show a light field of a light-emitting device in accordance with an embodiment of the present disclosure.
Figure 17B:
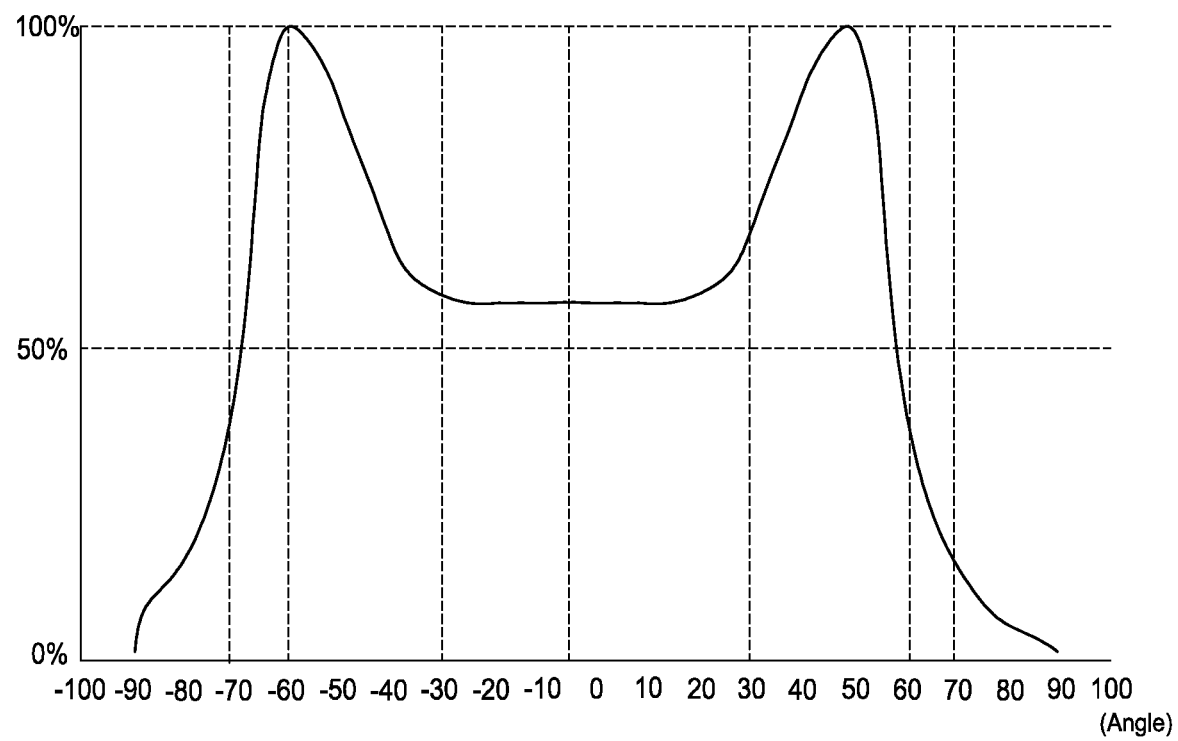

Referring to FIGS. 17a~17b, the figures show the light intensity distribution figure of light field measured in two different directions of the light-emitting device shown in FIGS. 15~16. As shown in FIG. 17a, a valley extending from about −30°~+30° is located between two peaks (100%) in the light intensity distribution figure, wherein the light intensity of the valley is about 60%. The locations of the two peaks are located at about +/−60° while the position of 0° locates within the valley. The distribution of the light intensity shown in FIG. 17a extends from about −80° to +80° with a symmetrical distribution, and the location of the 0° in the light intensity distribution is about aligned with the geometry centers of the light-emitting device 800 and light-emitting apparatus 900. Referring to FIG. 17b, a valley having a light intensity of about 55% extending from about −35° to +35° locates between the two peaks (100%) which locate at about +/−60°, and the position of 0° locates within the valley. The distribution of the light intensity shown in FIG. 17b extends from about −70° to +70° with a symmetrical distribution, and the location of the 0° in the light intensity distribution is about aligned to the geometry centers of the light-emitting device 800 and light-emitting apparatus 900. Based on the light intensity distribution figure shown in FIGS. 17a and 17b, the distribution of the light intensity is symmetrical with respect to the geometry center of the light-emitting device and respectively has a valley located between two peaks, and a ratio of light intensity between the peak and the valley is about in a range from 1:1.67 to 1:1.8 in the two embodiments.

Figure 18A:
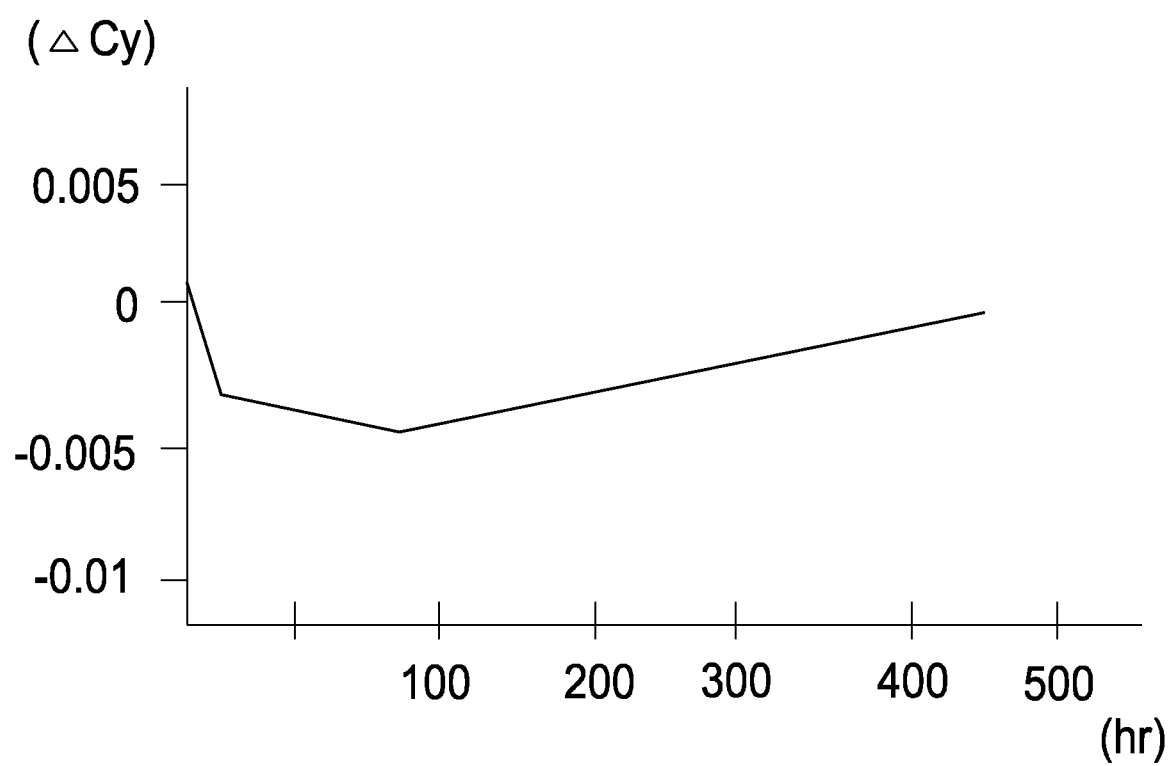
FIGS. 18a-18d show a shift of color coordinates of light emitted by a light-emitting device in accordance with an embodiment of the present disclosure.
Figure 18B:
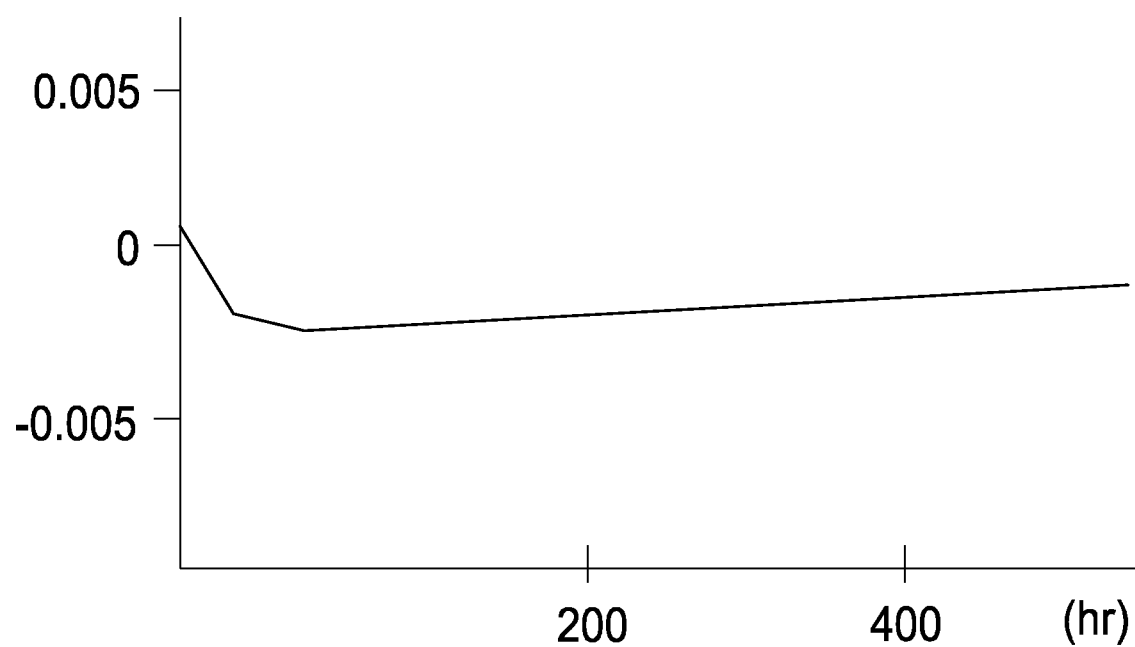
Figure 18C:
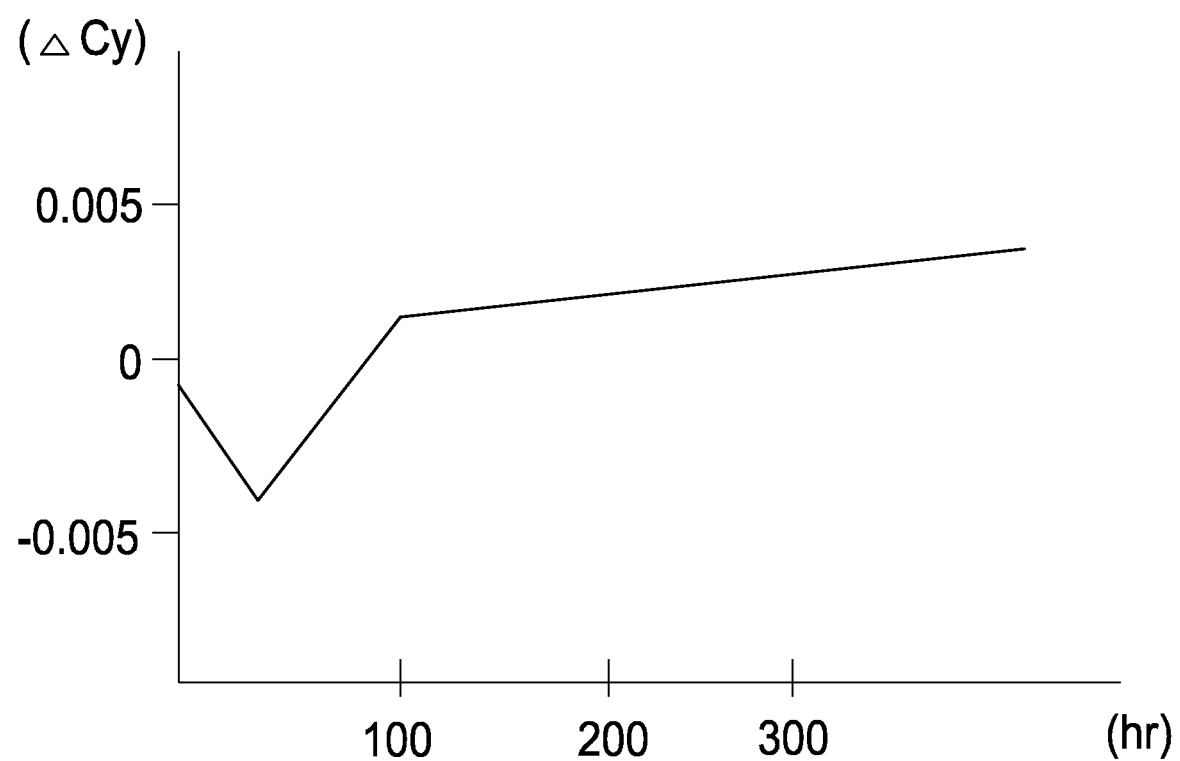
Figure 18D:
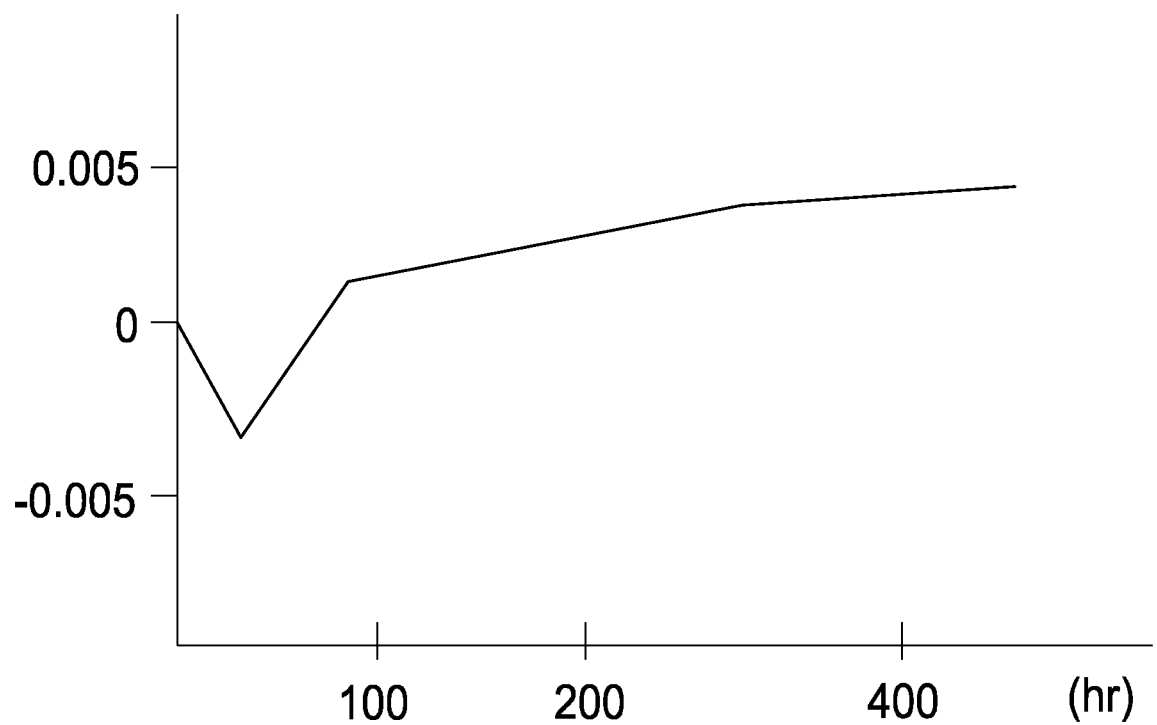

As shown in FIGS. 18a~18b, the color coordinates of CIE_X (Cx) and CIE_Y (Cy) of the light emitted from light-emitting device has a shift wherein the ΔCx≠0 and ΔCy≠0 after a period of operation and returns to their original values (ΔCx=0 and ΔCy=0) after another operation period. As shown in FIG. 18a, the color coordinate of CIE_Y decreases 0.004 (that is, ΔCy=−0.004) after a 24-hour operation, and the color coordinate of CIE_X of the same light decreases 0.001 (that is, ΔCx=−0.001) after a 24-hour operation as shown in FIG. 18b. The color coordinates of CIE_X and CIE_Y gradually return to their original value (ΔCx=0 and ΔCy=0) after another 400 hour operation. As shown in FIG. 18c, the color coordinate of CIE_Y of another light-emitting device decreases 0.005, and ΔCy=−0.005 after a 24-hour operation, but the value of the color coordinate of CIE_Y not only increases to its original value (ΔCy=0) but also increases to be larger than its original value (ΔCy>0). In the meantime, the color coordinate of CIE_X of the same light decreases about 0.003 (ΔCx=−0.003), after a 24-hour operation, but the value of the color coordinate of CIE_X not only increases to its original value (ΔCx=0) but also increased to be larger than its original value (ΔCx>0), which is similar to the case of the color coordinate of CIE_Y. Besides the color coordinates of CIE_X and CIE_Y, the light-emitting efficiency of a light-emitting device decreases after a period of operation and returns to its original value after another period of operation. Furthermore, in another embodiment, the light-emitting efficiency increases to be larger than its original light-emitting efficiency after another period of operation.

Figure 19A:
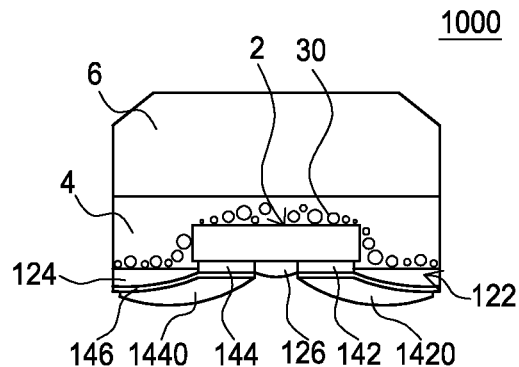
FIGS. 19a-19f show a light-emitting device in accordance with an embodiment of the present disclosure.

Referring to the embodiment shown in FIG. 19a, the light-emitting device 1000 comprises a transparent support element 4 on a light-emitting element 2. The transparent support element 4 covers the light-emitting element 2, and an optical element 6 is located on the transparent support element 4. A wavelength conversion layer 30 comprising a wavelength conversion material locates on the light-emitting element 2. In this embodiment, a wavelength conversion layer 30 and a transparent support element 4 locate between the light-emitting element 2 and the optical element 6, wherein the wavelength conversion layer 30 substantially covers the light-emitting element 2 along the contour of the light-emitting element 2. In another embodiment, a transparent material (not shown in the figure) is formed in advance to cover the light-emitting element 2 along the contour of the light-emitting element 2. Then a wavelength conversion layer 30 is formed on the transparent material. The wavelength conversion layer 30 covers the transparent material along the contour of the transparent material. The material of the transparent material has the same or similar transparency with that of the transparent support element 4, and the wavelength conversion material can be dispersed in the transparent support element 4.

Referring to FIG. 19a, a first insulating layer 122, a second insulating layer 124, and a third insulating layer 126 are formed on the light-emitting element 2 at a side opposite to the optical element 6. The optical element 6 comprises an inclined edge as shown in FIG. 1b. The light-emitting element 2 has a first electrode 142 and a second electrode 144 respectively formed between the insulating layers 122, 124 and 126, and the electrodes 142 and 144 are respectively electrically connected to a first semiconductor layer and a second semiconductor layer (not shown in the figure) of the light-emitting element 2. The light-emitting device 1000 further comprises an intermediate layer 146 and conductive adhesive materials 1420 and 1440. The intermediate layer 146 enhances the connection between the conductive adhesive materials 1420, 1440 and insulating layers 122, 124. The intermediate layer 146 comprises a side connecting to the electrodes 142, 144 and the insulating layers 122, 124, 126, and another side connecting to the conductive adhesive materials 1420 and 1440. The light-emitting element 2 is electrically connected to external circuit through the electrodes 142, 144, the intermediate layer 146 and the conductive adhesive materials 1420 and 1440. The material of the electrodes 142 and 144 comprises gold, copper, tin, silver, titanium, platinum, nickel or an alloy thereof. The material of the intermediate layer 146 can be a metal suitable for electro-plating and configured as a seed layer, such as titanium, copper, nickel, silver, tin, gold, or combinations thereof. In another embodiment, the intermediate layer 146 can be made of a silver paste which comprises particles of silver or silver alloy with a particle size between 5 nm~500 nm.

Besides, the conductive adhesive materials 1420 and 1440 can be directly connected to the electrodes 142, 144 and the insulating layers 122, 124 and 126 even no intermediate layer 146 locates between the conductive adhesive materials 1420 and 1440 and the electrodes 142 and 144 or between the conductive adhesive materials 1420 and 1440 and the insulating layers 122, 124 and 126. The conductive adhesive materials 1420 and 1440 not only provide electrically connection between the light-emitting element 2 and external circuit but also has adhesion ability to fix the light-emitting element 2 on the carrier 40 (referring to FIG. 15). Therefore, the amount of solder and a reflow process are saved to lower process cost. It is noted that, the solder can be applied between the conductive adhesive materials 1420 and 1440 and the carrier 40 if necessary. The conductive adhesive materials 1420 and 1440 can be bonded to the electrodes 142 and 144 at a temperature lower than 300° C. and a pressure between 0.2~20 Mpa, or the conductive adhesive materials 1420 and 1440 are bonded to the electrodes 142 and 144 at a temperature of 230° C. and a pressure of 5 Mpa. In an embodiment, the conductive adhesive materials 1420 and 1440 can be bonded to the electrodes 142 and 144 at temperature lower than 300° C. or a temperature between 80° C.~250° C. So, the conductive adhesive material has a state change temperature lower than 300° C. Similarly, the bonding condition of the connection between the conductive adhesive materials 1420, 1440 and the carrier 40 can be referred to the bonding condition between the conductive adhesive materials 1420, 1440 and the electrode 142, 144 of a temperature or a pressure described above. The detailed description of the conductive adhesive material will be described in the following.

Figure 19B:
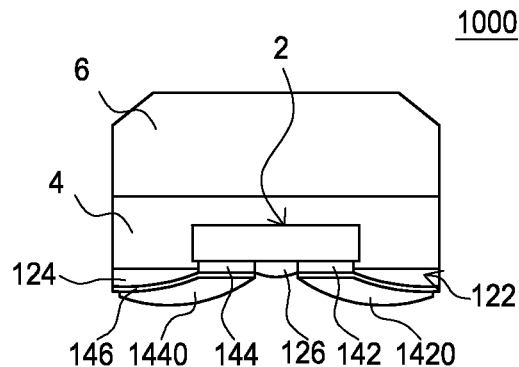
Figure 19C:
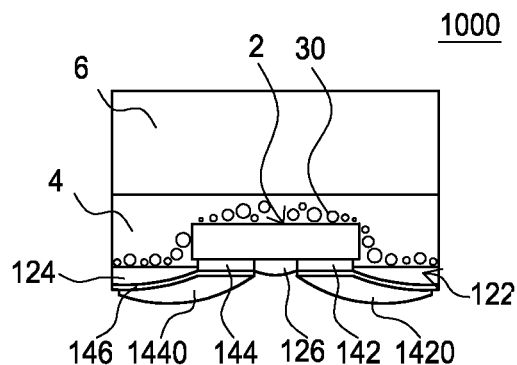
Figure 19D:
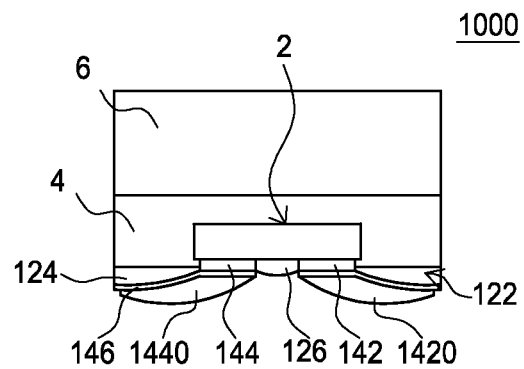
Figure 19E:
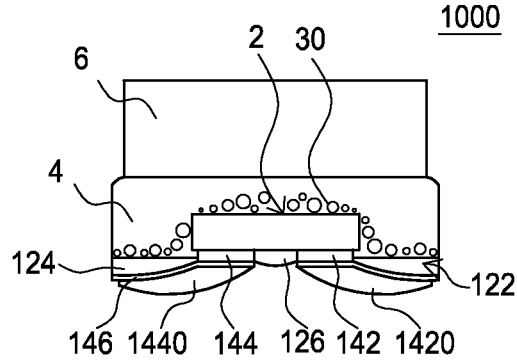
Figure 19F:
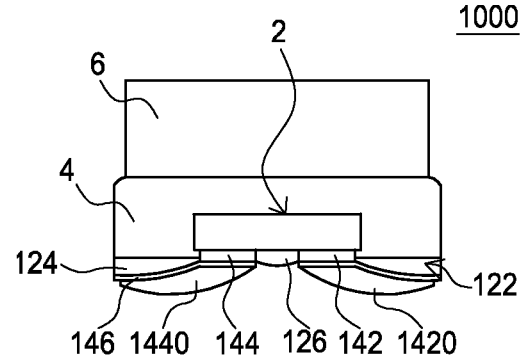
Figure 20A:
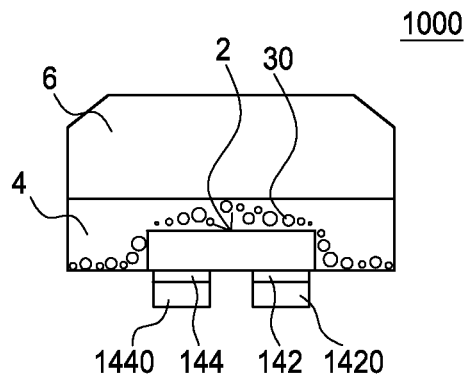
FIGS. 20a-20f show a light-emitting device in accordance with an embodiment of the present disclosure.
Figure 20B:
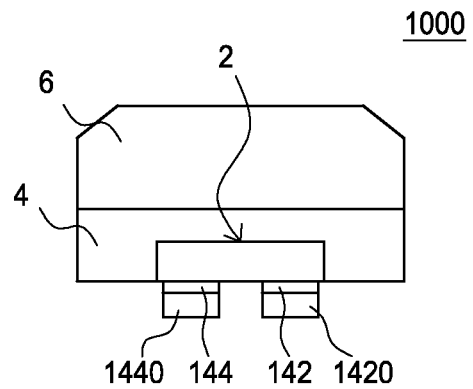
Figure 20C:
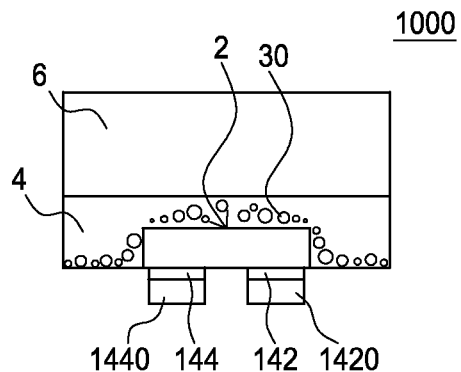
Figure 20D:
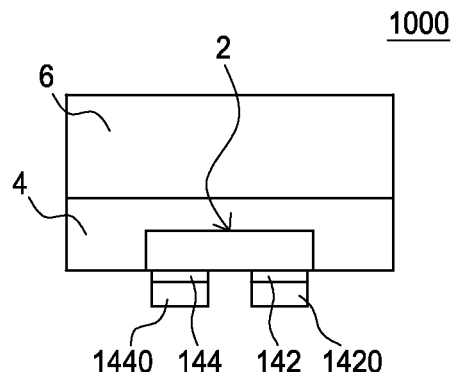
Figure 20E:
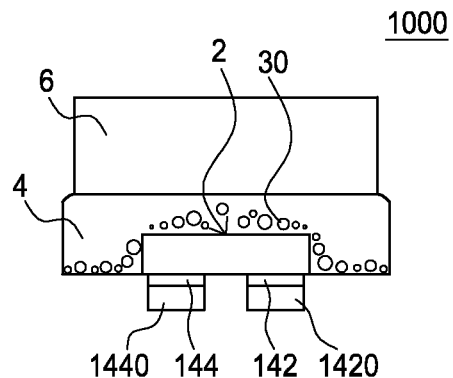
Figure 20F:
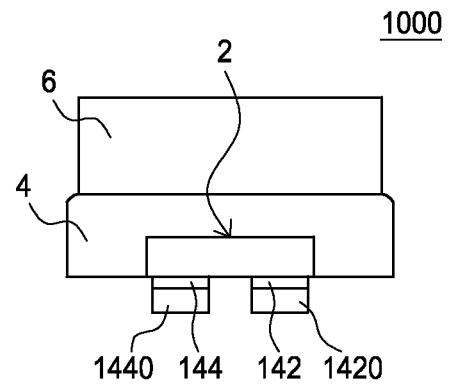

The light-emitting devices 1000 in FIGS. 19c and 19e has a structure similar to the structure in FIG. 19a, wherein the same symbols or marks represent the similar or same elements, devices or steps. Referring to FIG. 19c, the optical element 6 has a rectangular shape in cross-sectional view. Referring to FIG. 19e, the width of the transparent support element 4 is slightly larger than that of the optical element 6 so the moving direction and the portion of the light leaving the light-emitting device 1000 from the sidewall of the transparent support element 4 are changed to form a light field different from the light fields in FIGS. 19a and 19c. The structures of the light-emitting devices 1000 in FIGS. 19b, 19d and 19f are respectively similar to the structures in FIGS. 19a, 19c and 19e, but no wavelength conversion material is formed in the light-emitting devices 1000. Nevertheless, the wavelength conversion material can be optionally dispersed in the transparent support element 4 in the embodiments in accordance with the application.

Referring to FIGS. 20a~20f, the structures of the light-emitting devices 1000 in FIGS. 20a~20f are similar to the structures in FIGS. 19a~19f, wherein the same symbols or marks represent the similar or same elements or devices. As shown in FIGS. 20a~20f, no insulating layers 122, 124 and 126 or the intermediate layer 146 are formed in the light-emitting devices 1000. Besides, the conductive adhesive materials 1420, 1440 are formed on the electrodes 142 and 144 only and have same areas or different areas, such as larger areas or smaller areas, compared with the electrodes 142 and 144. The thicknesses of the conductive adhesive materials 1420 and 1440 can be increased to enhance the connection strength while the light-emitting devices 1000 is fixed on a carrier (not shown in the figure) through the conductive adhesive materials 1420 and 1440. The thicknesses of the conductive adhesive materials 1420 and 1440 are increased to facilitate the heat generated from the light-emitting devices 1000 to dissipate to the environment. In an embodiment, the thicknesses of the conductive adhesive materials 1420 and 1440 are larger than 10 μm, or the thicknesses are not less than 20 μm and not larger than 100 μm. The thicknesses of the conductive adhesive materials 1420 and 1440 are at least 5 times or 10 times larger than that of the electrodes 142 and 144 to enhance the structure robustness.

Figure 21A:
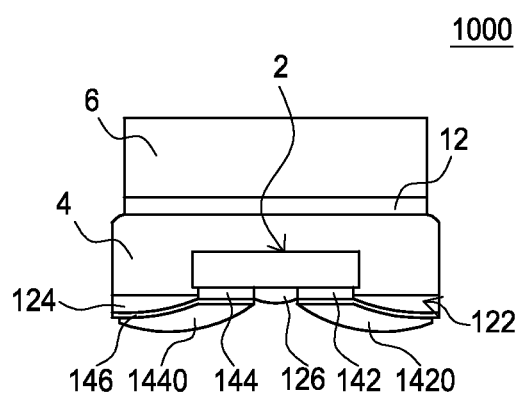
FIGS. 21a-21b show a light-emitting device in accordance with an embodiment of the present disclosure.
Figure 21B:
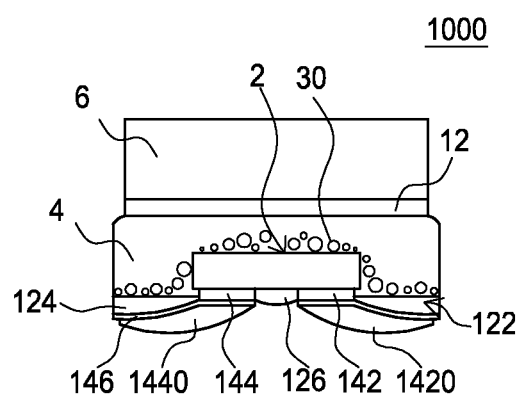

As shown in FIGS. 21a and 21b, the optical layer 12 is added between the transparent support element 4 and the optical element 6. The composition and the structure of the optical layer 12 can be adjusted to gain required reflectivity and/or light field. The detailed description of the optical layer 12 can be referred to the description in FIG. 12, and is omitted for brevity.

Figure 22A:
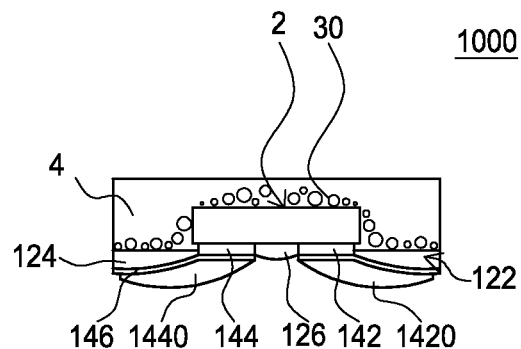
FIGS. 22a-22e show a light-emitting device in accordance with an embodiment of the present disclosure.
Figure 22B:
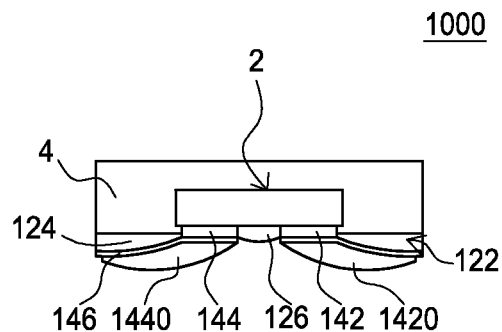
Figure 22C:
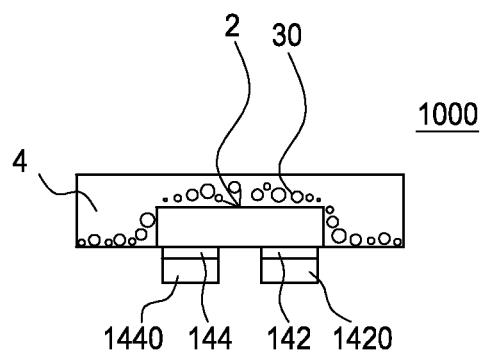
Figure 22D:
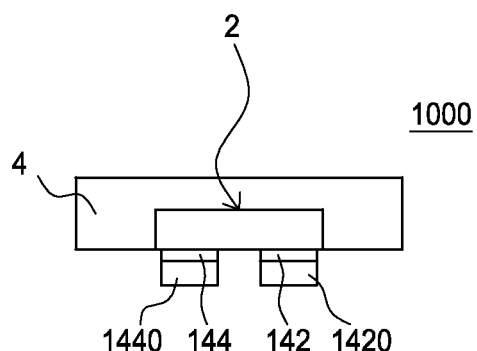
Figure 22E:
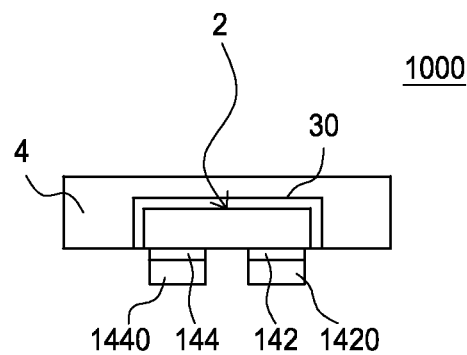

Referring to FIGS. 22a and 22b, the light-emitting devices 1000 comprise structures which are similar with the structures in FIGS. 19a and 19b, wherein the same symbols or marks represent the similar or same elements or devices. Each of the light-emitting devices 1000 in FIG. 22a or 22b comprises a transparent support element 4 formed on the light-emitting element 2 without an optical element 6 formed on the transparent support element 4. The structures of the light-emitting devices 1000 in FIG. 22c or 22d are similar with the structures in FIG. 20a or 20b. The light-emitting device 1000 in FIG. 22c or 22d comprises a transparent support element 4 formed on the light-emitting element 2 without an optical element 6 formed on the transparent support element 4. The light-emitting device 1000 in FIG. 22e comprises a wavelength conversion layer 30 formed between the light-emitting element 2 and the transparent support element 4.

Though the structure shown in each of FIGS. 1~2b, 6~8, 9e~9h, 10a~10b, 12, 14a~15, 19a~19f, 20a~20f, 21a~21b and 22a~22e respectively has only one light-emitting element 2, multiple light-emitting elements 2 can be formed in one light-emitting device as well, and the multiple light-emitting elements 2 can be configured to emit one kind or different kinds of light. Furthermore, the shapes of the elements in individual embodiment can be adjusted for different requirements while the elements can also be applied to other embodiments.

FIGS. 23a~26e show the process flow of different embodiments to form the conductive adhesive material on the light-emitting element. Though the embodiments in FIGS. 23a~26e describe the process flow with the light-emitting element, an element other than the light-emitting element, such as capacitor, resistor, diode or integrated circuit, can be suitable for the same process. It is noted that the methods of connecting the conductive adhesive material to the light-emitting element can be different according to their characteristic or the brand of the conductive adhesive materials. For example, the conductive adhesive material in the embodiments described in FIGS. 23a~24c can be a colloidal state which is suitable for printing process. The conductive adhesive material in the embodiments described in FIGS. 25a~27f is formed to be a film before connecting to the light-emitting element. The detailed description of the embodiments will be shown below.

Figure 23A:
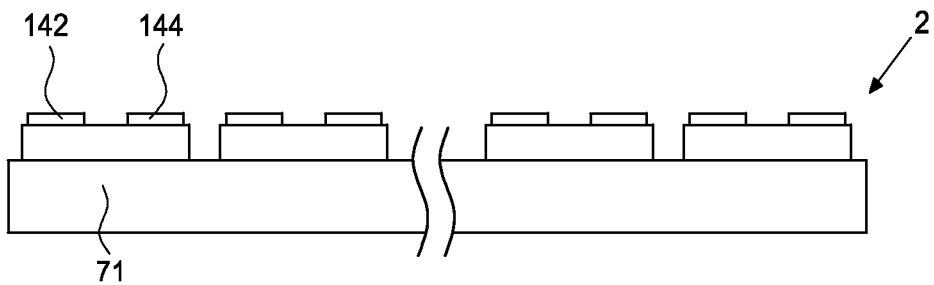
FIGS. 23a-23d show a manufacturing method of a light-emitting device in accordance with an embodiment of the present disclosure.

As shown in FIG. 23a, multiple light-emitting elements 2 are placed on the first temporary carrier 71, and the electrodes 142, 144 are exposed. Then, the conductive adhesive materials 1420 and 1440 are provided. In this embodiment, the conductive adhesive materials 1420 and 1440 are adopted as conductive adhesive glue. The conductive adhesive glue is metal glue which comprises metal particles having a capping agent spreading in the glue. The metal particles comprise gold, silver, copper, nickel, platinum, palladium, iron, alloys or mixtures thereof. The size of a metal particle is between 5~500 nm. The capping agent covers the metal particle to prevent the metal particles of nano-size from being coalesced together, and further controls the size of a metal particle. The capping agent can be organic amines, such as a hexadecylamine, a thiol, such as a dodecanethiol, or a pyridine, such as a triazolopyridine or a tepyridiner. Moreover, the glue comprises a thermoplastic adhesive or a thermosetting adhesive.

Figure 23B:
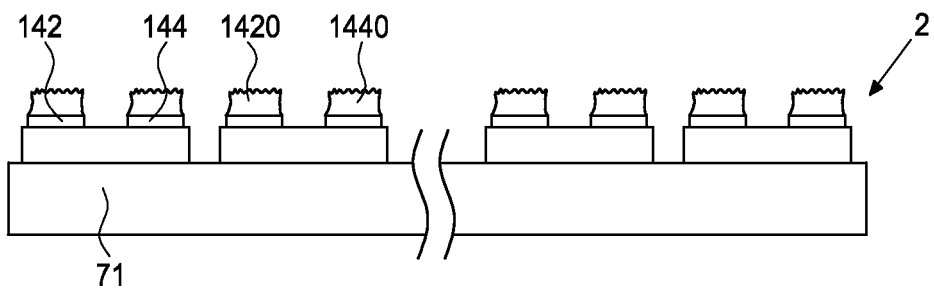

As shown in FIG. 23b, the conductive adhesive glues 1420 and 1440 are respectively formed on the electrodes 142 and 144 through screen printing. Then, the conductive adhesive materials 1420 and 1440 are cured under a first temperature between 70° C.~250° C. It is noted that, the conductive adhesive glues 1420 and 1440 is in a gel state before curing, and part of the capping agent is removed after heating so the conductive adhesive glues 1420 and 1440 are cured to be a semi-solid state. Besides, when the capping agent is removed, the metal particles are gathered to form a film layer having multiple pores with a first porosity ratio. In this embodiment, the conductive adhesive glues 1420 and 1440 are formed by screen printing so the conductive adhesive glues 1420 and 1440 comprise a top surface with bumps and a curved side surface. In another embodiment, the conductive adhesive glues 1420 and 1440 comprise a flat top surface while the conductive adhesive glues 1420 and 1440 are formed by plate printing.

Figure 23C:
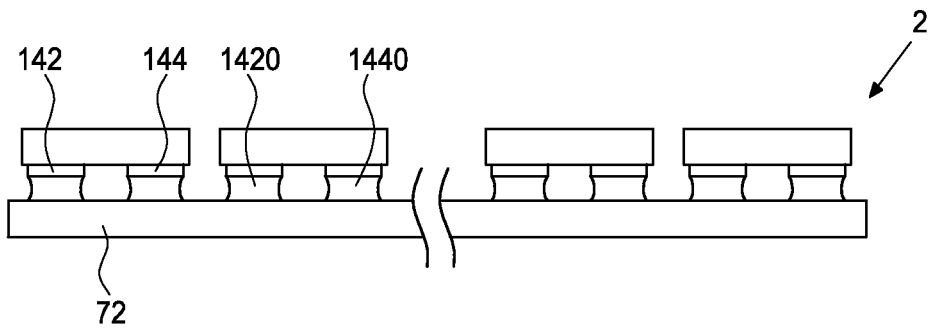

As shown in FIG. 23c, multiple light-emitting elements 2 comprising conductive adhesive glues 1420 and 1440 are flipped over and arranged on the second temporary carrier 72. The conductive adhesive glues 1420 and 1440 only temporarily contact the second temporary carrier 72. Then, the first temporary carrier 71 is removed.

Figure 23D:
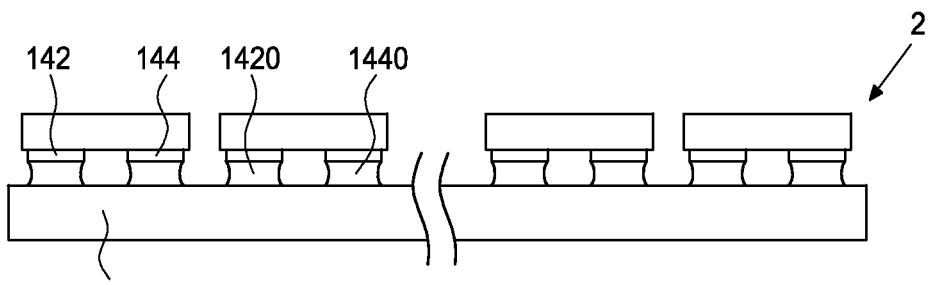

As shown in FIG. 23d, the multiple light-emitting elements 2 are transferred to the carrier 40 from the second temporary carrier 72. Then, heating the conductive adhesive glues 1420 and 1440 with a second temperature between 150° C.~200° C. Meanwhile, the rest of the capping agent is totally or partially removed so the conductive adhesive glues 1420 and 1440 are totally cured or almost cured to be fixed, and the multiple light-emitting elements 2 are then fixed on the carrier 40. Similarly, while the rest of the capping agent is removed, the film having multiple pores is changed to have a second porosity ratio or a film without pores. The second porosity ratio is usually lower than the first porosity ratio. It is noted that, compared with the "pick an place" process, the multiple light-emitting elements 2 can be transferred in volume in one time and fixed on the carrier 40. Besides, the method used in this embodiment is performed without a solder and the conductive adhesive glues 1420 and 1440 are used to fix the multiple light-emitting elements 2 on the carrier 40. In this embodiment, no other external force is applied on the light-emitting device 2 during the heating process at the second temperature, which is larger than the first temperature, to fix the light-emitting element 2 on the carrier 40. Because the conductive adhesive glues 1420 and 1440 have a state transfer temperature under 300° C., the conductive adhesive glues 1420 and 1440 can be transferred from colloidal state to semi-solid state, from semi-solid state to solid state, or from colloidal state to solid state.

Figure 24A:
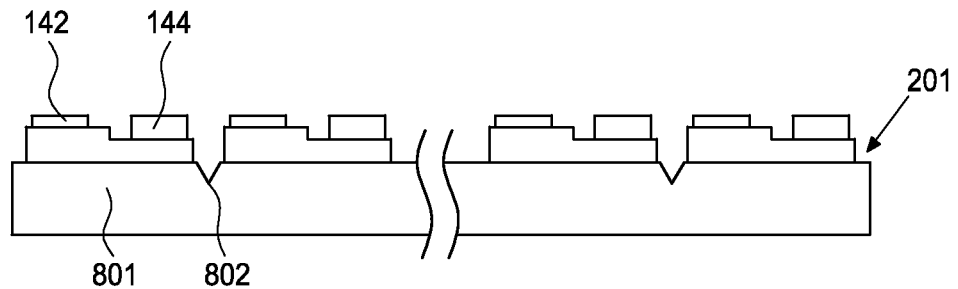
FIGS. 24a-24c show a light-emitting device in accordance with an embodiment of the present disclosure.
Figure 24B:
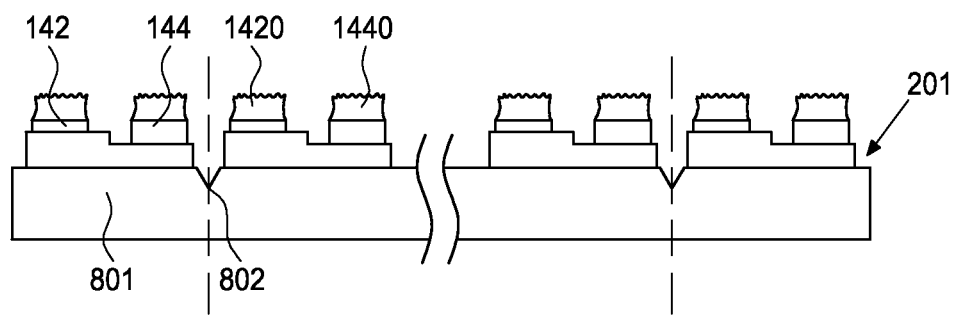
Figure 24C:
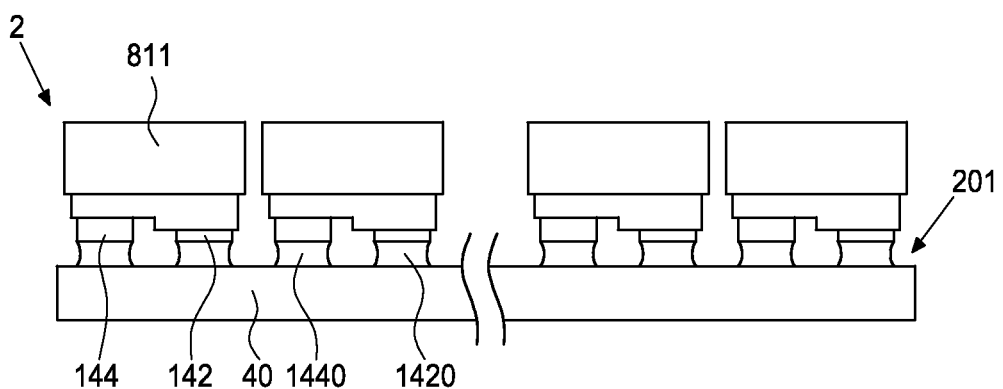

FIGS. 24a~24c show a process flow of an embodiment in accordance with this application. The same symbols or marks depicted in other embodiments represent similar or same elements or devices and being omitted for brevity. In this embodiment, the conductive adhesive material can also be the conductive adhesive glue. The related description about the conductive adhesive glue can be referred to the previous embodiments.

Referring to FIG. 24a, the multiple light-emitting stacks 201 are epitaxially formed on a growth substrate, such as sapphire, SiC, GaN, GaP or GaAs, etc. A trench 802 is formed between two adjacent light-emitting stacks 201.

As shown in FIG. 24b, the conductive adhesive glues 1420 and 1440 are respectively formed on the electrodes 142 and 144 by a screen printing process. Then, the conductive adhesive glues 1420 and 1440 are cured by heat treatment under a first temperature between 70° C.~250° C. Then, the multiple light-emitting stacks 201 are separated along the trenches 802 to form multiple separated light-emitting elements 2 keeping a part of the growth substrate 811. Similarly, as shown in FIG. 23b, each of the conductive adhesive glues 1420 and 1440 also comprises a top surface with protrusions and depressions formed thereon and a curved side surface.

As shown in FIG. 24c, multiple light-emitting elements 2 are placed on the carrier 40. The conductive adhesive glues 1420 and 1440 are heated under a second temperature between 150° C.~200° C., and the conductive adhesive glues 1420 and 1440 are cured to fix the multiple light-emitting elements 2 on the carrier 40.

Figure 25A:
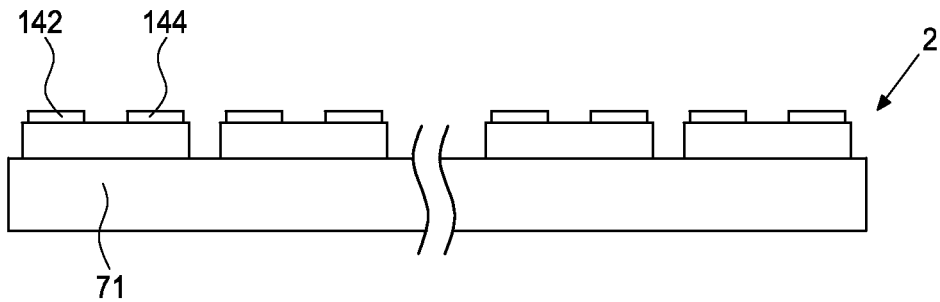
FIGS. 25a-25d show a manufacturing process of applying conductive adhesive material on a light-emitting device in accordance with an embodiment of the present disclosure.
Figure 25B:
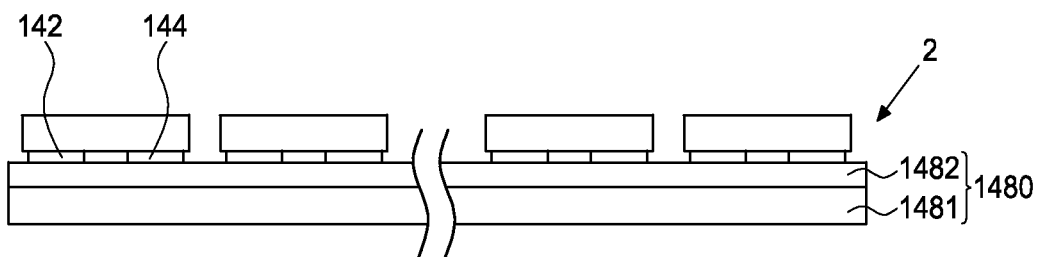
Figure 25C:
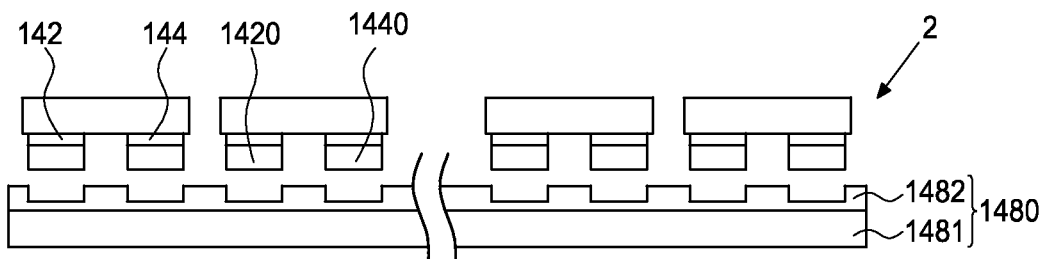

FIGS. 25a~25c show a process flow of another embodiment in accordance with this application. As shown in FIG. 25a, multiple light-emitting elements 2 are provided on the first temporary carrier 71 with exposed electrodes 142 and 144. The conductive adhesive material 1480 is then provided. In this embodiment, the conductive adhesive material 1480 is a film. The conductive adhesive material 1480 comprises a base material 1481 and a conductive adhesive film 1482 formed on the base material 1481. The conductive adhesive film 1482 is formed by spin coating or spraying the conductive adhesive glue on the base material 1481. The conductive adhesive film 1482 comprises a glue and metal particles with capping agent. The metal particles comprise gold, silver, copper, nickel, platinum, palladium, iron or an alloy or mixture thereof. The particle sizes of the metal are between 5 nm~500 nm. The capping agent surrounds the metal particles to avoid the metal particles being coalesced with each other while forming the metal particles of nano-size and further control the size of the metal particles. The capping agent can be organic amines, such as hexadecylamine; thiol, such as dodecanethiolpyridine; or pyridine, such as triazolopyridine or tepyridiner. The glue comprises a thermoplastic adhesive or a thermosetting adhesive.

As shown in FIG. 25b, electrodes 142 and 144 of multiple light-emitting elements 2 are fixed on the conductive adhesive film 1482 and the first temporary carrier 71 is removed.

Then, heat and pressure (70~250° C. and 0.2~20 Mpa) are imposed to bond the conductive adhesive film 1482 with the electrodes 142 and 144. As shown in FIG. 25c, the conductive adhesive film 1482 connecting to the light-emitting element 2 is transferred to the electrodes 142 and 144 while separating the conductive adhesive material 1480 and the multiple light-emitting elements 2. Therefore, the light-emitting element 2 comprises a conductive adhesive film 1482.

Figure 25D:
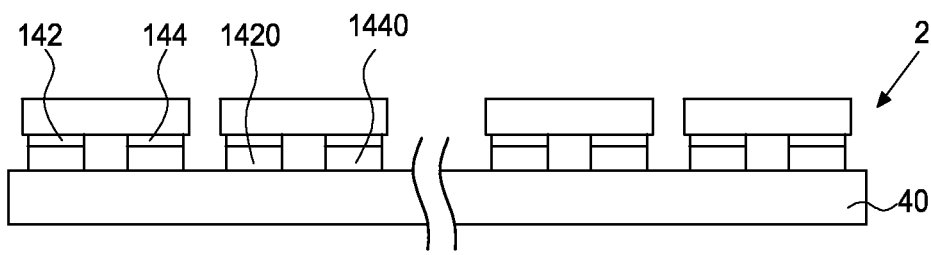

Referring to FIG. 25d, the light-emitting element 2 comprising a conductive adhesive film 1482 is placed on the carrier 40. A heat and pressure process (150~200° C. and 0.2~20 Mpa) is then performed to fix the light-emitting element 2 on the carrier 40. Since the carrier 40 comprises a circuit (not shown in the figure) formed thereon, the light-emitting element 2 is electrically connected to the circuit through the conductive adhesive films 1420 and 1440. It is noted that, all or a part of the capping agent is removed after heating, and the characteristic of the conductive adhesive film is changed, such as the porosity is changed, the color is changed, or the viscosity is changed.

FIGS. 26a~26e show a process flow of another embodiment of connecting the conductive adhesive material and the light-emitting element in accordance with this application. The same symbols or marks represent the similar or same elements, or devices. Similarly, in this embodiment, the conductive adhesive material 1480 comprises a base material 1481 and a conductive adhesive film 1482 formed on the base material 1481. The description of the conductive adhesive material 1480 can be referred to the description in previous embodiments.

Figure 26A:
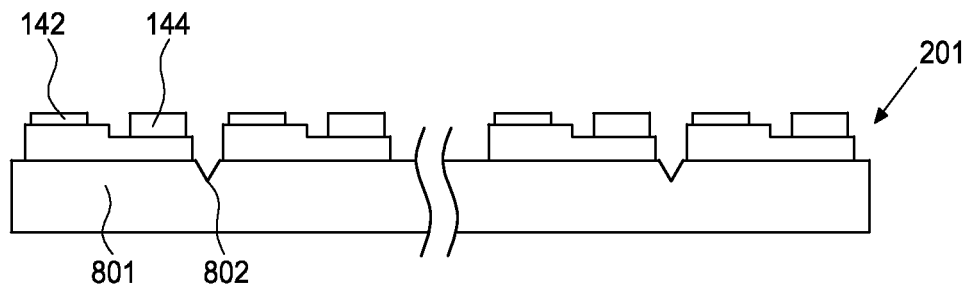
FIGS. 26a-26e show a manufacturing process of applying conductive adhesive material on a light-emitting device in accordance with an embodiment of the present disclosure.

As shown in FIG. 26a, multiple light-emitting stacks 201 are epitaxially formed on a growth substrate, such as sapphire, SiC, GaN, GaP or GaAs. A trench 802 is formed between two light-emitting stacks 201.

Figure 26B:
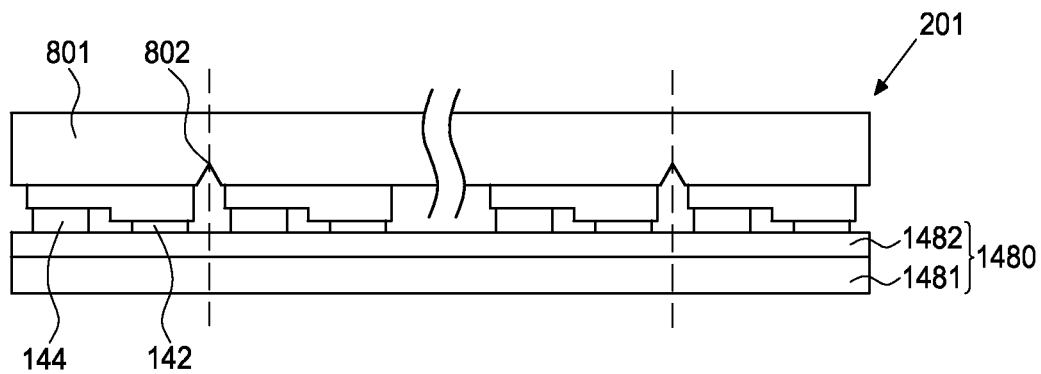

As shown in FIG. 26b, the electrodes 142 and 144 of the light-emitting elements 2 are fixed on the conductive adhesive film 1482. The heat and pressure (70~250° C. and 0.2~20 Mpa) are applied to bond the conductive adhesive film 1482 and the electrodes 142 and 144.

Figure 26C:
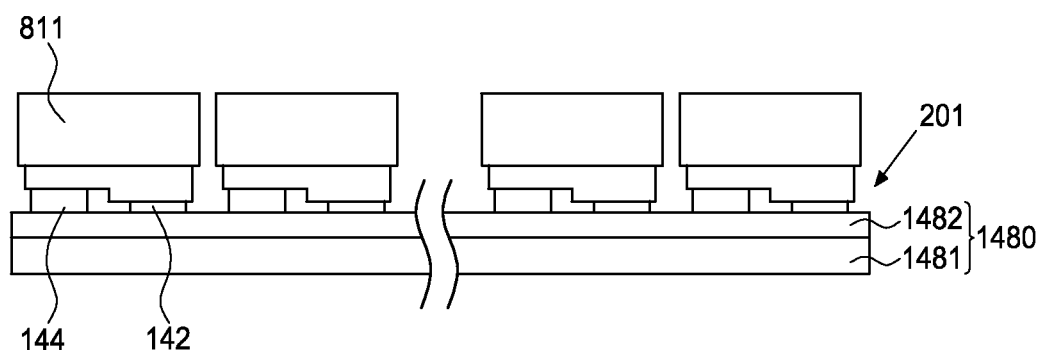
Figure 26D:
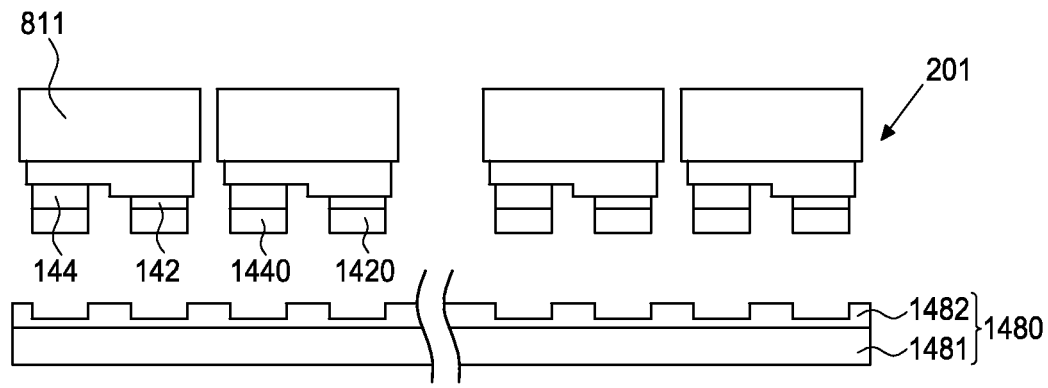

As shown in FIG. 26c, the multiple light-emitting stacks 201 are separated along the trench 802 to form independent light-emitting elements 2 with growth substrate 811. As shown in FIG. 26d, the conductive adhesive films 1420 and 1440 connecting to the light-emitting element 2 are transferred to the electrode 142 and 144 while separating the conductive adhesive material 1480 and the multiple light-emitting elements 2. The light-emitting element 2 therefore comprises conductive adhesive films 1420 and 1440.

Figure 26E:
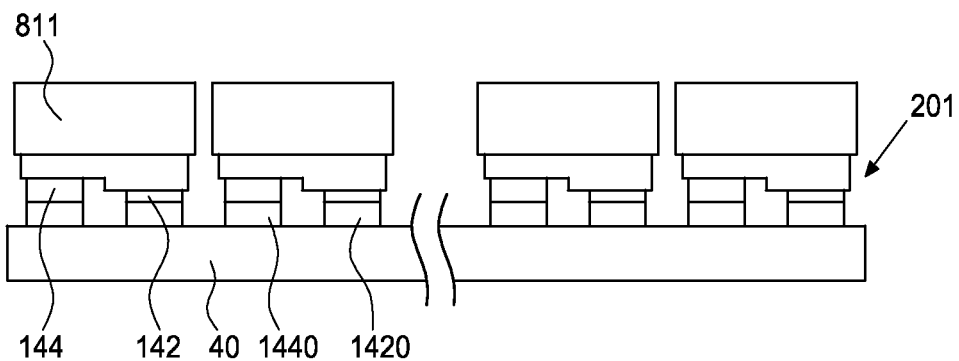

Referring to FIG. 26e, the light-emitting elements 2 comprising conductive adhesive film 1420 and 1440 are placed on the carrier 40. The heat and pressure (150~200° C. and 0.2~20 Mpa) are imposed to fix the light-emitting element 2 on the carrier 40. Since the carrier 40 comprises a circuit (not shown in the figure) formed thereon, the light-emitting element 2 can be electrically connected to the circuit on the carrier 40 through the conductive adhesive films 1420 and 1440.

Figure 27A:
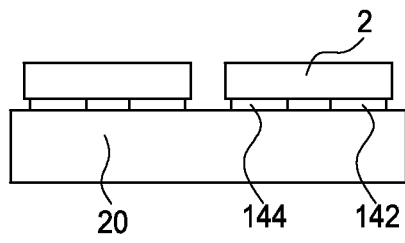
FIGS. 27a-27h show cross-sectional views of manufacturing a light-emitting device in accordance with an embodiment of the present disclosure.
Figure 27B:
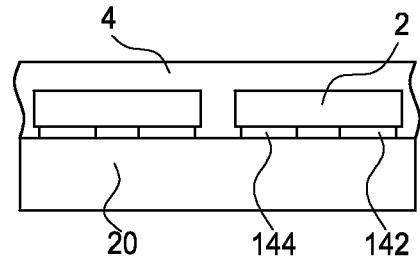

FIGS. 27a~27f show cross-sectional views of a process flow of manufacturing a light-emitting device in accordance with an embodiment in the application. As shown in FIGS. 27a~27b, multiple light-emitting elements 2 are formed on the carrier 20 with electrodes 142 and 144 contacted with the carrier 20. A transparent material is then applied to cover the multiple light-emitting elements 2. After the transparent material is cured, the transparent material becomes the transparent support element 4 which covers the light-emitting element 2. A part of the transparent material can flow into the gap between the electrodes 142 and 144 under the light-emitting element 2. The transparent material further fills the gap between the light-emitting element 2 and the carrier 20 partially or entirely.

Figure 27C:
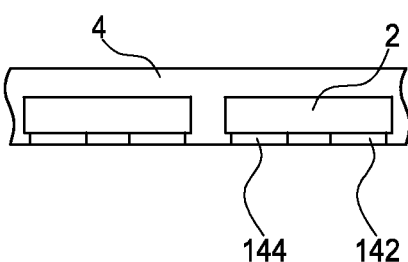
Figure 27D:
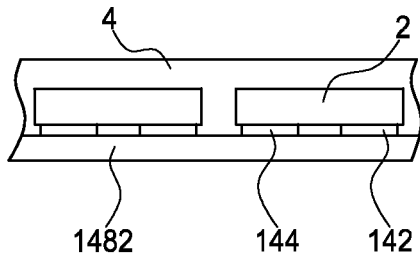

As shown in FIG. 27c, the carrier 20 is removed to expose a side of the electrodes 142 and 144. Then, the conductive adhesive material is applied. In this embodiment, the conductive adhesive material is a conductive adhesive film 1482, and the description can be referred to the previous embodiments. As shown in FIG. 27d, the exposed side of the electrode 142 and 144 are covered by the conductive adhesive film 1482 which is electrically connected to the electrodes 142 and 144 of the multiple light-emitting elements 2.

Figure 27E:
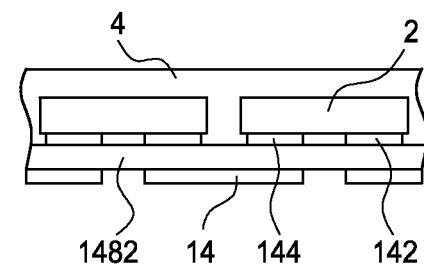
Figure 27F:
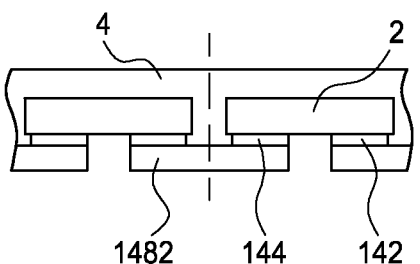
Figure 27G:
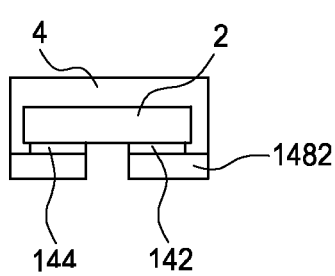

Referring to FIG. 27e, a photoresist layer 14 is formed on a side of the electrodes 142 and 144 opposing to the electrodes 142 and 144. Through a process of exposure and developing thereof, the part of the photoresist layer 14 which is corresponding to the position between the electrodes 142 and 144 is removed and a part of the conductive adhesive film 1482 is exposed. As shown in FIG. 27f, the rest of the photoresist layer 14 is removed after the exposed conductive adhesive film 1482 is removed to physically separate the electrode 142 and 144 connecting to the same light-emitting element 2. Then, as shown in FIG. 27g, a cutting (or other separating process) is performed to separate the transparent support element 4 and the conductive adhesive material 1480 from each of the light-emitting element 2 to form an independent light-emitting device.

Figure 27H:
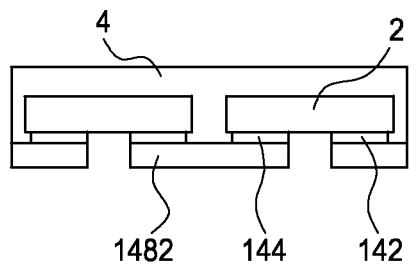

In another embodiment, as shown in FIG. 27h, a cutting process is performed to form a light-emitting device comprising multiple light-emitting elements 2 connected in series. As a result, the light-emitting device has an operation voltage larger than 3V. For example, a light-emitting device has a 3V operation voltage while the light-emitting device comprises one light-emitting element wherein the light-emitting element has an operation voltage of 3V. The light-emitting device is capable of operating at 15V, 21V, 24V, 33V, 48V, or at an operation voltage which is integral times of the operation voltage of the light-emitting element 2 when the light-emitting device comprises multiple light-emitting elements.

In another embodiment, the transparent support element 4 is formed at the gap between the electrodes 142 and 144, and the transparent support element 4 between the electrodes 142 and 144 can be partially or entirely removed.

It is noted that the above manufacturing method takes the light-emitting element 2 as an example. However, the transparent support element 4, and/or the optical element 6, and/or the wavelength conversion layer 30, and/or the insulating layer 122, 124, 126, and/or the intermediate layer 146 are formed on the light-emitting element, and the same process method is applied to form conductive adhesive material on the electrodes 142 and 144. The detailed structure is shown in FIGS. 19a~22e.

In the above embodiments, the conductive adhesive material is formed on the light-emitting element 2 by screen printing. But in another embodiment, the conductive adhesive material can be formed on the light-emitting element 2 by processes such as plate printing, coating, brush coating, spin coating, or ink jet printing. Optionally, metal particles comprising capping agent is mixed in a volatile solvent and can be formed on the light-emitting element 2 by coating or ink jet printing. Then, heat and/or pressure is applied to remove the solvent or the capping agent to connect the metal particles to the light-emitting element 2. The solvent comprises toluene, hexane, or a saturated or unsaturated hydrocarbon having 4~10 carbons.

It is noted that the conductive adhesive material is formed on the insulating layers 122, 124, 126 and the electrodes 142 and 144 in FIGS. 19a~19f, 21a~22b. Nevertheless, the conductive adhesive material can be formed only on the electrodes 142 and 144 without forming on the insulating layers 122, 124, 126 according to the processes above. In the embodiments shown in FIGS. 20a~20f, 22c~22e, the conductive adhesive materials are formed on only the electrodes 142 and 144.

In the above embodiments, the conductive adhesive material is formed on a side of the light-emitting device or on a side of the light-emitting element first, and the light-emitting device or the light-emitting element is then fixed on the carrier 40. However, the conductive adhesive material can be formed on the carrier 40 first, and then the conductive adhesive material is connected to and being electrically connected to the light-emitting device or the light-emitting element. It is noted that bonding condition (heat and/or pressure applied) between the carrier and the light-emitting device or between the carrier and the light-emitting element is described above, and is omitted for brevity.

In another embodiment, other conductive adhesive material comprising conductivity and viscosity can be chosen, or the material or thin film, such as anisotropic conductive adhesive film, having conductivity and viscosity against polymer materials is chosen to be the conductive adhesive material. Since the anisotropic conductive adhesive glue provide conductivity mainly in a vertical direction, the step of moving a part of the anisotropic conductive adhesive glue, similar to the step of moving conductive adhesive material shown in FIGS. 27d~27f, can be optionally omitted to reduce time spent on the removal. Moreover, the electrical short issue that would have happened when the part of the conductive adhesive material had not been fully removed can be avoided.

The above light-emitting device is formed on the carrier 40, and can be formed on the reflective layer 10 as shown in FIG. 6 to reflect light from the light-emitting element 2.

Figure 28A:
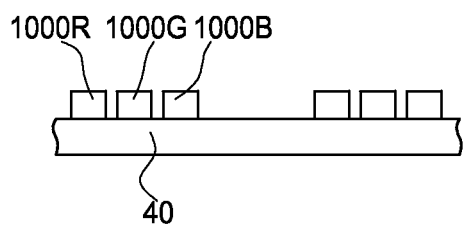
FIGS. 28a-28c show a light-emitting device in accordance with an embodiment of the present disclosure.

The light-emitting device in the above embodiments can be connected to the carrier 40 through the conductive adhesive material, and then to form a light-emitting assembly with other elements or components. As shown in FIG. 28a, in accordance with an embodiment of this application, the light-emitting device 1000R, 1000G and 1000B respectively represent the light-emitting device 1000 which emits red light, green light, and blue light, and each of the light-emitting devices has only one light-emitting element. When the embodiment in FIG. 28a is applied to a display, the three light-emitting devices 1000R, 1000G and 1000B are formed together as a pixel of the display while the light-emitting device 1000R, 1000G and 1000B each is a sub-pixel. The light-emitting devices 100R, 1000G and 1000B can be individually controlled to show specific figure or color by the circuit on the carrier 40.

Figure 28B:
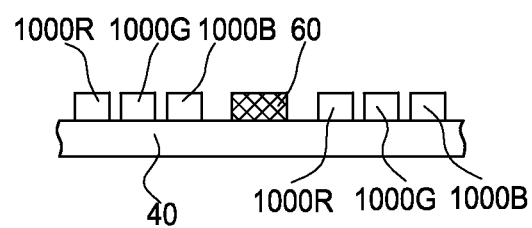

Referring to FIG. 28b, an isolation layer 60 which is capable of absorbing light or reflecting light is formed between neighboring sub-pixels 1000R, 1000G, and 1000B. The light emitted from neighboring sub-pixels 1000R, 1000G, and 1000B do not affected by each other because of the isolation layer 60 and the contrast of the display is improved. The isolation layer 60 comprises white paint, black paint or the combination thereof. The white paint comprises multiple titanium dioxide particles spread in an epoxy base material or in a silicone base material. The black paint comprises black material, such as carbon or iron sulfide, spread in an epoxy base material or in a silicone base material.

Figure 28C:
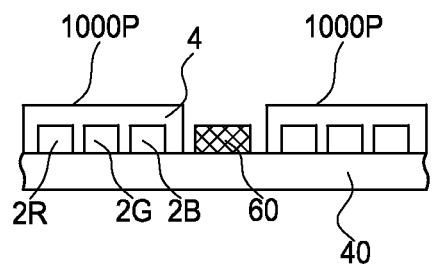

As the embodiment shown in FIG. 28c, the display comprises multiple light-emitting devices 1000P, and each of the light-emitting devices comprises three light-emitting elements 2R, 2G and 2B. The three light-emitting elements respectively provide a visible light having a wavelength of red, a visible light having a wavelength of green, and a visible light having a wavelength of blue. The light-emitting elements can be made of a semiconductor stack comprising an active layer emitting a specific visible light, such as visible red light, visible green light or visible blue light, or the light emitted from the semiconductor stack in a light-emitting element is stimulated to be a red visible light, a green visible light, or a blue visible light after passing the wavelength conversion material in the light-emitting element. In this embodiment, the light-emitting device 1000P comprises three light-emitting elements 2R, 2G and 2B so the light-emitting device 1000P can be used as a pixel in a display. In the embodiment shown in FIG. 28c, the isolation layer 60 is also formed to increase the contrast effect.

It is noted that besides the embodiments which have conductive adhesive materials to electrically connect the carrier and the light-emitting element, the above embodiments without using the conductive adhesive material can also be applied to the embodiments in FIGS. 28a~28c to form different displays.

Figure 29A:
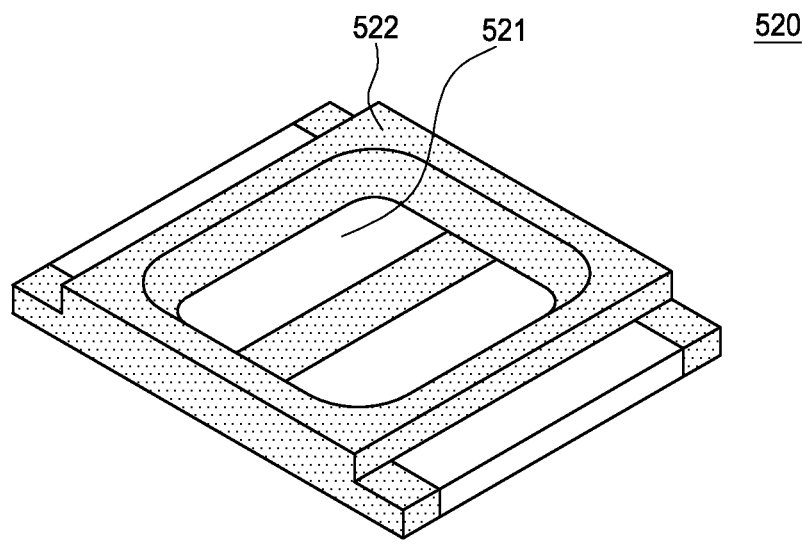
FIGS. 29a-29e show a light-emitting device in accordance with an embodiment of the present disclosure.
Figure 29B:
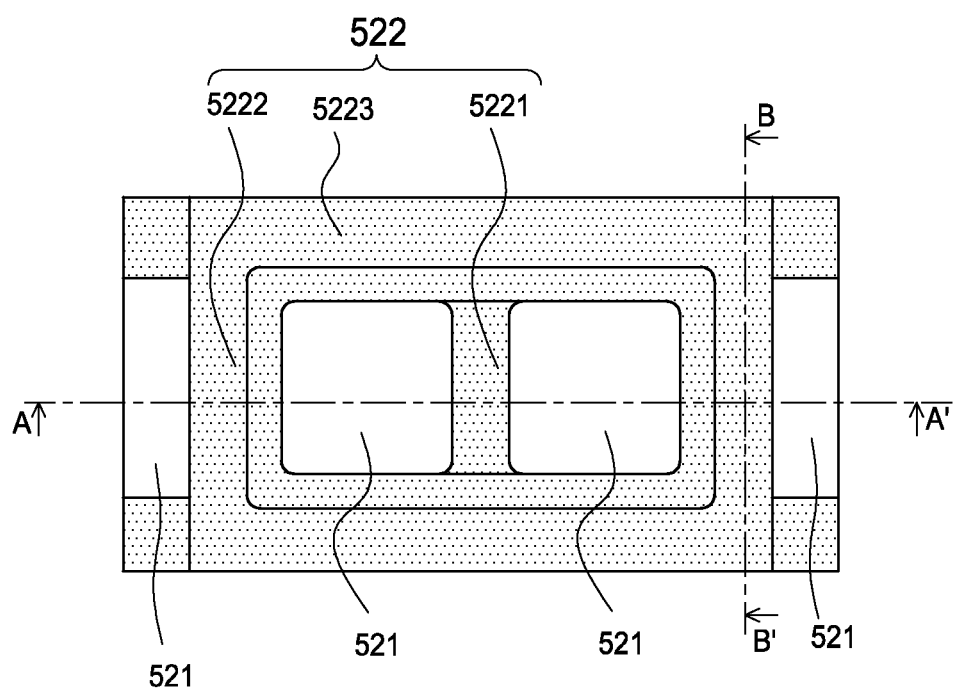
Figure 29C:
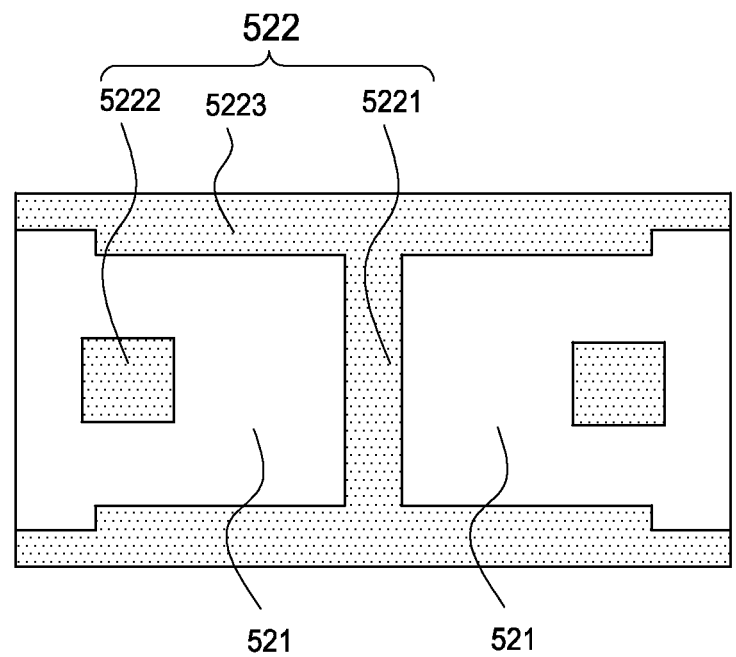
Figure 29D:
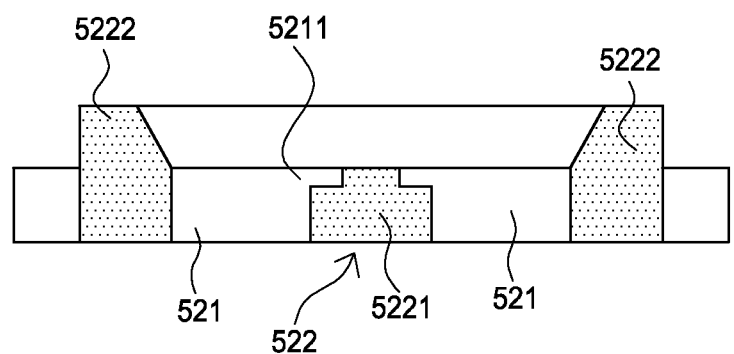
Figure 29E:
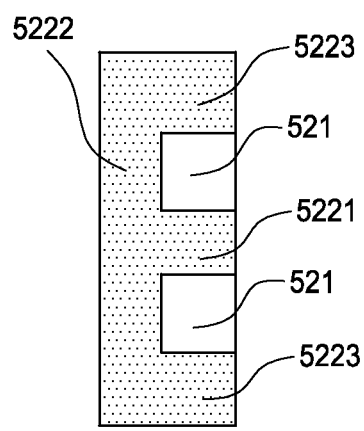

Referring to FIGS. 29a~29e, the light-emitting element 2 not only connects the substrate, carrier or reflective board through the conductive adhesive material but also connects a heat dissipation device to increase the heat dissipation. FIG. 29a shows the three-dimensional view of the heat dissipation device 520. FIG. 29b shows the top view of the heat dissipation device 520. FIG. 29c shows the bottom view of the heat dissipation device 520. FIG. 29d shows the cross-sectional view of the heat dissipation device 520 along the line AA' in FIG. 29b. FIG. 29e shows the lateral view of the heat dissipation device 520 along the line BB' in FIG. 29b. The heat dissipation device 520 comprises a heat dissipating portion 521 and a support portion 522, wherein the heat dissipating portion 521 comprises conductive material and the support portion 522 comprises electrically insulating material. The support portion 522 clamps the heat dissipating portion 521 and a part of the heat dissipating portion 521 is exposed. The support portion 522 comprises a first portion 5221 formed between the heat dissipating portion 521, a second portion 5222 penetrating the heat dissipating portion 521, and a third portion 5223 covering a part of the top surface, the bottom surface, and a side surface of the heat dissipating portion 521. The first portion 5221, the second portion 5222, and the third portion 5223 can be an integrally formed structure. In another embodiment, the support portion 522 covers only the top surface and the bottom surface of the heat dissipating portion 521 but not the side surface of the heat dissipating portion 521. In FIG. 29b, the light-emitting element is connected to the exposed heat dissipating portion 521 through the conductive adhesive material (not shown in the figure) described above. Then, the light-emitting element is connected to a substrate, a carrier, or a reflective board through the heat dissipation device.

Figure 30A:
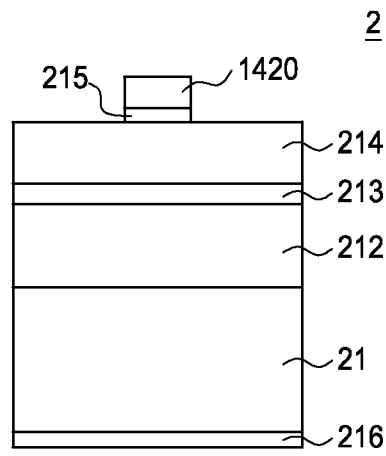
FIGS. 30a-30d show a light-emitting device in accordance with an embodiment of the present disclosure.
Figure 30B:
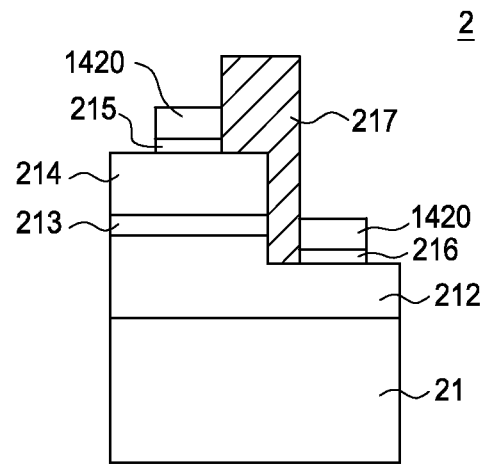

In an embodiment, the conductive adhesive material can function as a bonding pad in a light-emitting element. As shown in FIG. 30a, the light-emitting element 2 is a vertical type light-emitting element and comprises a conductive substrate 21, a first conductive type semiconductor layer 212, an active layer 213, and a second conductive type semiconductor layer 214. The light-emitting element 2 further comprises a first electrode layer 215 formed on the second conductive type semiconductor layer 214 and a second electrode layer 216 formed on the conductive substrate 21. The conductive adhesive material 1420 is combined with the first electrode layer 215 to form a bonding pad and the related description of the conductive adhesive material 1420 can be referred to the above embodiments, and the method of combining the conductive adhesive material with the first electrode layer 215 is similar with the method combining the conductive adhesive material with the electrode 142 and 144 so the method is omitted for brevity. The first electrode 215 and/or the second electrode layer 216 can be a multiple-layer structure, such as Cr/Au, Cr/Cu, Cr/Pt/Au, Cr/Ti/Pt/Au, Ti/Cu, Ti/Au, Au/BeAu/Au, Au/GeAu/Au, etc. The conductive adhesive material 1420 is connected to Au or Cu wherein the thickness of Au or Cu is between 500 nm~1 μm. Since the conductive adhesive material 1420 can be used as a bonding pad, the thickness is between 15~50 μm for the convenience of following wiring process. Optionally, a transparent layer, such as ITO, IZO, InO, SnO, CTO, ATO, AZO, ZTO, GZO, ZnO, IGO, GAZO, diamond like carbon (DLC) or GaP, can be formed between the second conductive type semiconductor layer 214 and the first electrode 215. As shown in FIG. 30b, the light-emitting element is a horizontal type light-emitting element. The conductive adhesive material 1420 is connected to the first electrode layer 215 and a second electrode layer 216 as bonding pads. Optionally, an isolation layer 217 can be formed between the first electrode 215 and the second electrode 216. The conductive adhesive material 1420 may overflow and cause unnecessary short circuit path while the conductive adhesive material 1420 is formed on the electrode layer 215 and 216 by printing. Therefore, a barrier layer 217 is formed to avoid overflow. The barrier layer 217 has a thickness larger than that of the electrode layers 215 and 216 and is in the range of 20~100 μm.

Figure 30C:
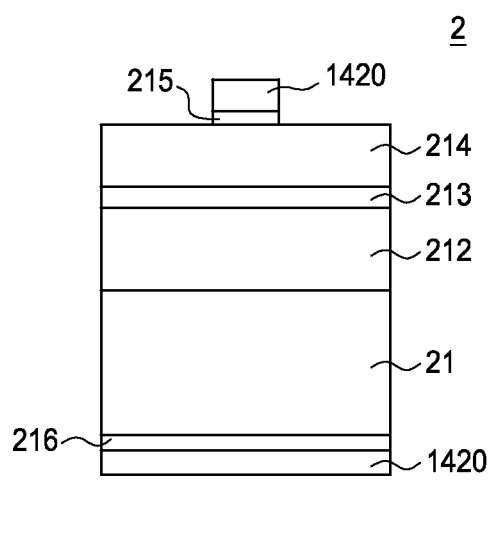
Figure 30D:
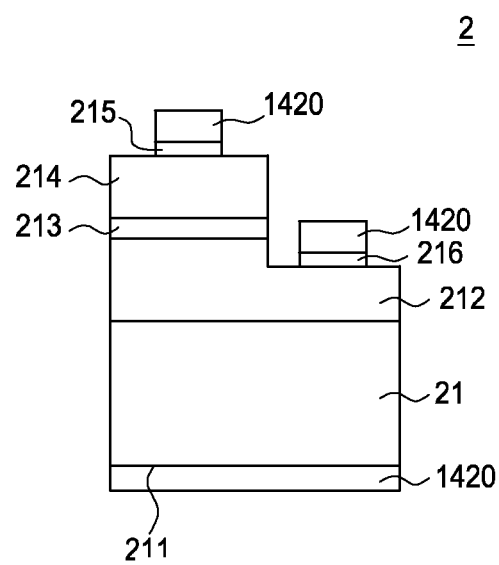

In an embodiment, the conductive adhesive material can be used as a die bonding glue. The light-emitting element in FIG. 30c has a similar structure in FIG. 30a, wherein the same symbols or marks in the two figures represent the similar or same elements, devices or steps. The conductive adhesive material 1420 is further formed on the second electrode layer 216 as a die bonding glue. Similarly, as shown in FIG. 30d, the conductive adhesive material 1420 in the horizontal type light-emitting element is further formed on a side 211 of the substrate 21 opposing to the electrodes 215 and 216 as a bonding glue to fix the light-emitting element on a leadframe, a package such as PLCC type, EMC type, or HTCC type, or on a circuit board, such as a PCB board. The manufacturing process can be as follows: a solder is formed on a circuit board, a light-emitting element is formed on the solder, and a reflow process is applied under a temperature between 220~280° C. to fix the light-emitting element on the circuit board.

It is noted that while the light-emitting element or the light-emitting device in previous embodiments is fixed on a carrier, a solder is further formed between the light-emitting device and the carrier or between the light-emitting element and the carrier, and a reflow process under a temperature between 220~280° C. is then performed.

For brevity, the detail epitaxial structure is not shown in some of the light-emitting elements above. However, the above light-emitting element comprises a first conductive type semiconductor layer, an active layer, and a second conductive type semiconductor layer. Optionally, the light-emitting element comprises a growth substrate comprising GaAs, GaP, Ge, sapphire, glass, diamond, SiC, silicon, GaN, and ZnO. The first conductive type semiconductor layer and the second conductive type semiconductor layer, such as a cladding layer or a confinement layer, respectively provides electrons and holes to be combined in the active layer to emit a light. The first conductive type semiconductor layer, the active layer, and the second conductive type semiconductor layer comprises a semiconductor material of III-V group, such as $Al_xIn_yGa_{(1-x-y)}N$ or $Al_xIn_yGa_{(1-x-y)}P$ with $0 \leq x,y \leq 1$, $(x+y) \leq 1$. According to the material of the active layer, the light-emitting element can be operated under a current to emit a red light having a peak wavelength between 610~650 nm, a green or blue light having a peak wavelength between 530~600 nm, or a blue light having a peak wavelength between 450~490 nm.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A light-emitting device comprising:
   a semiconductor light-emitting element;
   a transparent element disposed on the semiconductor light-emitting element, and comprising a first outermost sidewall, a second outermost sidewall opposite to the first outermost sidewall and a top surface which comprises a concave portion, a first flat portion, and a second flat portion; and
   an optical layer located on and within the concave portion, wherein the first and second flat portions are separated from each other by the concave portion,
   wherein the concave portion has a first subsection and a second subsection which have different widths and are not completely overlapped with each other,
   wherein the first subsection is extended in a first direction from the first outermost sidewall to the second outermost sidewall, and
   wherein the second subsection has a length and a width, the length is extended to cross the first subsection in a second direction parallel to the top surface and different from the first direction.

2. The light-emitting device according to claim 1, wherein the concave portion comprises a vertex angle.

3. The light-emitting device according to claim 2, wherein the vertex angle is a right angle, an acute angle, or an obtuse angle.

4. The light-emitting device according to claim 1, further comprising a transparent support element located between the semiconductor light-emitting element and the transparent element.

5. The light-emitting device according to claim 1, wherein the first and second flat portions do not have exactly the same shape.

6. The light-emitting device according to claim 1, wherein the first flat portion has a first area, and the second flat portion has a second area, the first area is different from the second area.

7. The light-emitting device according to claim 1, wherein the first flat portion has a first area, and the second flat portion has a second area, the first area is the same as the second area.

8. The light-emitting device according to claim 1, wherein the semiconductor light-emitting element is configured to emit a light which has a portion capable of passing through the optical layer.

* * * * *